United States Patent
Anthopoulos et al.

(10) Patent No.: US 12,209,016 B2
(45) Date of Patent: Jan. 28, 2025

(54) METHODS FOR PRODUCING NANOSCALE PATTERNS, NANO-FLUIDIC DEVICES, AND NANOGAP ELECTROCHEMICAL DEVICES

(71) Applicant: KING ABDULLAH UNIVERSITY OF SCIENCE AND TECHNOLOGY, Thuwal (SA)

(72) Inventors: Thomas D. Anthopoulos, Thuwal (SA); Kalaivanan Loganathan, Thuwal (SA); Ulrich Buttner, Thuwal (SA); Emre Yengel, Thuwal (SA); Hendrik Andreas Faber, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 256 days.

(21) Appl. No.: 17/640,890

(22) PCT Filed: Sep. 9, 2020

(86) PCT No.: PCT/IB2020/058380
§ 371 (c)(1),
(2) Date: Mar. 7, 2022

(87) PCT Pub. No.: WO2021/048759
PCT Pub. Date: Mar. 18, 2021

(65) Prior Publication Data
US 2022/0332570 A1    Oct. 20, 2022

Related U.S. Application Data

(60) Provisional application No. 62/994,494, filed on Mar. 25, 2020, provisional application No. 62/993,937, (Continued)

(51) Int. Cl.
*B29C 33/38*  (2006.01)
*B01L 3/00*  (2006.01)
(Continued)

(52) U.S. Cl.
CPC ...... *B81C 99/009* (2013.01); *B01L 3/502715* (2013.01); *B29C 33/3842* (2013.01);
(Continued)

(58) Field of Classification Search
CPC ............ B29C 33/3842; B29C 33/424; B29C 2033/426; B81C 99/009; B01L 3/502715;
(Continued)

(56) References Cited

U.S. PATENT DOCUMENTS

| 5,512,131 A | 4/1996 | Kumar et al. |
| 6,087,730 A | 7/2000 | McGarvey et al. |

(Continued)

FOREIGN PATENT DOCUMENTS

| CN | 107123686 B | 6/2020 |
| EP | 1657070 A1 | 5/2006 |

(Continued)

OTHER PUBLICATIONS

Aragonès, A.C., et al., "Electrostatic catalysis of a Diels-Alder reaction," Nature, vol. 531, Article 7592, Mar. 3, 2016, pp. 88-91.
(Continued)

*Primary Examiner* — Monica A Huson
(74) *Attorney, Agent, or Firm* — PATENT PORTFOLIO BUILDERS PLLC

(57) ABSTRACT

A method for manufacturing a soft stamp includes providing a substrate having a first electrode and a second electrode, the second electrode being formed at a distance less than 100 nm from the first electrode so that a nanogap Ng is formed between the first and second electrodes; pouring a curable substance over the first and second electrodes and into the nanogap Ng; curing the curable substance to form a soft stamp; and removing the soft stamp from the first and second electrodes. The soft stamp has a nano-feature having a size less than 100 nm.

18 Claims, 41 Drawing Sheets

Related U.S. Application Data filed on Mar. 24, 2020, provisional application No. 62/898,255, filed on Sep. 10, 2019.

(51) Int. Cl.
  *B29C 33/42* (2006.01)
  *B81C 99/00* (2010.01)
  *G03F 7/00* (2006.01)

(52) U.S. Cl.
  CPC .......... *B29C 33/424* (2013.01); *G03F 7/0002* (2013.01); *B01L 2300/0645* (2013.01); *B29C 2033/426* (2013.01)

(58) Field of Classification Search
  CPC .......... B01L 2300/0645; G03F 7/0002; B29K 2995/007; B29K 2995/0094; B82Y 40/00; B82Y 10/00
  See application file for complete search history.

(56) References Cited

U.S. PATENT DOCUMENTS

| | | |
|---|---|---|
| 2006/0154400 A1 | 7/2006 | Choi et al. |
| 2007/0212522 A1 | 9/2007 | Heidari et al. |
| 2008/0179586 A1 | 7/2008 | Kamins |
| 2010/0109203 A1 | 5/2010 | Chen et al. |
| 2018/0269005 A1 | 9/2018 | Zhu et al. |

FOREIGN PATENT DOCUMENTS

| | | |
|---|---|---|
| EP | 1864777 A1 | 12/2007 |
| JP | 2002305208 A | 10/2002 |
| WO | 2005083519 A2 | 9/2005 |

OTHER PUBLICATIONS

Beesley, D.J., et al., "Sub-15-nm patterning of asymmetric metal electrodes and devices by adhesion lithography," Nature Communications, vol. 5, Article 3933, May 27, 2014, pp. 1-9.

Carcenac, F., et al., "Fabrication of multiple nano-electrodes for molecular addressing using high-resolution electron beam lithography and their replication using soft imprint lithography," Microelectronic Engineering, vols. 61-62, Jul. 1, 2002, pp. 657-663.

Chen, X., et al., "Atomic layer lithography of wafer-scale nanogap arrays for extreme confinement of electromagnetic waves," Nature Communications, vol. 4, Article 2361, Sep. 3, 2013, pp. 1-7.

Chen, X., et al., "Nanogap-Enhanced Infrared Spectroscopy with Template-Stripped Wafer-Scale Arrays of Buried Plasmonic Cavities," Nano Letters, vol. 15, No. 1, Jan. 14, 2015 (Published on the Web Nov. 25, 2014), pp. 107-113.

Fang, F.Z., et al., "Nanomanufacturing—Perspective and applications," CIRP Annals—Manufacturing Technology, vol. 66, No. 2, 2017 (Available online Jun. 9, 2017), pp. 683-705.

Gates, B.D., "Nanofabrication with molds & stamps," Materials Today, vol. 8, No. 2, Feb. 2005, pp. 44-49.

Kwon, N., et al., "Fabrication of quantum dots using multicoated self-assembled monolayer," Journal of Vacuum and Science Technology, Part A, vol. 28, No. 4, Jul./Aug. 2010 (Published Jun. 29, 2010), pp. 730-734.

Negishi, R., et al., "Fabrication of nanoscale gaps using a combination of self-assembled molecular and electron beam lithographic techniques," Applied Physics Letters, vol. 88, Issue 22, 2006 (Published online Jun. 2, 2006), pp. 223111-1-223111-3.

Ou, T.-H., et al., "Detection of Fake Alcoholic Beverages Using Electrolyte-Free Nanogap Electrochemical Cells," ACS Applied Materials & Interfaces, vol. 11, 2019 (Published Jan. 21, 2019), pp. 6217-6223.

PCT International Search Report and Written Opinion of the International Searching Authority (Forms PCT/ISA/220, PCT/ISA/210 and PCT/ISA/237) for corresponding/related International Application No. PCT/IB2020/058380 dated Feb. 2, 2021.

Srinivasan, C., et al., "Molecular-ruler nanolithography," Proceedings of SPIE, vol. 6517, Mar. 15, 2007, pp. 651711-1-651711-9.

Wang, Y., et al., "Field-Assisted Splitting of Pure Water Based on Deep-Sub-Debye-Length Nanogap Electrochemical Cells," ACS Nano, vol. 11, 2017 (Published Jul. 7, 2017), pp. 8421 8428.

Xia, Y., et al., "Soft Lithography," Angewandte Chemie International Edition, Verlag Chemie, vol. 37, XP000985399, Jan. 1, 1998, pp. 551-575.

Semple, J., et al., "Large-area plastic nanogap electronics enabled by adhesion lithography," NPJ Flexible Electronics, vol. 2, No. 18, 2018 (Published online Jun. 25, 2018), pp. 1-10.

Semple, J., et al., "Semiconductor-Free Nonvolatile Resistive Switching Memory Devices Based on Metal Nanogaps Fabricated on Flexible Substrates via Adhesion Lithography," IEEE Transactions on Electron Devices, vol. 64, No. 5, May 2017 (Date of Publication Jan. 2, 2017; date of current version Apr. 19, 2017), pp. 1973-1980.

Tanaka, H., et al., "Position-Selected Molecular Ruler," Japanese Journal of Applied Physics, vol. 43, No. 7B, 2004 'Published Jun. 25, 2004), pp. L950-L953.

Office Action in corresponding/related U.S. Appl. No. 17/640,886 notification date of Jul. 18, 2024.

METHODS FOR PRODUCING NANOSCALE PATTERNS, NANO-FLUIDIC DEVICES, AND NANOGAP ELECTROCHEMICAL DEVICES

CROSS-REFERENCE TO RELATED APPLICATIONS

This application is a U.S. National Stage Application of International Application No. PCT/IB2020/058380, filed on Sep. 9, 2020, which claims priority to U.S. Provisional Patent Application No. 62/898,255, filed on Sep. 10, 2019, entitled "SELF-FORMING NANOGAP METHOD AND DEVICE," U.S. Provisional Patent Application No. 62/993,937, filed on Mar. 24, 2020, entitled "SELF-FORMING NANOGAP METHOD AND DEVICE," and U.S. Provisional Patent Application No. 62/994,494, filed on Mar. 25, 2020, entitled "METHODS FOR PRODUCING NANOSCALE PATTERNS," the disclosures of which are incorporated herein by reference in their entirety.

BACKGROUND

Technical Field

Embodiments of the subject matter disclosed herein generally relate to a system and method for forming a large-area, soft stamp that includes features with sizes ranging from 1 nm to a few meters.

Discussion of the Background

The emergence of the Internet of Things (IoT) has triggered a surge of innovation that extends far beyond the electronics industry. The early activity in this field focused on the connectivity of an ecosystem of physical devices (sensors, actuators, vehicles, home appliances and many other items embedded with electronics) to a network that enables these objects to communicate, but also to exchange data. Analysts now predict that the installed base for IoT devices will continue to grow from the 10 billion today. As billions, and soon trillions, of IoT devices begin to emerge, the issue of making them cheaper and cheaper becomes critical, and currently, the existing technologies are believed to have reached their lowest cost point.

Therefore, there is a need to build and integrate RF components into everyday devices in radically new and cost-effective ways, using scalable methods for generating inexpensive and self-sustainable solid state systems for a range of applications within the IoT.

SUMMARY

According to an embodiment, there is a method for manufacturing a soft stamp, and the method includes providing a substrate having a first electrode and a second electrode, the second electrode being formed at a lateral distance less than 100 nm from the first electrode so that a nanogap Ng is formed between the first and second electrodes; pouring a curable substance over the first and second electrodes and into the nanogap Ng; curing the curable substance to form a soft stamp; and removing the soft stamp from the first and second electrodes. The soft stamp has a nano-feature having a size less than 100 nm.

According to another embodiment, there is a method for making a mask, and the method includes providing a substrate having a first electrode and a second electrode, the second electrode being formed at a distance less than 100 nm from the first electrode so that a nanogap Ng is formed between the first and second electrodes; pouring a curable substance over the first and second electrodes and into the nanogap Ng; curing the curable substance to form a soft stamp having nano-features; removing the soft stamp from the first and second electrodes; and forming a mask that mirrors the soft stamp, based on the soft mask. The mask is used for manufacturing a device.

According to yet another embodiment, there is a method for manufacturing a soft stamp to be used in the manufacturing of a device. The method includes providing a substrate having a first electrode and a second electrode, the second electrode being formed at a distance less than 100 nm from the first electrode so that a nanogap Ng is formed between the first and second electrodes; depositing an anti-sticking layer over the first and second electrodes and the substrate; pouring a curable substance over the first and second electrodes and into the nanogap Ng; pressing the curable substance with a movable substrate, toward the substrate; curing the curable substance to form a soft stamp; and removing the soft stamp from the first and second electrodes, with the movable substrate.

According to yet another embodiment, there is a nano-fluidic device for biological material sequencing, and the nano-fluidic device includes a substrate; a nano-channel extending along a surface of the substrate; and a first pair of electrodes formed to sandwich the nano-channel. The nano-channel has a depth and width less than 100 nm, and the first pair of electrodes are configured to sense a first electrical quantity, which is related to a base of a biological material when passing between the first pair of electrodes.

According to another embodiment, there is a method for making a nano-fluidic device for biological material sensing and sequencing, and the method includes patterning a first metallic layer (M1) to form a first electrode on a substrate; depositing a self-assembling monolayer, SAM, layer over and around the first electrode; forming a second metallic layer (M2) in contact with the SAM layer and the substrate; touchless removing parts of the second metallic layer (M2) that are formed directly above the SAM layer and the first electrode, to form the second electrode, and the nanogap Ng between the first electrode and the second electrode; and removing material from the substrate, in the nanogap Ng, to form a nano-channel into the substrate. The nano-channel is configured to receive a biological material for sequencing.

According to another embodiment, there is a method for making a nano-channel in a substrate, and the method includes patterning a first metallic layer (M1) to form a first electrode on a substrate; depositing a self-assembling monolayer, SAM, layer over and around the first electrode; forming a second metallic layer (M2) in contact with the SAM layer and the substrate; touchless removing parts of the second metallic layer (M2) that are formed directly above the SAM layer and the first electrode, to form the second electrode, and the nanogap Ng between the first electrode and the second electrode; and removing material from the substrate, in the nanogap Ng, to form the nano-channel into a surface of the substrate.

According to still another embodiment, there is a nanogap electrochemical cell that includes a substrate, first and second metal electrodes (M1, M2) formed on the substrate such that a nanogap Ng delineates the first metal electrode (M1) from the second metal electrode (M2), and a power source that converts external energy into an electrical field E between the first and second metal electrodes (M1, M2), wherein the nanogap Ng is smaller than 100 nm.

According to another embodiment, there is a reactor for performing electrochemical reactions, the reactor including, a housing, a nanogap electrochemical cell placed inside the housing, a gun configured to provide a first gas to the nanogap electrochemical cell, a port configured to collect a second gas from the housing, which is different from the first gas, an electrolyte placed in a nanogap Ng of the nanogap electrochemical cell, wherein the nanogap Ng is formed above a substrate and delineates a first metal electrode (M1) from a second metal electrode (M2), and a power source that converts external energy into an electrical field E between the first and second metal electrodes (M1, M2), wherein the nanogap Ng is smaller than 100 nm.

BRIEF DESCRIPTION OF THE DRAWINGS

The accompanying drawings, which are incorporated in and constitute a part of the specification, illustrate one or more embodiments and, together with the description, explain these embodiments. In the drawings:

FIGS. 17A to 17C illustrate a method for forming nano-trenches/channels into a nanogap substrate, which has two electrodes separated by a nano-gap, by using a dry etching process, while

FIG. 24A illustrates circular electrodes used for the nanogap electrochemical cell while

DETAILED DESCRIPTION

Figure 1:
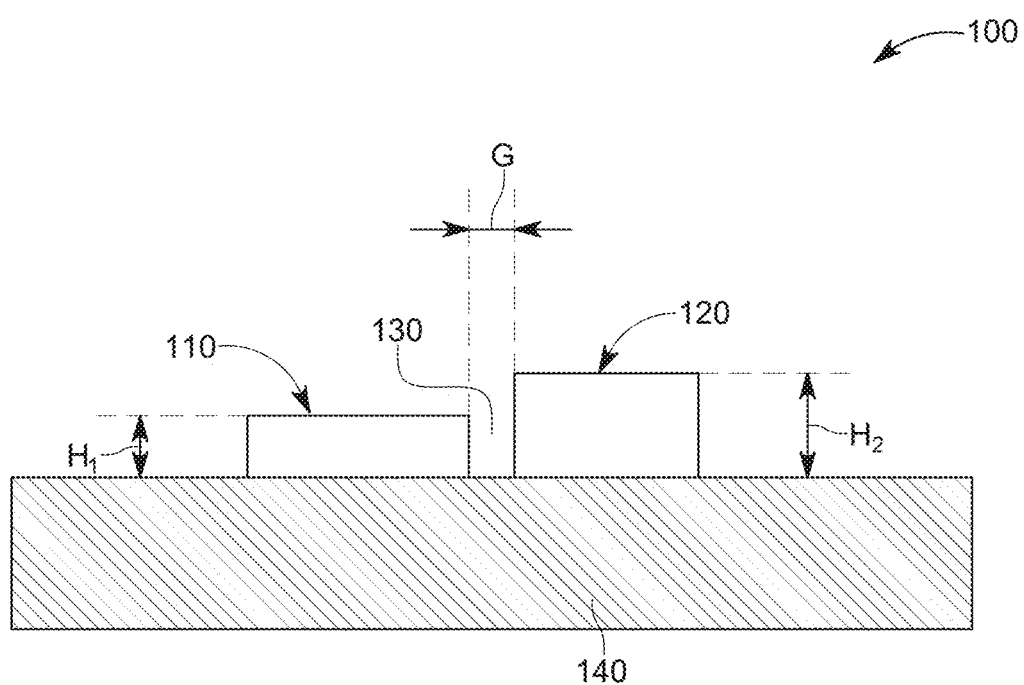
FIG. 1 is a schematic illustration of a solid state device having a nanogap formed with a self-forming nanogap method or an a-lith method.

The following description of the embodiments refers to the accompanying drawings. The same reference numbers in different drawings identify the same or similar elements. The following detailed description does not limit the invention. Instead, the scope of the invention is defined by the appended claims.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

According to an embodiment, there is a fabrication process that allows the formation of conductive electrodes, either symmetric, i.e., using the same material, or asymmetric, i.e., using dissimilar materials, which are spaced apart by a gap of nanoscale size, i.e., in the range of 1-100 nm. These coplanar nanogap electrodes can be used to form a soft mask, which can then be used to form various devices over large-area substrates, having features in the nanoscale range, at a low cost. The conductive electrodes may be made of different materials, such as metals, transparent conductive oxides (e.g., indium tin oxide, ITO), conductive polymers, graphene, to name a few. The conductive electrodes may be formed as an individual layer or a multilayer structure. For the sake of simplicity, this application uses the term 'metallic' electrodes herein to include all of the above mentioned material options and also uses the term "metallization" to include the application of any such layers to a substrate.

According to an embodiment, the gap formation occurs at a boundary of an initially deposited, patterned, surface-treated metallic layer M1 and a second conductive layer M2. This is achieved by inserting a SAM layer and a thin "interlayer" of titanium (Ti) or other metals/metal oxides with suitable surface chemistry, in-between the first and second conductive layers M1 and M2. In one application, the thin interlayer is considered to be part of the second metallic layer M2. However, the thin interlayer can also be treated as an independent layer from the second metallic layer M2. Examples for alternative interlayers may include Al or Cr. The method can be implemented by depositing/growing the interlayer onto the SAM layer, which is deposited on a surface of the layer M1, followed by the deposition of the layer M2. The SAM layer creates a hydrophobic, non-sticky surface on top of the first conductive layer M1, with low-surface energy, which would not make a strong bond with the second conductive layer M2. In addition, the SAM layer would be easily removable from the first conductive layer M1. The SAM layer that is formed on the M1 layer can be removed later, for example, with a fast UV/ozone or plasma treatment. However, the SAM layer still offers a good adherence to the first conductive layer M1 and thus, after the second conductive layer M2 is formed on the SAM layer, those parts of the second conductive layer M2, which are formed on the SAM layer on top of the first conductive layer M1, would be easily removable when agitated in a liquid, or exposed to a high flow of a fluid, which may be a fluid or gas (e.g., air), as discussed later in more detail. The Ti interlayer thickness can be tuned in the range of 1 to 500 nm, and its deposition is often followed by the deposition of the M2 layer, typically platinum (Pt), also of arbitrary thickness that may be in the range of 10 to 500 nm.

The inventors have found that the incorporation of the Ti interlayer and SAM layer on the first conductive layer M1 decreases the adhesive forces between the two conductive layers; M1 and M2, allowing the easy removal of overlapping regions (regions of layer M2 overlapping the layer M1) upon a gentle agitation of the substrate (by various means including gas pressure jet, sonication in a liquid bath) or by directing a fluid jet over the second conductive layer M2, without further need of complicated or expensive equipment or processing steps, hence the name 'self-forming' nanogap electrodes. The process discussed herein can be extended to multiple metallization layers depending on the target application, a few examples of which will be discussed later.

By filling or covering the empty nanogaps with semiconducting, dielectric, conducting, piezoelectric, ferroelectric, piezo-resistive, electrolytic, and/or an electrolyte material, electronic devices of various kinds can be fabricated with minimum complexity and high-yield, due to the self-forming nature of the process. Post-deposition processing steps can then be carried out via traditional methods, i.e., thermal annealing or other conventional means, in order to chemically convert or modify the chemistry and microstructure of the material in the nanogap. To this end, the inventors have realized that the nanometer dimensions of the formed gap between the first and second layers, M1 and M2, enables novel ways of processing the active materials deposited inside the nanogap, i.e., in-between the layers M1 and M2. An extremely fast (microseconds to seconds) and efficient method for achieving this processing is via photonic annealing and/or photochemical treatment of the material deposited in-between the layers M1 and M2, as will be discussed later in more detail.

In this process, the metal nanogap containing a suitable precursor material deposited in-between layers of M1 and M2, is exposed to an intense pulse of light (generated, for example, by a broad or narrow spectra lamp, e.g., xenon, or other light sources such as a laser diode) of different duration and intensity, depending on (i) the electrode material, (ii) the active material in the nanogap, (iii) the nanogap architecture, (iv) the overall device geometry, and (v) the material combinations.

The high intensity of the light pulse(s) is partially absorbed by the conductive layers and/or the active material itself, which is deposited in the gap or beneath/above the nanogap electrodes. If the light is absorbed by the metal electrodes, it subsequently raises the temperature of the layers M1 and M2, from room temperature to over 1000° C., within a short timeframe (from microseconds to seconds) because of their small size. Because of the nanometer dimensions separating the two electrodes, heat can propagate almost instantaneously and momentarily across the nanogap, leading to the subsequent conversion of a precursor compound pre-deposited into the nanogap, to a functional material (semiconductor, dielectric, conductor or other functional material, etc.). Because of the short duration of the photonic curing step, the process can be implemented on arbitrary substrate materials, a few examples of which include glass, plastic, paper using additive methods such as roll-to-roll (R2R), sheet-to-sheet (S2S), to name but a few, because the short duration of the process does not produce enough heat to damage the substrate material, even if the substrate material is heat sensitive. This is very advantageous when the metal or other material that is deposited inside the nanogap needs a high temperature for processing, but the substrate cannot withstand that high temperature.

Also, the nanogap electrodes can be integrated to form either single, discrete, electronic devices, such as diodes, capacitors, transistors, photodiodes, light emitting diodes, etc., or integrated circuits for logic or analog optoelectronic applications. Both the self-forming nanogap features as well as the application of the photonic curing allow for the fabrication of these devices on arbitrary substrates and surfaces, at any scale, and with minimum operator involvement as the entire process may be automated and performed under the supervision of an electronic controller.

A self-forming nanogap based solid-state device 100 is now discussed with regard to FIG. 1. The device 100 includes self-forming coplanar nanogap electrodes 110 and 120 that are separated by a gap 130 having a width G, which is 100 nm or smaller. The width G of the nanogap is measured along the substrate, between the first electrode 110 and the second electrode 120. In one embodiment, the width G is 100 nm or smaller. In another embodiment, the width G is 20 nm or smaller. The electrodes 110 and 120 are formed on a substrate 140, and the electrodes have heights H1 and H2, respectively. The heights may be or not the same. The substrate 140 may be glass, the first and second electrodes/layers may be made of the same or different materials. For example, in one application, the first and second layers are made of Al. In another application, the first layer is made of Al, and the second layer is made of a combination of Ti and Pt. Other materials that may be used are discussed later. The length of the first and second electrodes may vary between mm to cm. While FIG. 1 shows the gap 130 being empty, as discussed later, it is possible to fill the gap with one or more materials to form other devices, such as diodes or transistors.

Figure 2:
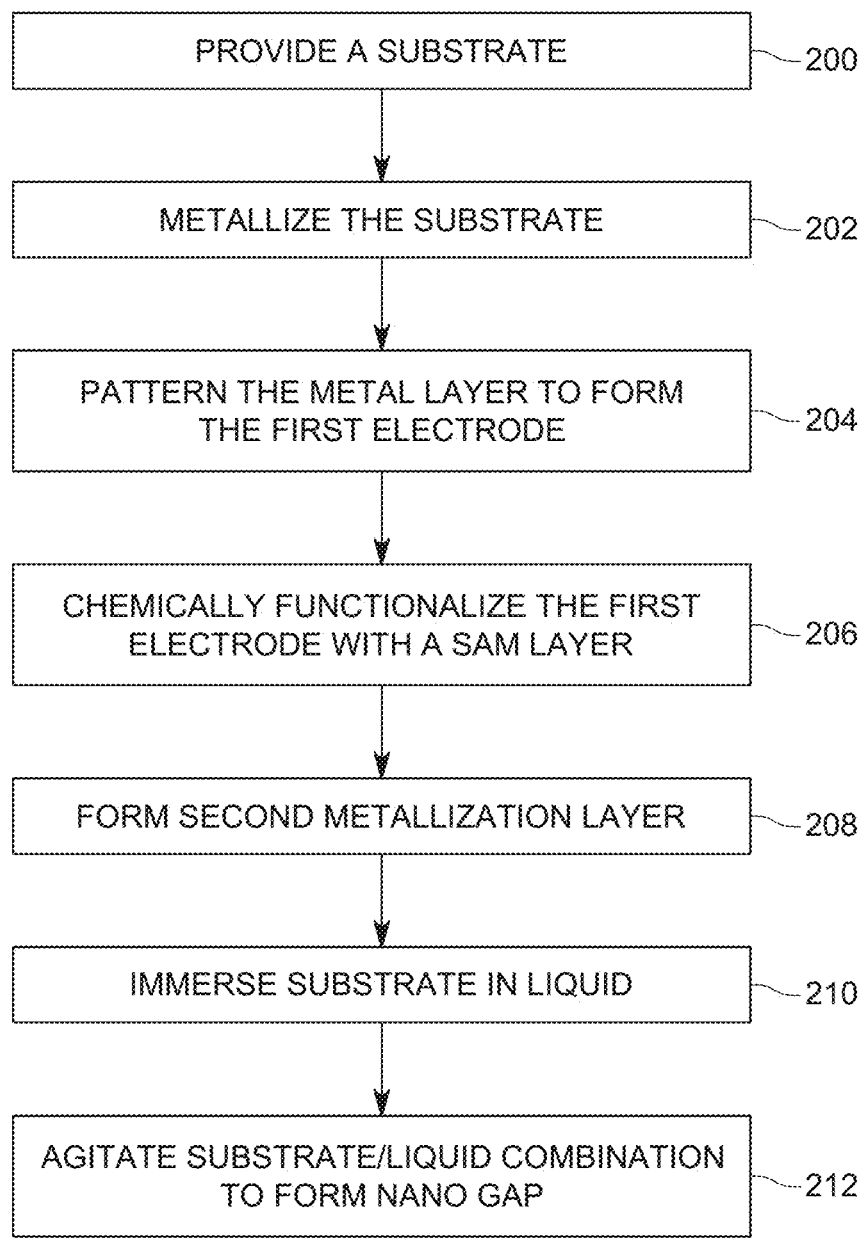
FIG. 2 is a flowchart of the self-forming nanogap method.

A method for forming the self-forming nanogap based device 100 of FIG. 1 is now discussed with regard to FIG. 2. The method includes a step 200 of providing the substrate 140. There is a large variety of substrate materials that can be chosen for this step. While glass and Si wafers with a thermally grown oxide layer are the standard materials for the semiconductor devices, flexible plastic substrates can be used as well. Generally, any material that (1) offers good adhesion to the chosen layers M1 and M2, and (2) does prevent the molecules of a self-assembling monolayer (SAM) form forming a monolayer is suitable for the substrate. When these requirements are not met, an interfacial buffer layer, exhibiting appropriate surface chemistry, may be formed on top of the substrate to render the substrate material valid for the self-forming process of nanogaps. It is additionally possible that an active material (semiconductor or dielectric) is already present on the substrate 140, before the start of the nanogap fabrication, (i.e., before the deposition of the layers M1 and M2 and/or other functional materials), which would create the electrodes on top of the active material.

Figure 3A:
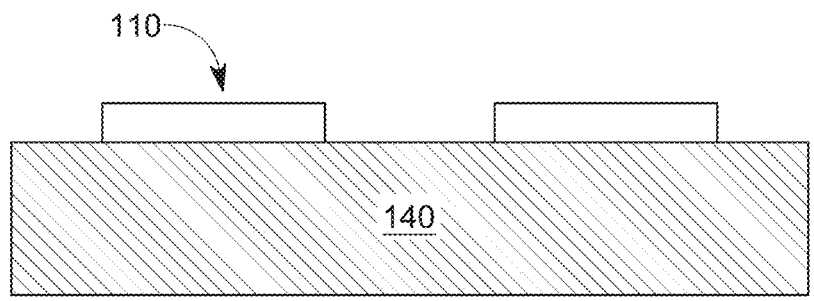
FIGS. 3A to 3E illustrate the various stages of a solid state device formed with the self-forming nanogap method.

In step 202, the substrate 140 is metallized to form the first layer M1, which in this specific embodiment is chosen to be an aluminum layer of a given thickness H1. The term metallization in this application is understood to mean the deposition of a conductive material, which may be a metal but also a non-metal. In one application, the thickness H1 is selected to be 100 nm or less. The first metallic layer M1 may be deposited using thermal or e-beam evaporation deposition techniques (familiar to those skilled in the art), and then it can be patterned in step 204, via standard photolithography, to obtain the first electrode 110, as shown in FIG. 3A. Note that plural first electrodes 110 may be formed on the substrate 140. In one embodiment, the first electrodes 110 are formed directly on the substrate. The first electrodes 110 may be patterned to have any desired shape.

However, the deposition of the first metallic layer M1 is not limited to thermal or e-beam evaporation, but may include other common vacuum deposition methods, such as sputtering or pulsed laser deposition. Additionally, solution-based printing or growth methods may also be used. The patterning of the first metallic layer M1 to obtain the electrode 110 can be achieved via standard lithography and lift-off or etching protocols. Other options include, but are not limited to: shadow-masking during evaporation, laser ablation patterning method, soft lithography, micro-molding, or other printing techniques.

Figure 3B:
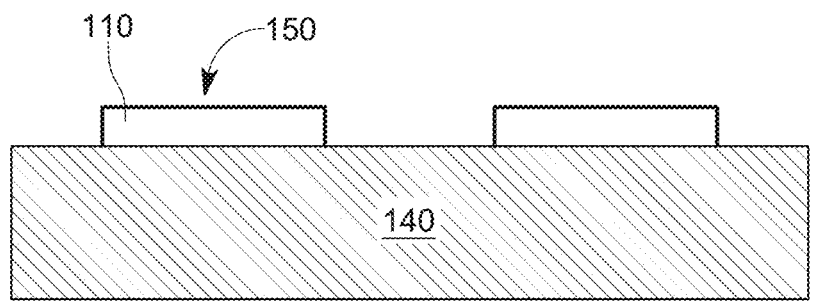

For this specific embodiment, because the first electrode 110 is formed of aluminum, a native aluminum oxide (alumina) layer is formed upon exposure to air. Then, the first electrode 110 is chemically functionalized in step 206 with a SAM layer 150, as shown in FIG. 3B. The SAM layer 150 is made in this embodiment of small organic molecule, such as octadecylphosphonic acid (ODPA). In one application, the SAM layer 150 may be achieved by creating a solution of ODPA in IPA (Iso-Propyl Alcohol) with a given concentration and submersing the metalized substrate 140 in the solution for a fixed time. Next, the substrate is rinsed with excess IPA and dried on a hotplate at an elevated temperature of 70° C. for several minutes. The precise method of SAM functionalization may vary in accordance with established protocols.

However, a SAM layer includes molecular assemblies formed spontaneously on surfaces by adsorption and are organized into more or less large ordered domains. In some cases, molecules that form the monolayer do not interact strongly with the substrate (note that the substrate in this paragraph refers to the material to which the SAM layer is formed upon, i.e., the first electrode 110 in FIG. 1, and not the substrate 140). This is the case, for instance, of the two-dimensional supramolecular networks of e.g., perylenetetracarboxylic dianhydride (PTCDA) on gold or of e.g., porphyrins on highly oriented pyrolitic graphite (HOPG). In other cases, the molecules possess a head group that has a strong affinity to the substrate and anchors the molecule to it. Such a SAM consisting of a head group, tail, and functional end group may include head groups such as thiols, silanes, phosphonates, etc. The SAM layers are created by the chemisorption of the "head groups" onto the substrate from either the vapor or liquid phase followed by a slow organization of "tail groups". The "head groups" assemble on the substrate, while the tail groups assemble far from the substrate. Areas of close-packed molecules nucleate and grow until the surface of the substrate is covered in a single monolayer.

The molecules that form the SAM layer 150 on top of the first electrode 110 are selected with two goals in mind. The first goal is to change the surface properties of the first electrode 110. The molecule chain and tail group of the SAM layer 110 should be chosen to create a hydrophobic (low-surface energy), a non-sticky surface on top of the first electrode. The pure alkyl chain of ODPA is a good example of this. Meanwhile, other possible candidates include, for example, alkyl/aromatic chains with different numbers of carbons or fluorinated chains.

The second goal of the SAM material is the selective binding of the head group, i.e., the SAM material is desired to bind to the first layer M1 but not to the substrate 140. The phosphonic acid-based ODPA used in this embodiment is known to bind to certain metal oxide surfaces such as the native alumina, but not to, for example, non-oxide surfaces such as plastic substrate, or substrates covered by an interlayer that can be processed atop prior to metal and SAM deposition. This way, the adhesion of the second layer M2 with the substrate 140's surface (or the surface of the interlayer) stays unaltered while the adhesion of the second layer M2 towards the first layer M1 is diminished. The head group can be changed depending on the nature of the first layer M1 and needs to be matched/selected accordingly amongst several existing options.

For example, thiol-based molecules are known to attach preferentially onto noble metals such as gold, platinum, or silver, whereas phosphonic acids do not. The SAM layer deposition step is mostly carried out via self-assembly from the liquid phase (SAM molecules are dissolved in a solvent), but a gas phase deposition is also possible.

Figure 4A:
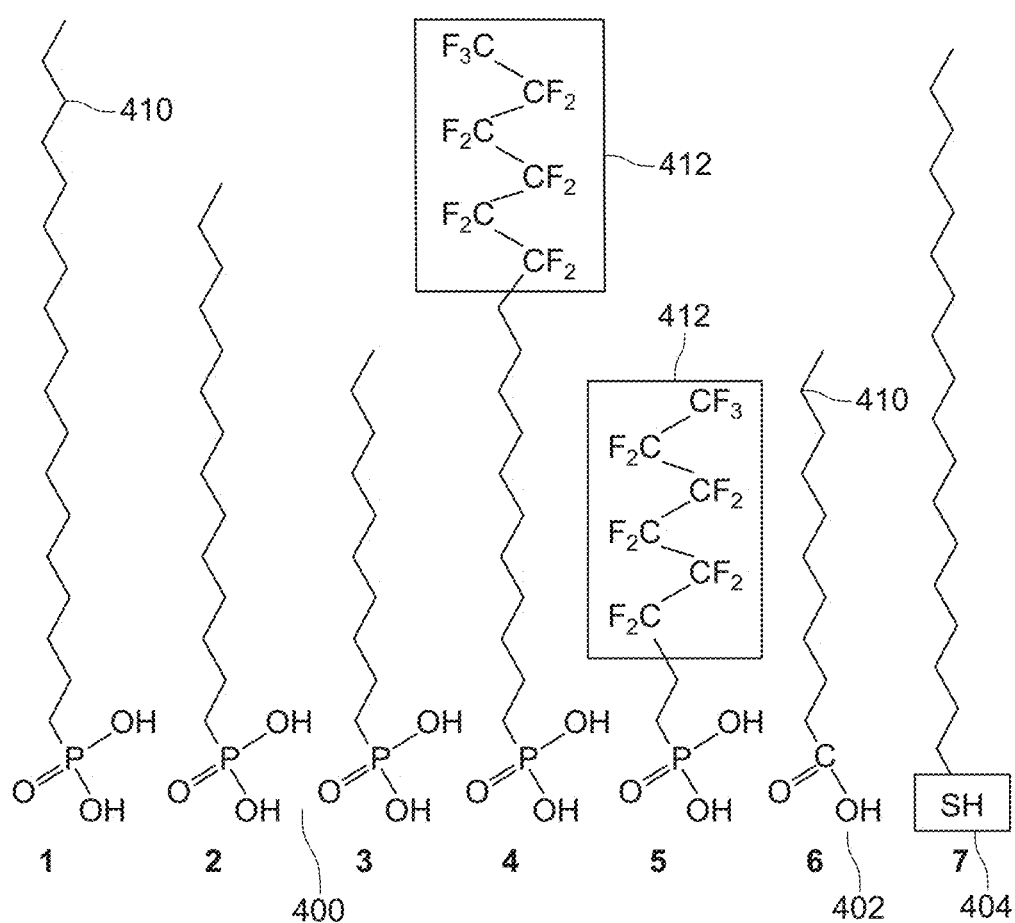
FIGS. 4A to 4C illustrate various self-assembling monolayers (SAMs) used with the self-forming nanogap method.
Figure 4B:
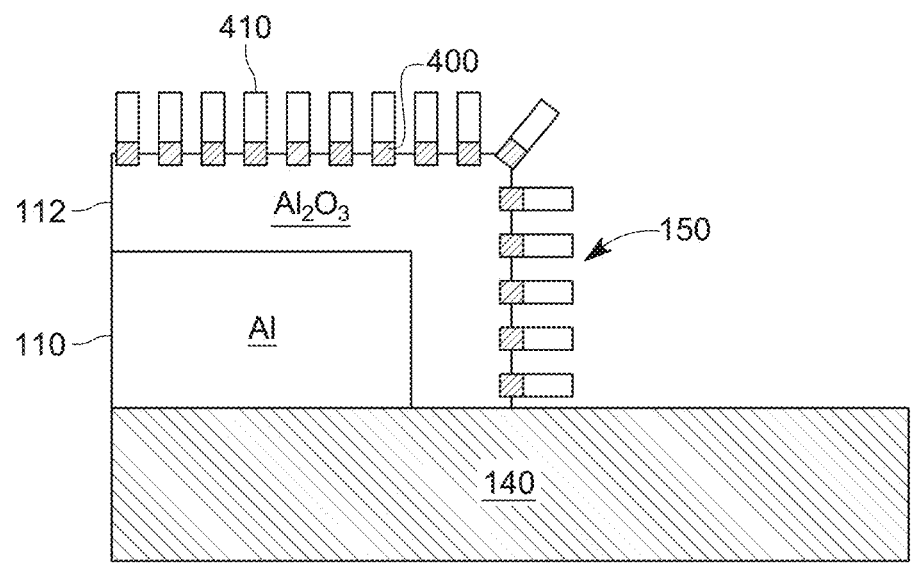
Figure 4C:
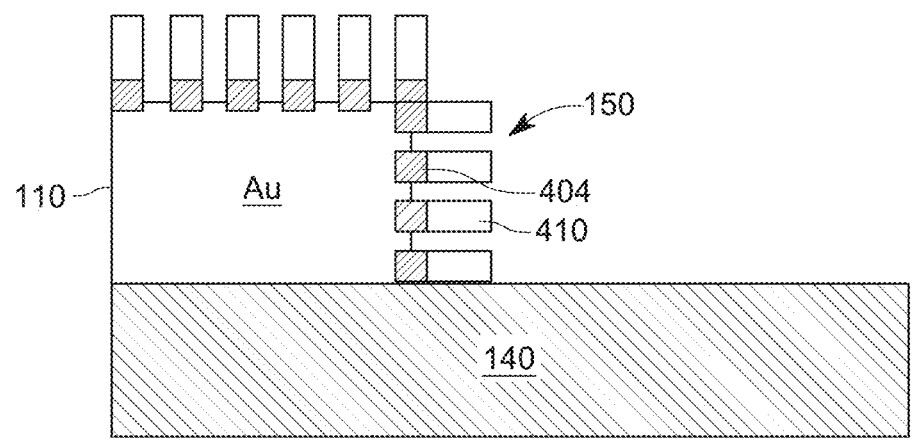

A few examples of possible SAM forming molecules as well as a conceptual visualization of the SAM selection criteria are illustrated in FIGS. 4A to 4C. FIG. 4A shows 7 different SAM materials having a head group (bottom region of the figure), a chain part (middle region of the figure), and an end group (top region of the figure). Note that examples 1-3, 6, and 7 have the end group very similar to the chain part, while examples 4 and 5 have the three groups distinct from each other. The head group may include the phosphonic acid 400, or the carboxylic acid 402, or the thiol 404, while the chain/end groups may include an alkyl 410 or a fluorinated element 412.

The first example 1 of SAM material is Octadecylphosphonic acid, the second example 2 is: Tetradecylphosphonic acid, the third example 3 is Decylphosphonic acid, the fourth example 4 is: 12,12,13,13,14,14,15,15,16,16,17,17-Tridecafluoroseptadecylphosphonic acid, the fifth example 5 is: 3,3,4,4,5,5,6,6,7,7,8,8-Tridecafluorooctylphosphonic acid, the sixth example 6 is: Decanoic acid, and the seventh example 7 is: Octadecanethiol.

FIGS. 4B and 4C schematically illustrate the selective binding of different SAM molecules to the first electrode 110 or an oxide layer 112 formed on the first electrode 110, but the lack of binding to the substrate 140. For example, FIG. 4B shows a first electrode 110 made of Al on the substrate 140, and the oxide layer 112 formed at the surface of the first electrode 110. A phosphonic acid (group 400 in FIG. 4A) based SAM layer 150 is binding to a native or grown alumina layer 112 on the first Al electrode 110. FIG. 4C shows a thiol (group 404 in FIG. 4A) based SAM layer 150 binding to the surface of a first Au electrode 110. In either case, the SAM layer 150 does not form a strong bond with the chosen substrate.

Figure 3C:
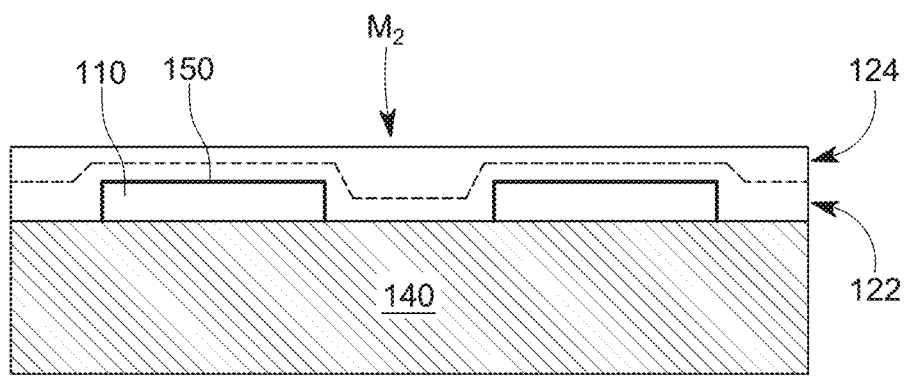

Returning to FIG. 2, the method then advances to step 208, in which the second metallization layer M2 is formed over the SAM layer 150 and over the exposed substrate 140, as shown in FIG. 3C. The second layer M2 may have a thickness of about 50 to 200 nm, but preferably 100 nm. In one embodiment, the second layer M2 is formed to include a first thin layer 122 (e.g., less than 20 nm, preferably 5 nm) of titanium (which may be considered to be the interlayer discussed above) and a second thick layer 124 (e.g., less than 200 nm, but preferably 100 nm) of platinum. The two layers are schematically illustrated in FIG. 3C, but not at scale. The two layers 122 and 124 may be deposited by e-beam evaporation, or other methods, over the pre-patterned first electrodes 110 on the substrate 140.

The kind of metal that can be employed for the first layer M1 is related to the availability of a suitable SAM forming molecule. Some examples of these metals are Al, Au, Ti, and ITO, but a much wider selection is possible. The second layer M2 for the self-forming nanogap procedure may include a combination of the thin layer 122 (thickness in the range 1-100 nm) of titanium (or others mentioned above) followed by the second layer 124, e.g., a platinum layer. Other materials instead of Pt may be used.

Figure 3D:
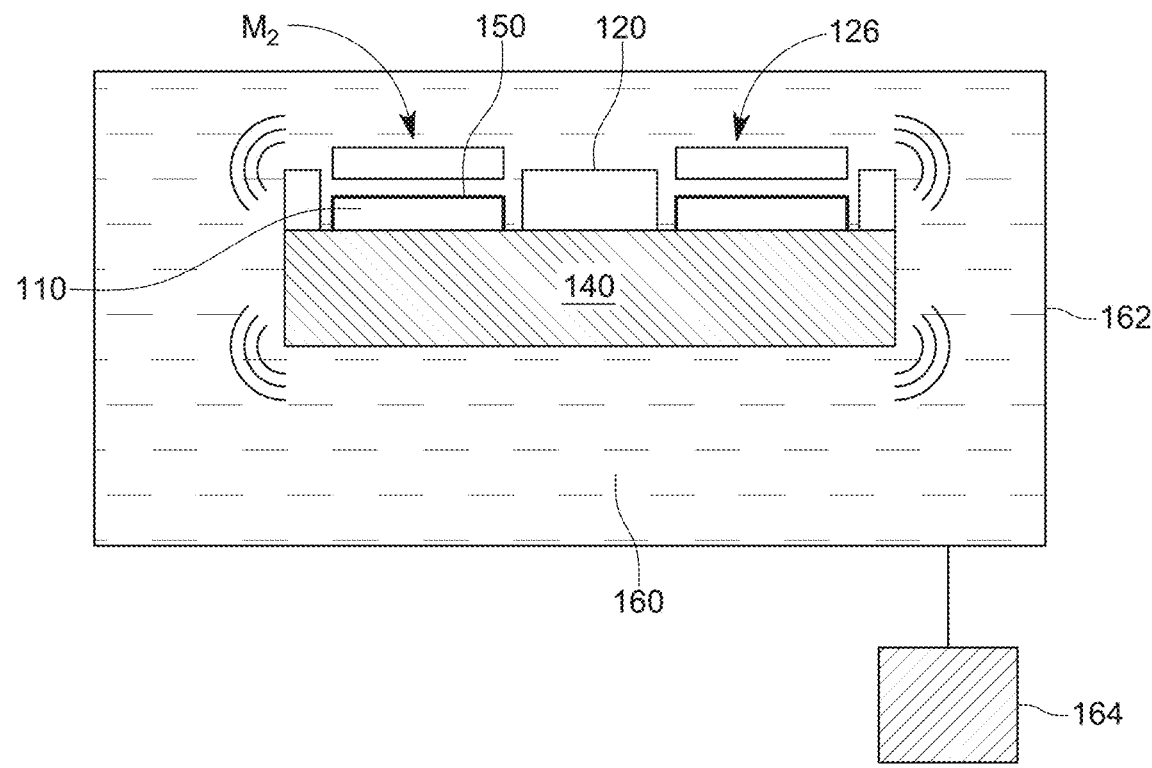

With regard to FIG. 3C, in all areas where the second layer M2 overlaps with the first electrode 110, the SAM treated surface of the first electrode 110 drastically reduces the adhesion between the material of the first electrode 110 and the material of the second layer M2. Thus, when immersing in step 210 the substrate 140 in a liquid 160 (e.g., acetone or other liquids) contained in a container 162, as shown in FIG. 3D, while gently shaking/agitating in step 212 the container 162, either through manual agitation or ultrasonication for a few minutes, or as long as it is required, makes the second layer M2 to be removed (spontaneously being lift-off) from all the areas where it overlaps the first electrode 110, but not from the areas where the second layer M2 directly contacts the substrate 140. Note that the step of agitation may also be implemented by directing a fluid jet over the second layer M2 to remove it from the areas where the SAM layer is present. The fluid may be a liquid or a gas, e.g., air. The jet needs to have enough speed to accomplish this task. However, if the fluid jet is directed over the second layer M2, it may not be necessary to move/shake/agitate the substrate for removing the second layer M2 from the first M1 layer, and there is no need for the liquid 160, i.e., the fluid jet may be directed to remove the second layer M2 from the first layer M1. At the same time the entire device is kept in air.

Figure 3E:
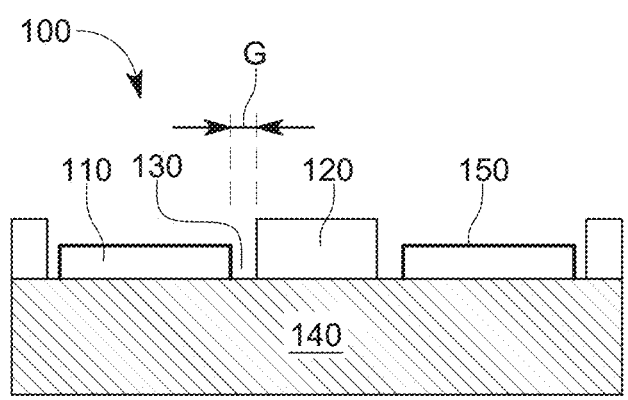

As a result of the agitation step 212 (which can be achieved with a motorized device 164), the second layer M2 is fractured along the boundary of the first electrode 110, and because of the low-energy adherence between the SAM layer 150 and the parts 126 of the second layer M2 that are directly formed over the first electrodes 110, these parts 126 are falling off the first electrodes 110. However, the other parts of the second layer M2, which are directly formed on the substrate 140, remain adhered to the substrate, and thus they form the second electrode 120. As the parts 126 of the second layer M2 are falling off the device 100, the nanogap 130 appears between the first electrode 110 and the second electrode 120, as shown in FIG. 3E. The nanogap 130 has a gap width G, as previously shown in FIG. 1. The gap width G is 20 nm or less. In one embodiment, the gap width G is between 1 and 100 nm. This gap 130 is self-forming and can be used for depositing other materials to make a diode, transistor, sensor, integrated circuit, solar cell, Wireless Energy Harvesting (WEH) devices, etc.

To remove the second layer M2 from the overlapping areas of the first electrode 110, several techniques are possible. These include the submersion of the substrate into a solvent bath (water, IPA, acetone amongst many other options) either with intermittent manual shaking for a duration of <1 h or without additional manual agitation over a prolonged period of time, as shown in FIG. 3D. Instead of manual agitation, in another embodiment, it is possible that the second layer M2 removal is initiated by ultrasonication for a shorter time frame (tenths of seconds to minutes). Another possibility without the usage of solvents is to expose the substrate to a pressurized gas stream (using compressed air, nitrogen, or other gases) that can remove the overlapping areas between the first electrode and the second metallic layer. Alternatively, an adhesive layer (glue, tape, etc.) is placed over the second layer M2. Then this layer is peeled-off, thereby taking away all weakly adhered M1/M2 overlapping regions, similar to a process described in [1]. However, this step described in [1] needs to be carried out manually, with great care. Variations in the peel-off rate and the pulling force can lead to process variations, depending on the operator. Eliminating this peel-off step by using self-forming nanogaps, as described in the method illustrated in FIG. 2, especially step 212, increase the uniformity of the gap, removes operator-to-operator fluctuations, as well as saves material costs for specialized glues.

The nanogap 130 may be used, as discussed next, to receive one or more materials (semiconductor material or dielectric material). For this process, the SAM layer can be removed, for example, using a plasma treatment of less than 20 min, or an equivalent process, and a different SAM layer with a particular functionality (i.e., ability to change the electronic properties or chemistry of both or one of the electrodes) may be post-deposited inside the nanogap, for making a desired solid state device.

Figure 5A:
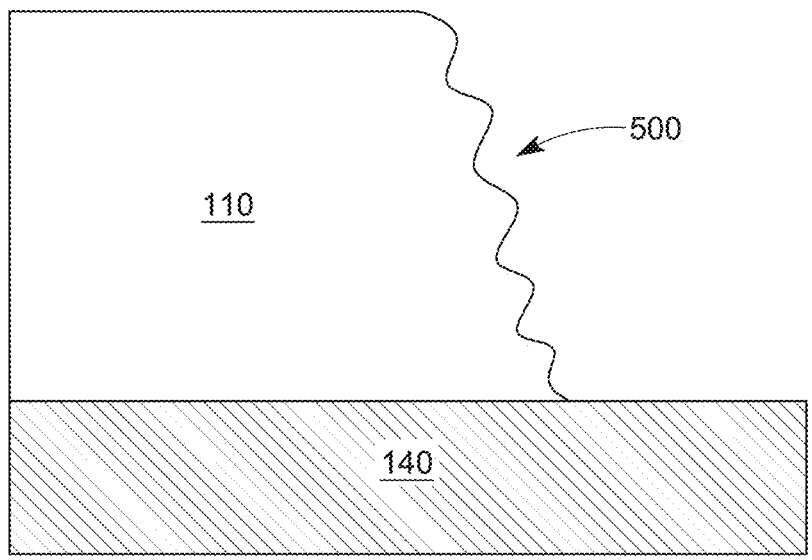
FIGS. 5A and 5B illustrate a profile of a border of a first electrode of the solid state device.
Figure 5B:
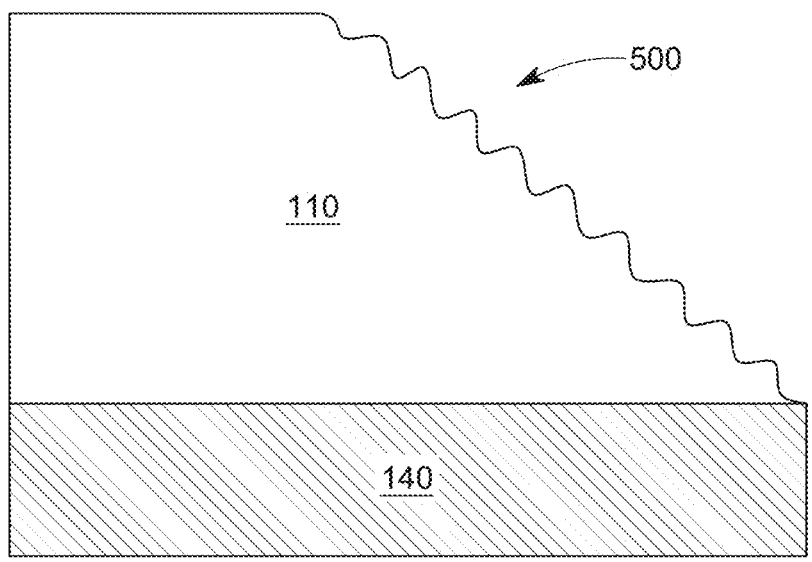

Various factors that may affect the nanogap fabrication process are now discussed. One such factor is the edge profile of the first electrode 110. Because the nanogap formation takes place around the lateral boundary line of the first electrode 110, this area appears to affect the process discussed concerning FIG. 2. The height profile 500, from the substrate 140, of the first electrode 110 at this region can vary between a steep and sharp transition, as shown in FIG. 5A, to a more gradual one or even an undercut, as shown in FIG. 5B, depending on the technique employed to pattern the first layer M1 to obtain the first electrode 110. A sharp transition, as shown in FIG. 5A is generally preferred to create a nanogap of smallest dimensions, but it may not be necessary, depending on the application envisioned.

The deposition rate of the materials making the first layer M1 and the second layer M2 also play a role. It is known that the deposition rate during a gas phase deposition process influences specific properties of the final film. This applies to the average grain size within the metal film and to the surface roughness (root-mean-square roughness, RMS). In the case of aluminum, for example, the formed films tend to show a reduced grain size and roughness values at higher deposition rates. The grain size in both the first and second layers influence the nanogap formation process. For the first metallic layer M1, the grains define the lateral boundary, meaning that smaller grain sizes lead to a generally preferred more uniform outline, whereas larger grains result in more irregularity. Because it is the second metallic layer that fractures during the gap formation process, its average grain size also plays a role, as fractures tend to occur along grain boundaries, which constitute structurally weaker parts of the layer. Additionally, the adhesion of a deposited layer to the substrate material can change in magnitude, depending on the deposition rate and the nature of materials employed.

Figure 6A:
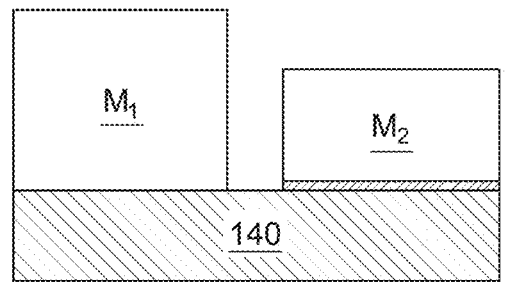
FIGS. 6A to 6C illustrate various possible combinations of thicknesses for first and second electrodes of the solid state device.
Figure 6A:
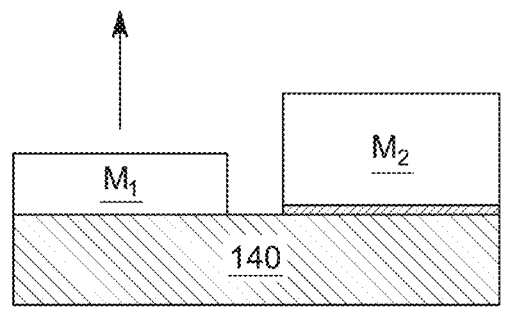
Figure 6B:
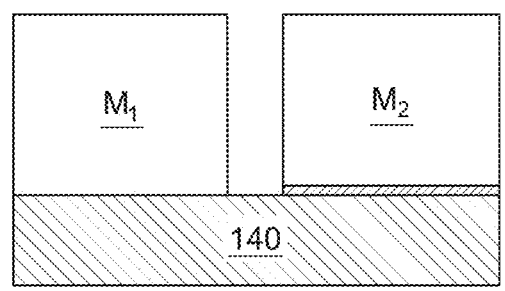
Figure 6B:
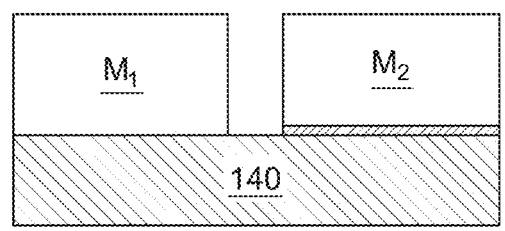
Figure 6B:
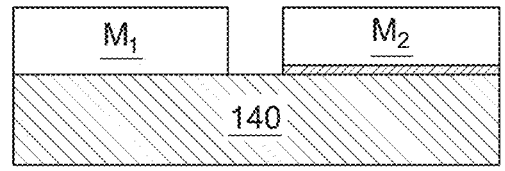
Figure 6C:
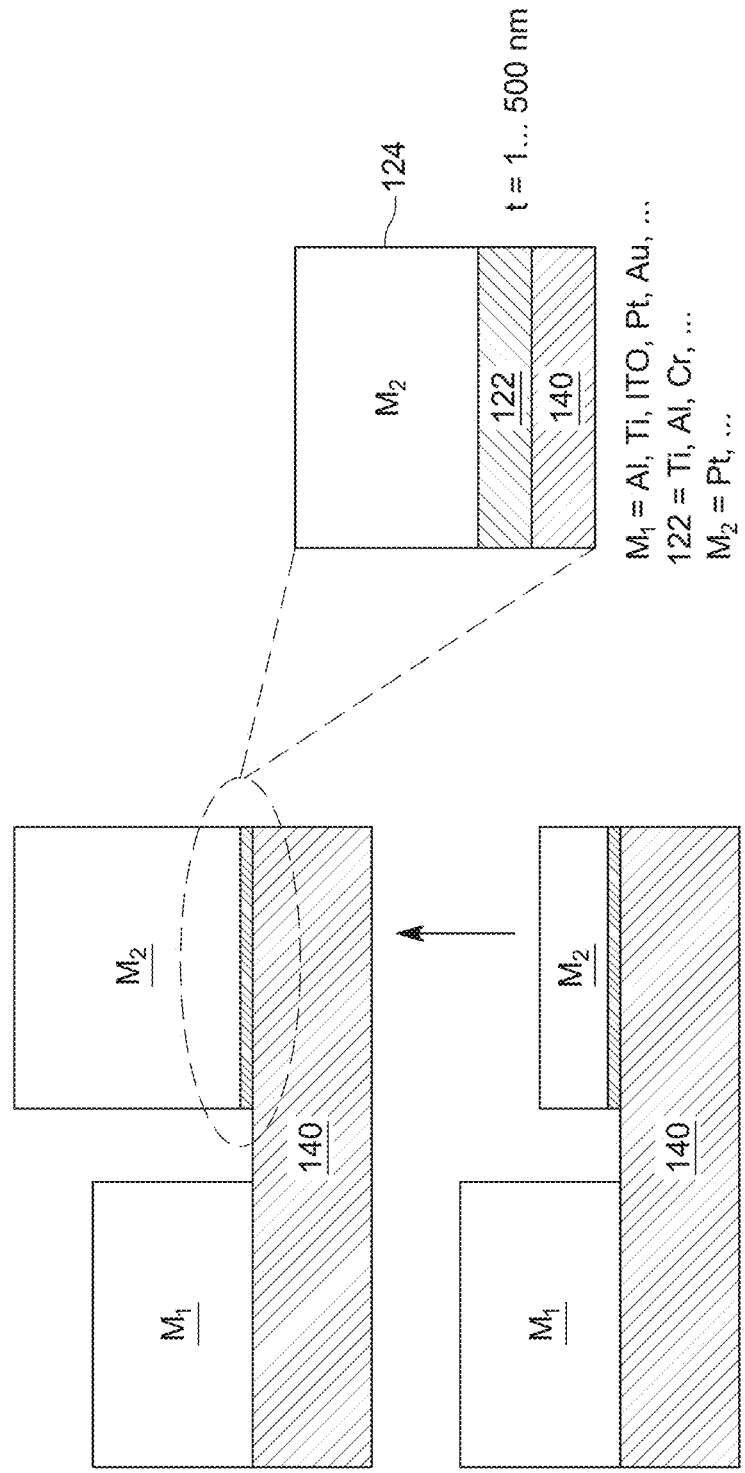

The thicknesses of the first layer M1 and the second layer M2 also influence the gap formation process. The dimensions of the self-forming nanogap may be influenced by the layer thickness of both metals involved. This applies to cases where both metals in the first and second layers M1 and M2 are of equal thickness, which can be varied from thin to thick, within the range of approximately 10 to 500 nm. Similarly, variations of the relative thicknesses between the first layer M1 and the possible interlayer 122 (formed between the substrate 140 and the second metallic layer M2) and the second layer M2 can affect the final gap size. In this regard, FIG. 6A shows possible implementations of the device 100 shown in FIG. 1, in which the thickness of the second metallic layer M2 is constant, while a thickness of the first metallic layer M1 can vary from less than a thickness of the second metallic layer M2 to more than the thickness of the second layer M2. FIG. 6B shows the thicknesses of both layers M1 and M2 being equal, but having different values, and FIG. 6C shows possible variations of the thickness of the second metallic layer M2 relative to the first metallic layer M1. FIG. 6C also illustrates various materials that can be used for these layers.

Figure 7A:
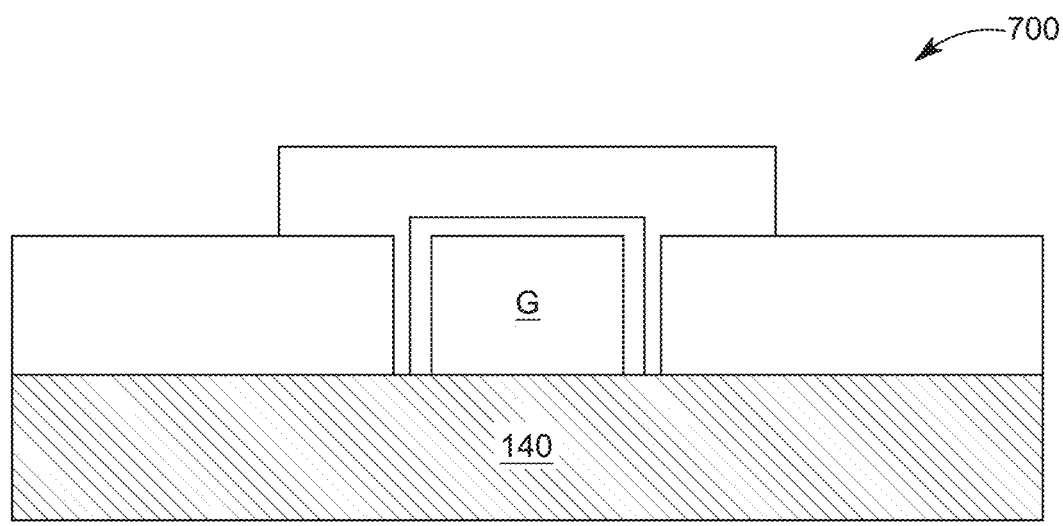
FIGS. 7A and 7B illustrate various transistors formed with the self-forming nanogap method.
Figure 7B:
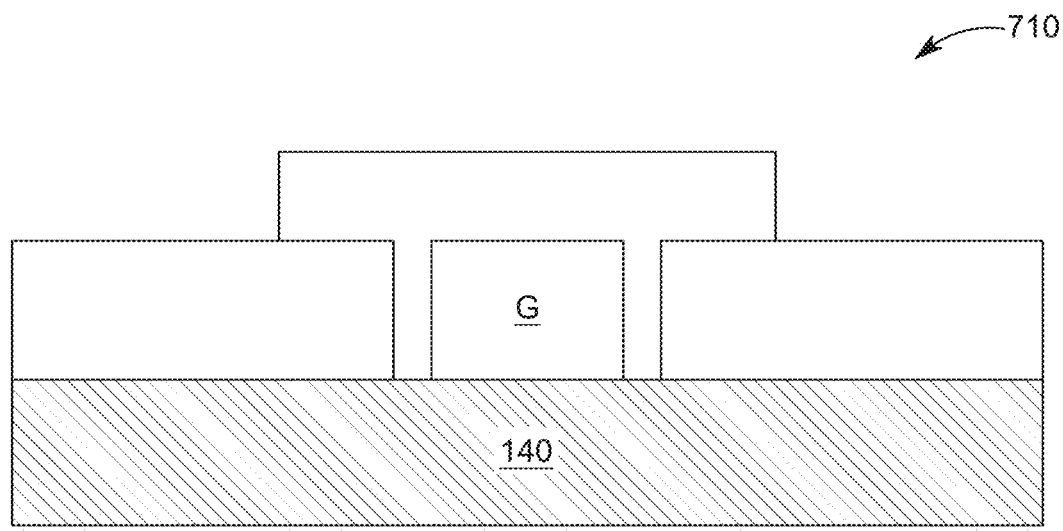
Figure 8A:
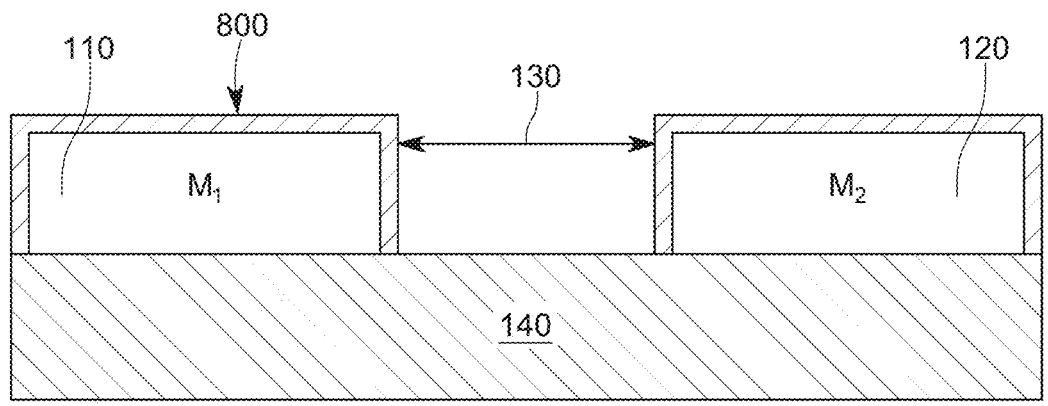
FIGS. 8A to 8F illustrate various stages of forming a transistor with the self-forming nanogap method.
Figure 8B:
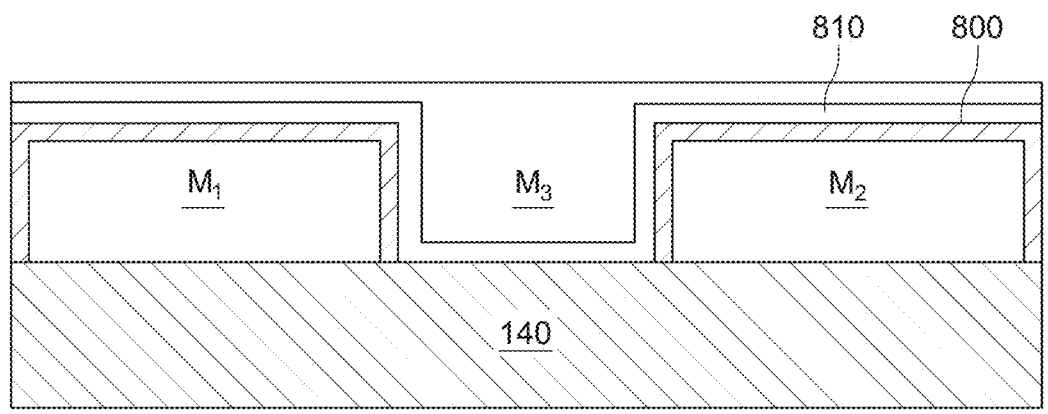

A self-forming nanogap solid-state device is now discussed. This device may be a TFT transistor 700, as shown in FIG. 7A or a Schottky gated TFT transistor 710, as shown in FIG. 7B. Other devices may be made with this novel technique, as for example, a solar cell. A method for manufacturing such solid-state devices is discussed with regard to FIGS. 8A to 8F. FIG. 8A shows a substrate 140 on which first and second electrodes 110 and 120 have been formed with a nanogap 130 in between them, based on the method discussed above with regard to FIG. 2. The two electrodes, 110 and 120 are SAM functionalized with a SAM layer 800, which may be the same or different from the SAM layer 150. Note that for the embodiment illustrated in FIG. 8B, the SAM layer 800 is formed after the formation of the gap 130, so that the SAM layer 800 extends inside the gap, along with the side parts of the first and second electrodes 110 and 120. Note that the SAM layer is not formed directly on the substrate 140 due to the properties of the substrate, as discussed above. Also, the SAM layer does not fill the nanogap. Then, as shown in FIG. 8B, an interlayer 810 is formed over the SAM layer 800 and the substrate 140, followed by the formation of another metallic layer M3, to cover an entirety of the interlayer 810. The interlayer 810 may be made of similar materials as the interlayer 122 previously discussed.

Figure 8C:
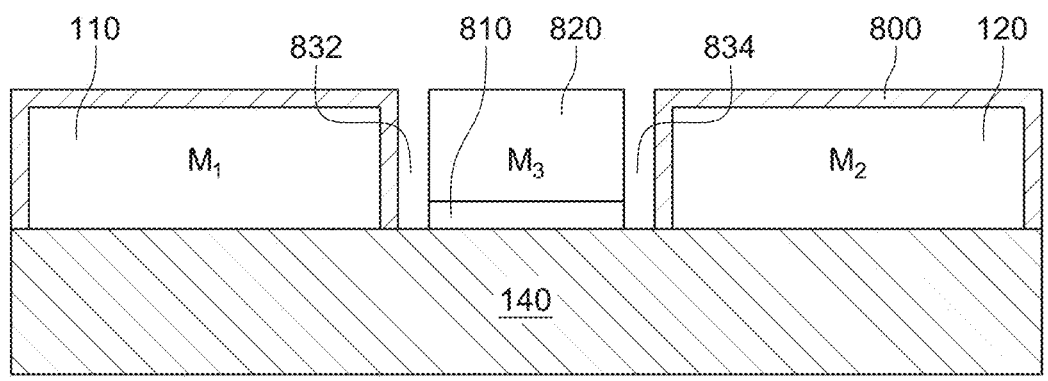

Then, the device shown in FIG. 8B is placed in a liquid (for example, step 210 in FIG. 2) and agitated (see step 212 in FIG. 2) so that the interlayer 810 and the third metallic layer M3 that are in direct contact with the SAM layer 800 fall out, while a portion of the third metallic layer M3 that is directly or indirectly formed on the substrate 140 remains attached to the substrate 140, within the gap 130, to form the third electrode 820, as shown in FIG. 8C. In other words, the method discussed above with regard to FIG. 2 is applied to form additional first and second nanogaps 832 and 834, between the third electrode 820 and the adjacent first and second electrodes 110 and 120, as illustrated in FIG. 8C.

Figure 8D:
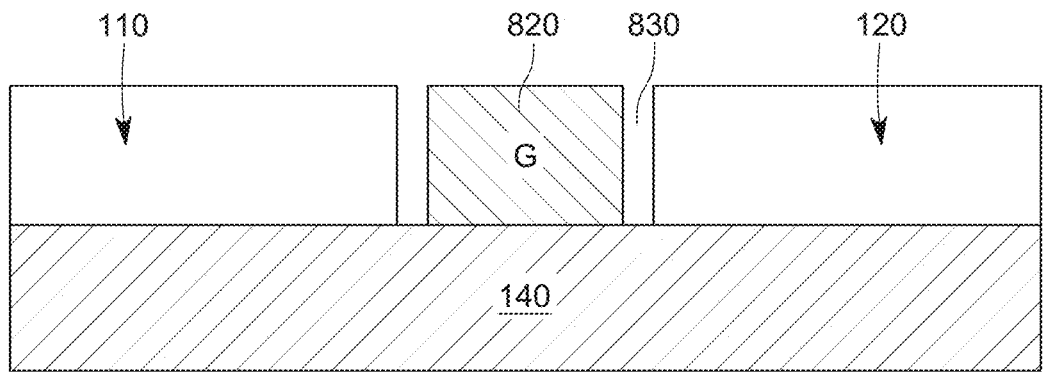
Figure 8E:
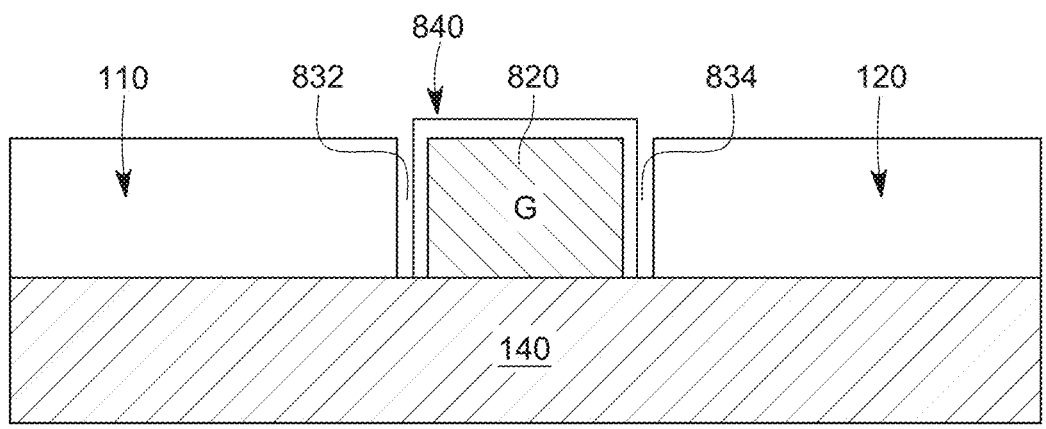
Figure 8F:
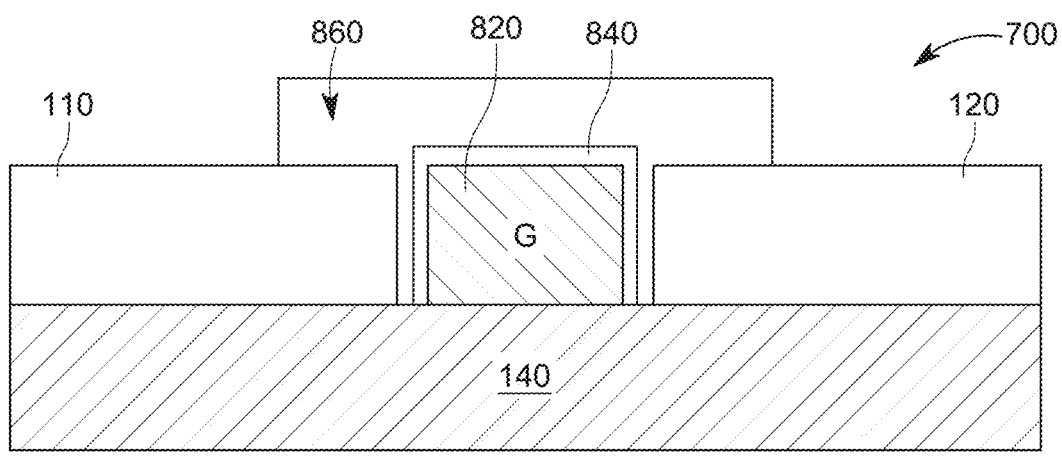

Next, the SAM layer 800 may be removed, as shown in FIG. 8D, using, for example, UV/Ozone or plasma treatment or any other known method. A dielectric layer 840 may then be formed around the third electrode 820, inside the additional gaps 832 and 834, using any traditional method, as shown in FIG. 8E. For example, the dielectric deposition may include either the formation of a native oxide on the electrode 820 via oxidization and/or the deposition of a SAM using self-assembly (which does not require any manual alignment step). The formation of the dielectric material 840 inside the additional nanogaps 832 and/or 834 does not mean that these gaps are filled with the dielectric material. Next, a semiconductor material is deposited in the remaining parts of the additional gaps 832 and 834 and over the dielectric layer 840 to form a semiconductor layer 860, as illustrated in FIG. 8F. Note that both the dielectric layer 840 and the semiconductor layer 860 are formed inside the gaps 830.

In this way, the TFT transistor 700 is obtained, where the first and second electrodes 110 and 120 play the roles of the source and drain of the transistor, and the third electrode 820 plays the role of the gate of the transistor. The semiconductor layer 860 acts as the channel between the source and the drain, and the electric charge flow through the channel is controlled by the gate 820, through the dielectric material 840.

The novel technology discussed above may also be used to prepare large-area, soft stamps containing features with sizes ranging from 1 nm to potentially any scale. This technology relies on the use of a nanoscale mould formed between two or more pre-patterned electrodes (made of similar or dissimilar materials and of predefined thickness ranging between 1 nm to 1 micrometer—or more) separated laterally by a distance that can range between 1-500 nm. The lateral size of the electrodes, on the other hand, can vary from hundreds of nanometres to meters, in length, depending on the method of patterning employed and the particular needs of the targeted application(s). This specific nanogap mould would be referred herein as the master mould.

The nanogaps formed between sequentially patterned electrodes in the nanogap mould could be prepared, as discussed above, by the method illustrated in FIG. 2. In another embodiment, the nanogap mould may be formed using the method known as adhesion lithography (a-Lith) discussed in [1]. In another embodiment, the nanogap mould can be formed by any other large-area compatible nanogap patterning technology [2], [3]. The formed nanogap between the two or more electrodes act as a mould when a UV curable polymer is casted over and used to prepare the soft stamp by first curing it and then peeling it off.

Figure 9A:
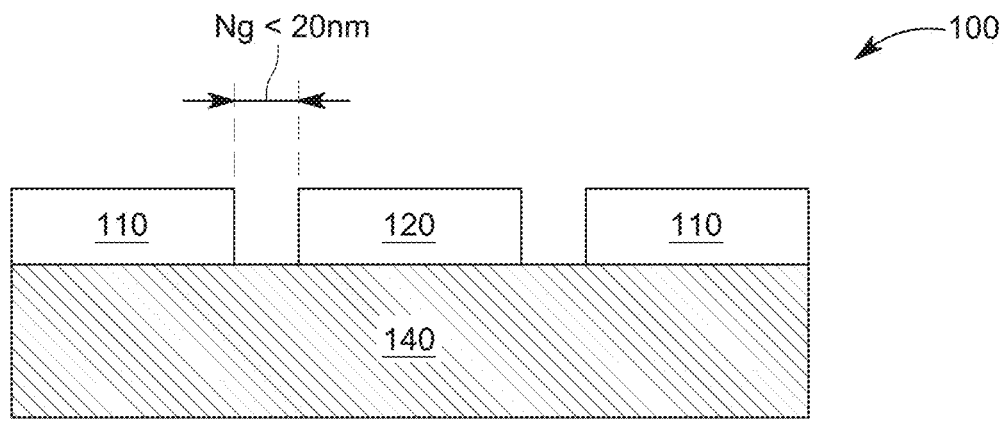
FIGS. 9A to 9D illustrate a method for forming a soft stamp using a master mould having nanogaps.

In this regard, a method for making a soft stamp 900 is now discussed with regard to FIGS. 9A-9D. The self-forming nanogap based device 100 discussed in FIGS. 1 and 3E is shown in FIG. 9A as being the starting point, i.e., the master mould. The device 100 has aluminum-aluminum (Al—Al) as the electrode material for electrodes 110 and 120. In this example, the electrodes 110 and 120 are made of the same material, but in principle, they can be realized using numerous/arbitrary material combinations, if needed. The electrodes may be made to be transparent to light or not.

The master mould 100, which can be fabricated on known and suitable substrate materials (of any size), includes 100 nm-thick (a range of thicknesses can be considered here depending on the particular features one wants to create) Al—Al electrodes 110 and 120 separated by a nanogap Ng smaller than 20 nm (other values can be considered, e.g., smaller than 100 nm), which was prepared via a-Lith method or self-forming method previously discussed. The master mould 100 may be cleaned using different processes (e.g., with oxygen plasma) and/or treated with different surfactants (SAMs, etc.), before starting the soft stamp preparation process. Other cleaning steps, such as rinsing or heating, may also be incorporated depending on the materials used and their interaction with the stamp material formulation.

After cleaning the master mould, an Anti-Sticking Layer (ASL) 910, which can be EVG ASL 1 (from EVG group GmbH), is spin-coated on top of the exposed substrate 140 and the electrodes 110 and 120 and thermally annealed in air at 120° C. for a couple of minutes, for example, 10 minutes. Different ASL materials can be used and are known to those experts in the art of NIL or other fields.

Figure 9B:
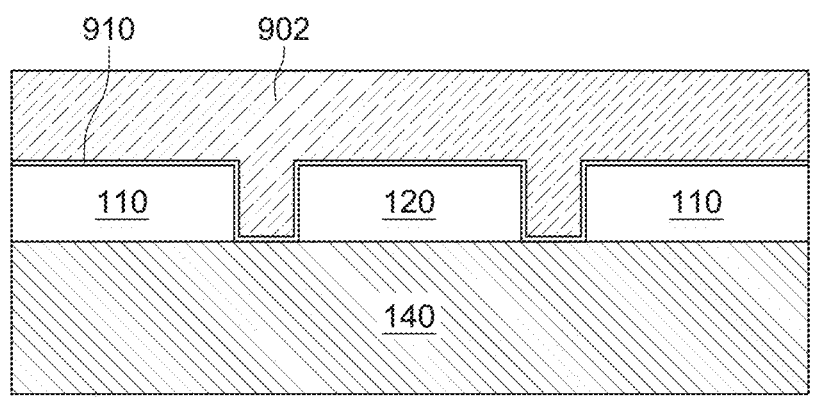

A soft polymeric/UV curable solution 902 for forming the soft stamp 900 was prepared by mixing the EVGNIL AF1 (from EVG group) with the Photo-Initiator (PI) in a 98:2 ratio (volume of 10 ml:0.2 ml) and stirred vigorously for 30 minutes. The solution 902 was then poured on top of the master mould 100 containing the nanogaps, as shown in FIG. 9B.

Figure 9C:
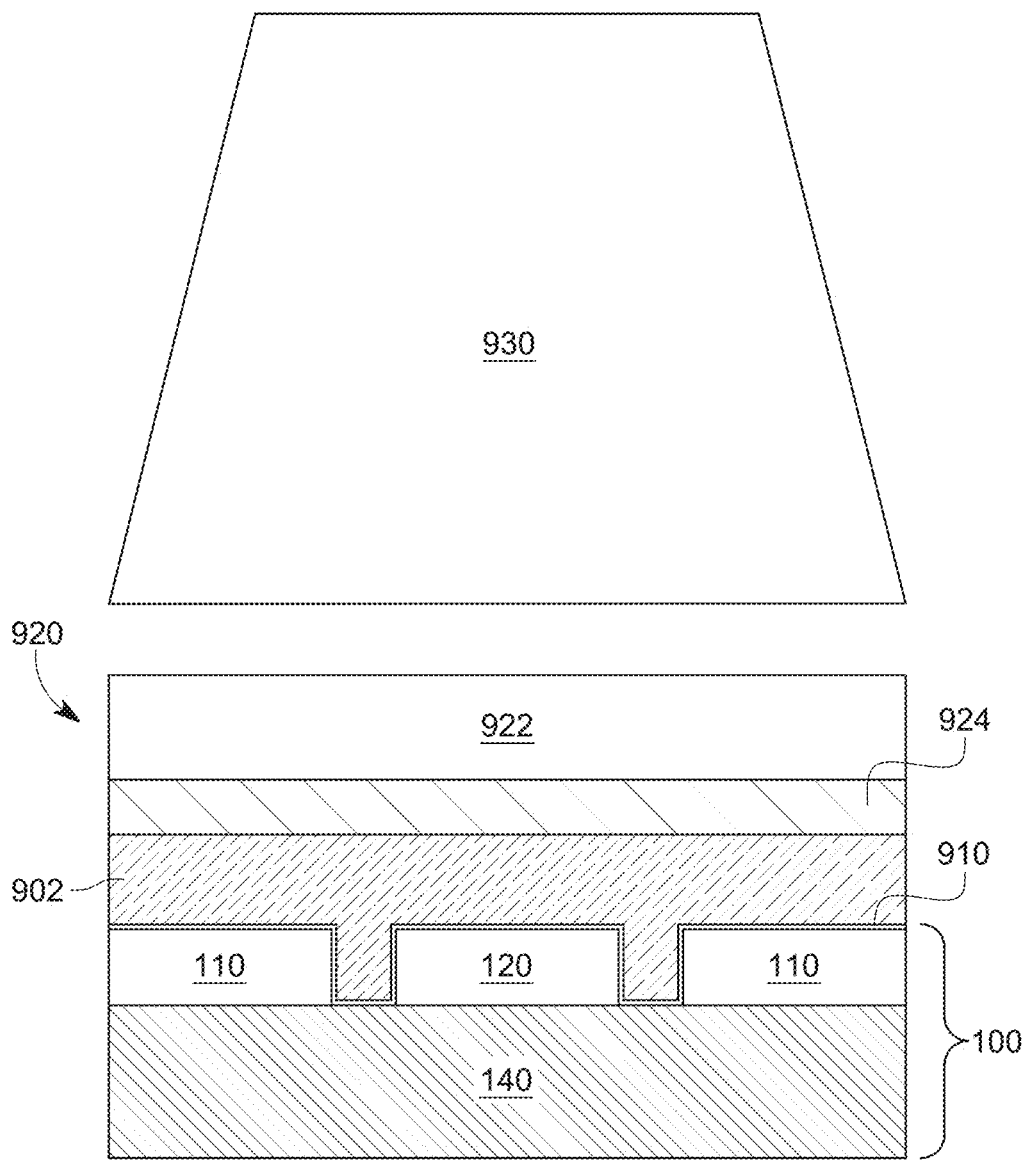

Next, as shown in FIG. 9C, a portion of a movable substrate 920 is brought into physical contact with the solution 902. The movable substrate 920 includes two parts: the top 922 and the bottom part of 924. The bottom part 924 is pressed against the master mould 100, sandwiching the solution 902 in-between and the top portion 922 is a transparent substrate which allows for UV light 930 to pass and cure the soft polymer solution 902 sandwiched between the master mould 100 and the bottom portion 924 of the movable substrate 920.

The top portion 922 of the movable substrate 920 may be made of a glass substrate, which is chosen to have minimum absorption in the UV range, spin-coated with an adhesion promoter layer, known as EVG PRIM K (from the EVG group), followed by annealing at 120° C. for 2 minutes to obtain the bottom portion 924. The adhesion promoter layer 924 enables the adhesion between the soft stamp 900 and the glass substrate 922 during the delamination of the soft stamp from the master mould.

UV light 930, having a wavelength 375 nm, may be used to cross-link the polymer inside the solution 902, which is placed in the nanogap Ng, and solidify. A UV light intensity of 18 mJ/cm$^2$ for 30 minutes exposure time was used in this embodiment and the photo-initiator enhanced the cross-linking of this soft polymer.

Figure 9D:
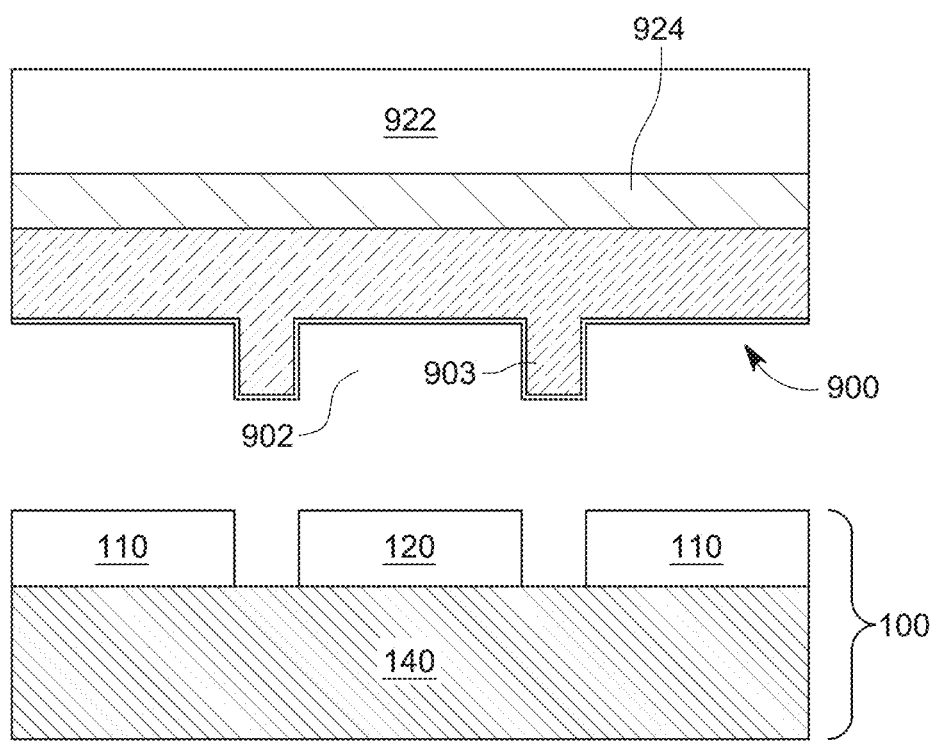

The soft stamp 900 (the solidified polymer solution 902) is then delaminated from the master mould 100, as shown in FIG. 9D and cleaned with oxygen plasma and HFE 7100 cleaner (from EVG group GmbH) for future use. Other known cleaning methods may be used. In this embodiment, the soft stamp 900 was cleaned with isopropyl alcohol (IPA) or HFE 7100 cleaner, but other solvents can be used.

Figure 10:
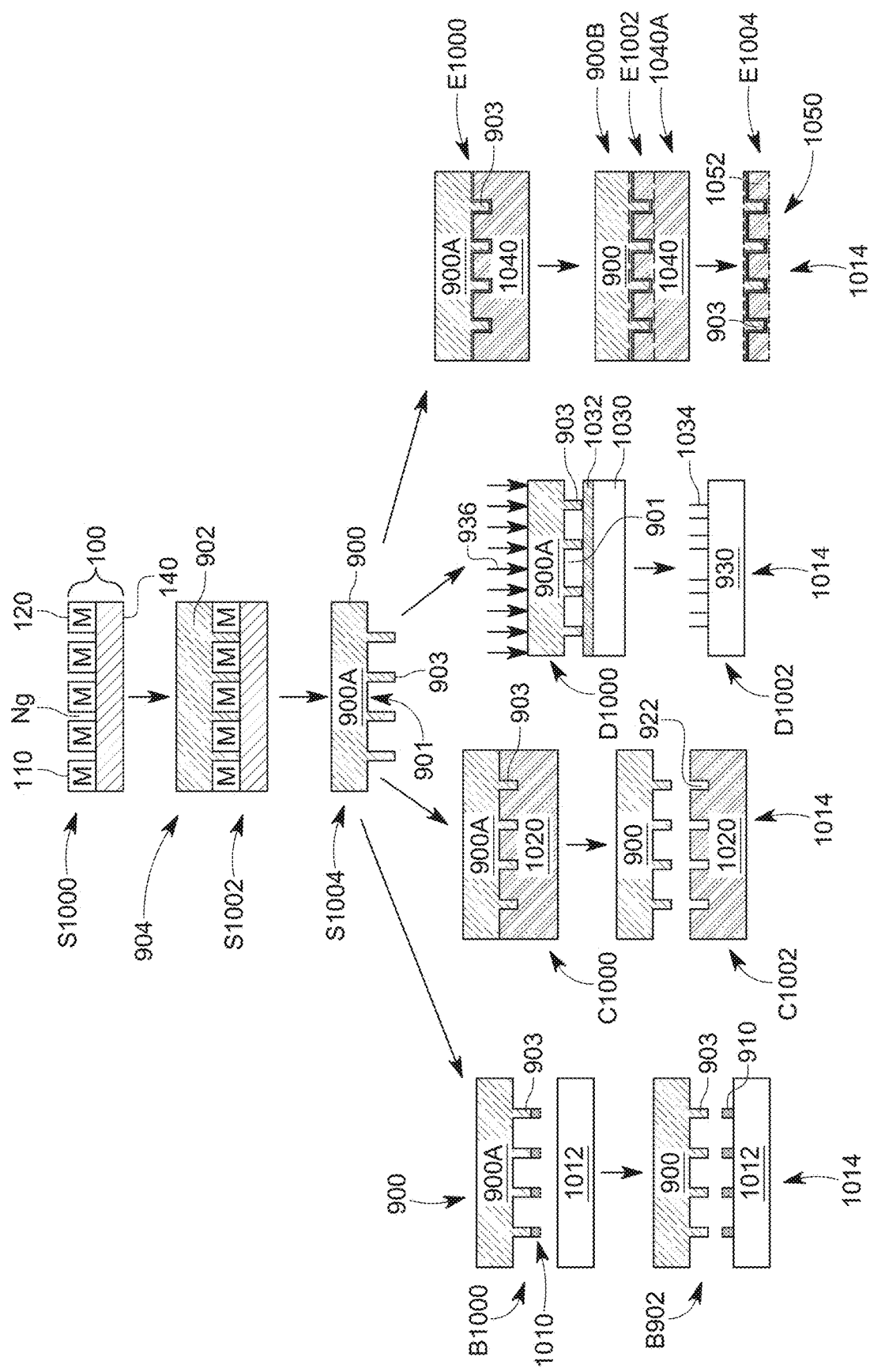
FIG. 10 illustrates a method for replicating features from a soft stamp through various soft-lithography routes.
Figure 11A:
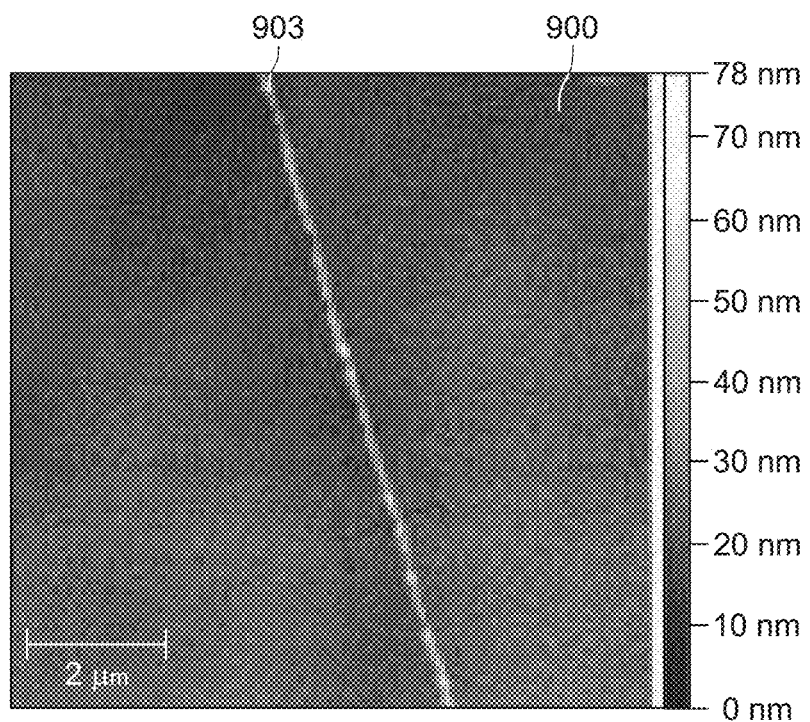
FIGS. 11A to 11F illustrate various shapes of nano-features of the soft stamp.
Figure 11B:
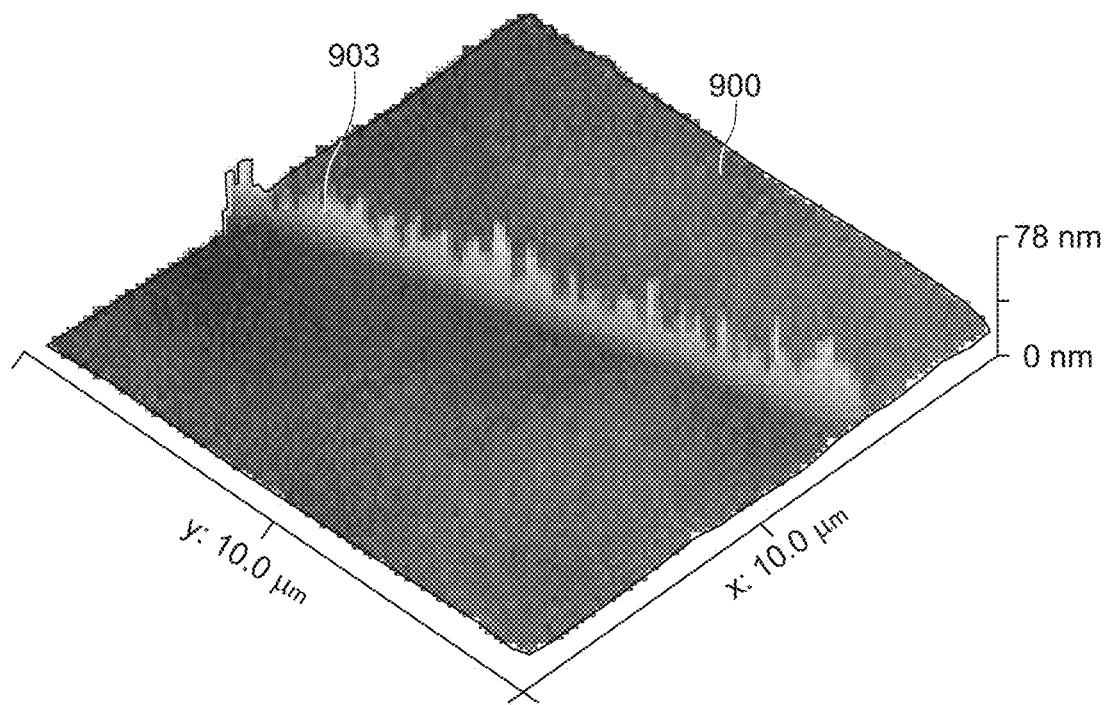
Figure 11C:
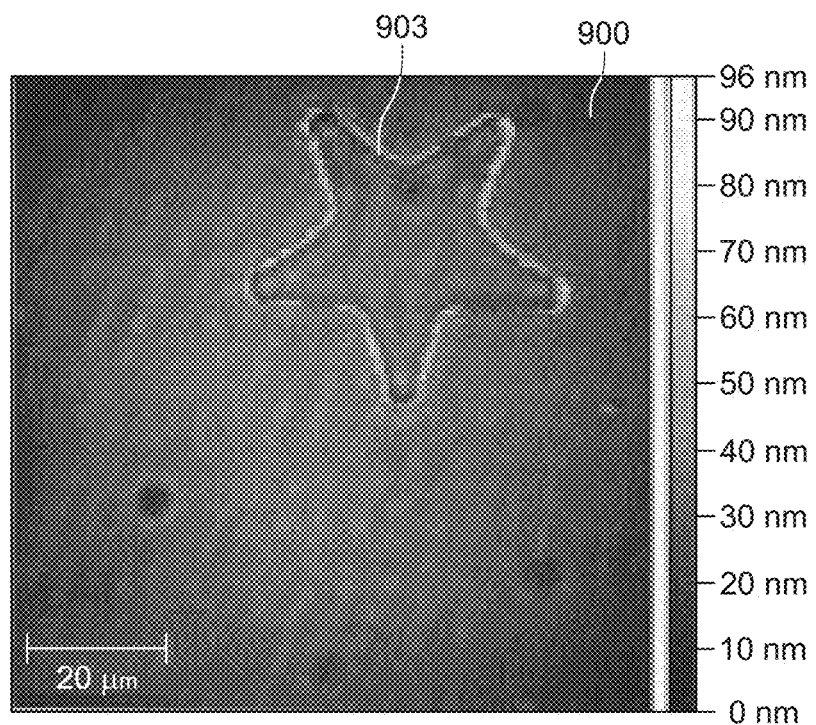
Figure 11D:
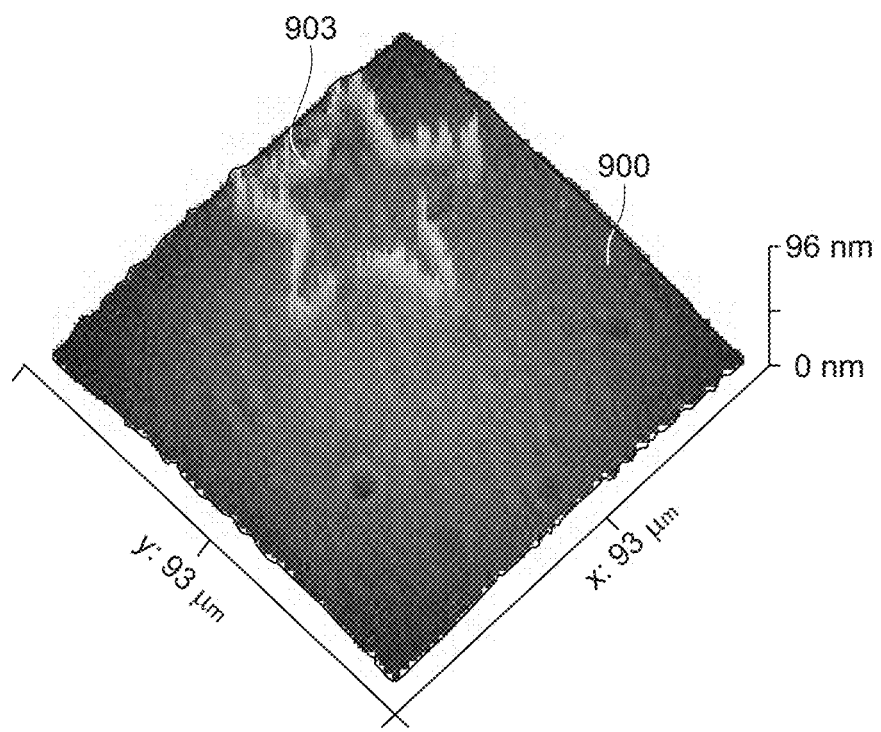
Figure 11E:
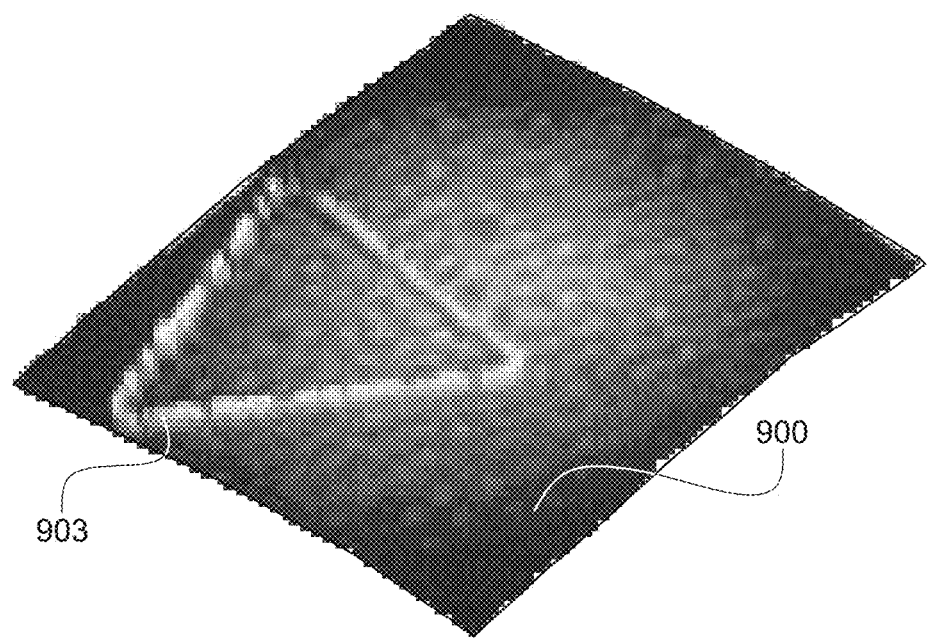
Figure 11F:
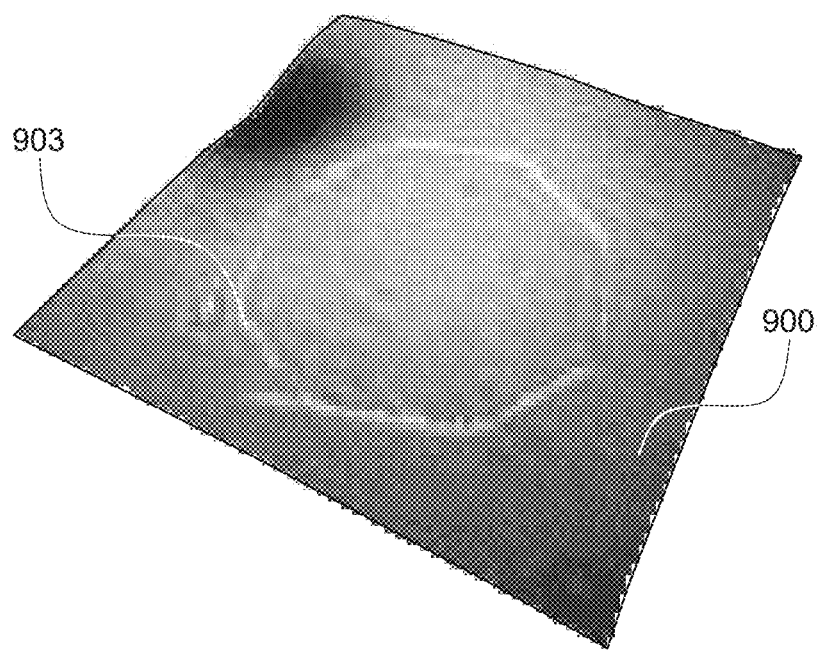

FIG. 10 illustrates a method for using the soft stamp 900 to form various devices. While FIG. 10 the formation of a semiconductor device, those skilled in the art will understand that the soft stamp 900 can be used for forming other devices. In step S1000, a substrate 140 on which plural electrodes 110 and 120 have been formed is provided. The substrate with the plural electrodes is called herein the master mould. The gap Ng between the electrodes is in the order of nm, and these electrodes and the corresponding gaps have been formed as described in the method of FIG. 2. The electrodes could be made of the same or different material and they could have the same or different shapes and/or sizes.

The master mould can be made of different materials, such as metals, metal oxides, polymers, 2D materials, dielectrics, insulators, and nitrides, etc., as an individual layer or a combination of two or more layers. For the sake of simplicity, the electrodes in the following examples are considered to include metals and/or transparent conductive oxides (e.g., indium tin oxide, ITO), and for this reason, the discussion herein refers to these electrodes as metal electrodes, although non-metal electrodes may also be used. The electrodes may be made to have a predefined thickness, ranging between 1 nm to 1 mm—or more. The electrodes may be separated laterally by a distance that can range between 1-500 nm. The lateral size of the electrodes can vary from hundreds of nanometres to meters, depending on the method of patterning employed and the particular needs of the targeted application(s).

The nano-gaps Ng between the electrodes may be patterned to have any desired shape and/or size. The nano-size features (pillars, trenches, etc.) cast and/or replicated using the nanogaps Ng of the mould 100, can be extended to any shape and/or size depending on the target application(s). Nanogap substrates can be made of rigid materials (Si, Si/SiO$_2$, glass etc.) or flexible ones (e.g., plastics), or other suitable substrate materials known to those skilled in the art. The non-/conductive nanogap electrodes can be made on any choice of substrate materials and are not limited to the above mentioned materials/combinations. If a-Lith or self-forming nanogap method (as discussed in FIG. 2) are used to create the nanogaps, then one possible limiting factor on the choice of the electrode material will be the self-assembled monolayer (SAM) used to perform the a-Lith or self-forming of nanogap. For instance, octadecyl phosphonic acid (ODPA) can be used for various metals and metal oxides whereas octadecane thiol (ODT) can be used for the noble metals like Au, Ag and Pt. In principle, however, SAMs with different functionalities could be synthesised and/or other methods for tuning the surface energy of the electrodes could be used.

In step S1002, the UV curable substance 902, for example, a UV curable resin, is poured over the electrodes 110 and 120. A UV curable resin is a class of materials that is polymerized and cured in a short time by the energy radiated from ultraviolet irradiation devices. In one application, the curable substance 902 may include a magnetic material (e.g., small particles, or nano-particles, or nano-tubes, or nano-wires). The UV curable substance is fluid enough to enter inside and fill the nano-gaps Ng, between the various electrodes 110 and 120. A UV light 904 is irradiated in step S1004 over the UV curable substance 902 to cure the resin. In step S1004, the cured resin, which is now the soft stamp 900, is peeled off from the substrate 140. The soft stamp 900 includes a planar-type base 900A on which nanogaps 901 are formed, and the nanogaps 901 correspond to the electrodes 110 and 120, i.e., the nanogaps 901 has the size of the electrodes 110/120. The soft stamp 900 also includes nano-features 903, which are also formed on the base 900A and extend away from the base, and the nano-features 903 correspond to the nano-gap Ng from the master mould 100. If a magnetic material has been added to the curable substance 902, then the formed nano-features 903 are magnetic and would respond when a magnetic field is applied to them.

The height of the replicated nano-features 903 on the base 900A of the soft stamp 900 depends on the depth of the nano-gap Ng, which in turn can be tuned by varying the thickness of the electrodes 110 and 120 employed in step S1000 to form the nano-gaps Ng. In one embodiment, the height is 50 nm or smaller. Possible shapes of the nano-gaps 901 and/or nano-features 903 formed on the base 900A of the soft mould 900 may include cylinders, triangles, squares, pillars, circles, or others arbitrary shapes desirable for the targeted applications. The targeted application depends on the application field, which may include any of optoelectronics, electronics, memory devices, solar cells, and bio-electronics/sensor applications, to name but a few. The technologies discussed with regard to FIG. 10 could also be adopted in the development of nanoimprint lithography (NIL) tools and their applications.

The soft stamp 900 can now be used in various processes for replicating it into a number of copies for making various devices. The replicating process may use any known soft lithography route, such as nano-contact printing, moulding/embossing (NIL), phase shifting edge lithography, and nanoskiving/mechanical sectioning, etc. The nano-contact printing method, as further illustrated in FIG. 10, involves a step B1000 of dipping the soft stamp 900 into a solution 1010, e.g., SAM or ink so that traces of the solution 1010 are attached to the tips of the nano-features 903. In step B1002, a substrate 1012 is brought next to the soft stamp 900, and solution 1010 is transferred from the tips of the nano-features 903 to the substrate 1012, as shown in FIG. 10. The size and shape and distances between the solution traces 1010 on the substrate 1012 mirrors the size and shape and distances between the nano-features 903 of the soft stamp 900. The substrate 1012 and the solution traces 1010 transferred onto the substrate 1012 form a new mask 1014, which may be used, for example, to manufacture an optoelectronic device, like a grating. Many other devices may be manufactured with the nano-contact printing process discussed above.

The molding/embossing process uses the soft stamp 900 to imprint in step C1000 the nano-features 903 into a curable polymer 1020, which are hardened in step C1002 by curing the polymer 1020. In the same step, the soft stamp 900 is removed, thus obtaining the nano-gaps 1022 formed into the polymer 1020, which also acts as the new mask 1014.

The phase-shifting edge lithography process also uses the soft stamp 900 to form nano-features 1034 on a substrate 1030. In this method, the soft stamp 900 is placed in step D1000 above a photo-curable layer 1032, which is formed over the substrate 1030. In one embodiment, the soft stamp 900 is placed in direct contact with the photo-curable layer 1032. Then, in the same step, light 1036 having a desired wavelength is directed to the soft stamp 900. The light passes through the soft stamp 900 and interacts with the curable layer 1032. Because of the nano-features 903 of the soft stamp 900, some regions of the curable layer 1032 receive less light while the regions correspond to the nano-gaps 901 of the soft stamp receive more light. Depending on the type of material used for the soft stamp, it is possible that the regions of the layer 1032 corresponding to the nano-gaps 901 receive more light than the regions corresponding to the nano-features 903. Either way, the regions 1034 that receive more light are removed while the other regions remain and thus, in step D1002, the remaining regions, corresponding either to the nano-gaps 901 or the nano-features 903, form the nano-features 1034 on the substrate 1030. The substrate 1030 with the nano-features 1034 forms the mask 1014.

Another process that can use the soft stamp 900 is the nanoskiving/mechanical sectioning process. Illustrated also in FIG. 10, this process starts in step E1000 in which an epoxy substrate 1040 is used to make a replica of the soft stamp 900. After the epoxy substrate 1040 is cured in step E1002 (by light or other means), top and bottom layers 900B and 1040A are identified and removed in step E1004, by mechanical sectioning, to obtain a slab 1050. The slab 1050 includes the nano-features 903 of the soft stamp 900 and the epoxy material corresponding to the nano-gaps 901, which form the epoxy nano-gaps 1052. The slab 1050 thus has nano-elements 903 and 1052 formed with two different materials. The slab 1050 can be used as the mask 1014 for making new devices.

Figure 12:
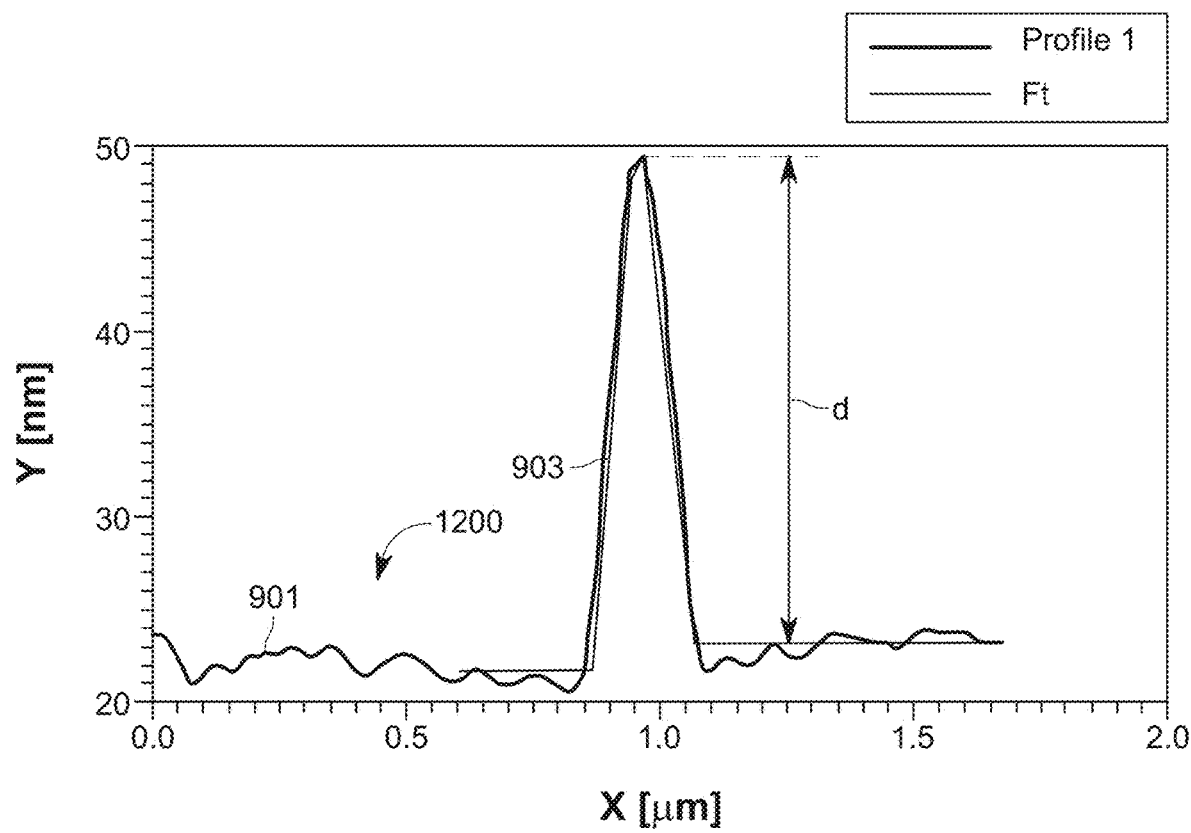
FIG. 12 illustrates a profile of a nano-feature and a nano-gap of the soft stamp.

In the process discussed above with regard to FIGS. 9A to 9D, the soft stamp 900's size is limited by the master mould's size, which in this embodiment has been chosen to be a 4" wafer. Various kinds of nanogaps and nano-features may be formed from simple geometric shapes, i.e., square, circle, stars, etc., to complex structures such as interdigitated electrodes, which are successfully formed on the soft stamp. FIGS. 11A to 11F illustrate such shapes formed on the soft stamp 900. FIG. 12 shows the profile 1200 of the soft stamp 900, indicating the thickness (in nm) of the nano-gaps 901 and of the nano-features 903. It is noted that a difference (d) of about 27 nm is present between the nanogap and the nano-feature. This advantage indicates that a-Lith/self-forming lithography method can serve as a powerful alternative method for producing the master mould(s), replicating nanoscale features (<100 nm), and that this provides a truly facile route for producing soft stamps where the nanogap substrates are made without the need of costly production processes such as electron-beam lithography, or other known specialized, but highly precise, techniques that are known to suffer by low-throughput, high-cost, and slow writing speeds.

The processes discussed above with regard to FIGS. 9 to 10D used specific substances and numbers for describing the various conditions applied to make the soft stamp. However, these substances and specific conditions are not intended to limit the invention in any way. For example, the electrode materials (conductive, semiconducting, insulating, etc.) that can be used to make the soft stamp and the nano-features on the additional substrate should be compatible with the a-Lith and/or self-forming nanogap lithography process discussed with regard to FIG. 2, or any other large-area compatible nanogap forming/patterning methods. For convenience, conductive electrodes such as Al, Cr, Au, Ti, Pt, and ITO were used by the inventors, but other materials with different physical properties can also be used. Any choice material such as metals, metal oxides, nitrides, insulators, dielectrics, and polymers that are compatible with the a-Lith and/or self-forming nanogap process can be utilized for creating the master mould 100.

In the particular example illustrated in FIGS. 10A to 10D, the inventors verified the applicability of this novel approach by using Al—Al (i.e., electrodes 110 and 120 in FIG. 10A are made of the same material) electrodes of 100 nm in thickness patterned on Borofloat glass substrate. Other substrates such as plastics have also been used to create the nanogap moulds without any difficulty, or fundamental limitation.

In addition, the choice of the nanogap/master substrate material is also a possibility for this novel approach. There is a large variety of substrate materials that can, in principle, be used depending on the particular application. While glass and Si wafers with a thermally grown oxide layers are preferred, flexible and plastic substrates can be used as well. Generally, any substrate that is compatible with the a-Lith and the self-forming nanogap process could be considered as a substrate material for creating the master mould 100.

Regarding the choice of the solidification route for the polymeric solution 902, after being poured into the master mould 100 as shown in FIG. 9B, the cross-linking of the polymer and its solidification can be achieved via thermal annealing, UV light, laser, and flashlight methods, among many others known to the experts in the field. The solidification of the soft polymers is typically achieved by photochemical (UV), or thermal (heating). In the embodiment of FIGS. 9A to 9D, the inventors employed the UV photochemical cross-linking route to fabricate the soft stamp 900 from the master mould 100. However, other polymer cross-linking methods mentioned above can also be used.

Regarding the polymeric stamp material, a desired function of the ASL layer 910 is to mitigate issues associated with strong adhesion of the soft polymer stamp 900 (following cross-linking) onto the master mould 100. Conversely, the adhesion promoter portion 924 enhances the adhesion between the soft stamp 900 and the transparent glass substrate 922, so that the peel-off step can be easily performed, without damaging the soft stamp 900. Thus, the ASL layer facilitates smooth and easy delamination of the nanoscale features from the master mould once the fabrication and treatment processes have been completed. There are many material choices available for the soft stamp, ASL, and adhesion promoters. For the embodiment illustrated in FIGS. 9A to 9D, commercially available materials purchased from the EV Group GmbH were used. However, a broad range of suitable material choices exists, and could in principle, be used during the soft stamp manufacturing process.

For instance, materials of choice for the soft polymer stamp may include elastomers known as Poly Di-Methyl Siloxane PDMS, polyurethane (PU), polyimide (PI), cross-linked Novolac resins (a phenol formaldehyde polymer), fluoro carbon modified siloxanes, Poly-Methyl-Metha-Acrylyte (PMMA), Poly ([3-Mercaptopropyl] Methyl-Siloxane), known as PMMS, poly Styrene (PS), Per-Fluoro-Poly Ether (PFPE) and epoxy resins. Moreover, inherently present/adopted SAMs on the master mould (such as ODPA on Al/Ti/Cr/ITO/metal oxides and ODT on Au/Pt/Ag) in the a-Lith and self-forming nanogap lithography methods can be an alternative choice for the ASL layer 910. The end groups of ODPA/ODT SAMs having methyl (—CH3) group pose non-reactive/hydrophobic nature, which facilitates weak adhesion between the soft polymer 902 and the master mould 100. Hence, the SAM layer used during a-Lith or self-forming method can act as the ASL layer for ease of stamp release process, as well. Similarly, for adhesion promoter glues, various types of epoxy resins can also be used, as long as they are promoting a good adhesion to the polymer surface.

The various materials and elements of the master mould and the soft stamp impact the processes discussed above. For example, the electrode quality impacts the quality of the soft stamp 900. The precise dimensions of the master mould 100 depend on the edge profile of the electrodes 110 and 120 used to form the nanogaps Ng. The parameters that influence the edge profile of the master mould and subsequently the soft stamp are the deposition rate, grain size, thickness, and etching technique (wet vs dry etching) involved in the deposition of the conductive electrodes 110 and 120 on the substrate 140. The edge profile from the nanogap substrate to the 110/120 electrodes' top surface can vary between steep and sharp transition (see FIGS. 5A and 5B and associated discussion) to a more gradual one or even an undercut, depending on the above mentioned factors. A sharp transition is desired for stamp preparation, but it is not necessary. Potentially, the shape of the nanogap Ng may offer advantages in terms of the sturdiness of the replicated nano-features due to the often wider dimension of the structure at the point of contact with the main body of the soft stamp.

The surface roughness of the electrodes 110/120 also plays a role in the quality of the soft stamp preparation and nanoscale features replication. Because the features of interest have a size below 100 nm, the surface roughness of the conductive electrodes should be kept as low as possible with an ultra-smooth surface being preferred. Since the electrodes deposited via different deposition techniques are down to achieve ultra-smooth films, it is easy to control the surface morphology of these electrodes. However, the process should be carried out precisely for solution-based electrode formation routes.

The dimension of the nanogap Ng also plays a role with regard to the soft stamp fabrication and its nano-features. The patterned electrodes can be made of similar/dissimilar material with varying thicknesses from 10-500 nm (or more), depending on the feature of interest and target application. The thickness of the electrodes 110 and 120 may also differ, giving the ability to produce stamps with tuneable mechanical properties and nano-features with improved mechanical properties/sturdiness (e.g., FIGS. 11A to 11F). The aspect ratio of the final nano-feature of interest can be manipulated by altering the thickness of the conductive electrodes 110/120. In this regard, as shown in FIGS. 11A to 11F, the nanogap dimensions and the soft stamp dimensions can also be varied allowing step-like profile features to be formed on the soft stamp.

The process parameters are known as the processing route of the soft polymer 902 (spin coating, drop-casting, etc.) and the curing route of the soft stamp (UV, thermal, LASER, and flashlight) mainly affect the soft stamp preparation. In the embodiments discussed herein, the inventors adopted the drop-casting and UV curing route for processing the soft stamp, and the factors associated with this approach, such as UV light intensity, exposure time, and annealing temperature, have an impact on the cross-linking of soft polymers. In this process, the thickness of the soft stamp 900 is controlled by adjusting the contact distance between the bottom portion 924 of the movable substrate 920 and the master mould 100. However, for a spin coating approach, the thickness of the soft stamp is controlled through parameters like spin speed, spin duration, and subsequent annealing temperature and time. The LASER and flash lamp irradiation parameters such as energy, intensity, pulse duration, and frequency of pulses influence the stamp's size and shape for LASER and flash lamp annealing routes. The precise control of these parameters achieves a soft stamp having a high aspect ratio of the nanoscale features over a large area.

While the electrode nanogaps have been formed for the master mould 100 using the a-Lith or the self-forming nanogap methods previously discussed, where the metal electrodes were patterned using standard lithography and etching/lift-off processes, other methods for forming the electrode nanogaps can be used. For example, it is possible to form the electrodes and the associated nanogaps by using other techniques, which are described in the literature as the Atomic Layer Lithography (ALL), nanomasking, electro lithography, and nanosphere-lithography. In atomic layer lithography, directional evaporation of second metal dictate the discontinuity between the first and second metal layers, which helps to selectively peel off the second layer to make sub 10 nm nanogap electrodes. In the nanomasking method, the oxidation of chromium may be utilized for the spontaneous formation of the shadow mask to fabricate the nanogap electrodes. In electro-lithography, conductive scanning probes may be used to pattern the metal films and the underneath polymer films to create features having a size down to 9 nm. However, the resolution and mass production of such devices is limited by the need and fabrication of the conducting scanning probe. In nanosphere lithography, critical features and shapes are not achievable. All these traditional techniques are either not viable for large area implementation and fast prototyping or limited to the choice of materials and substrates.

In all the methods, including the a-Lith and self-forming nanogap methods, the density of the nanogap features rely on the first layer patterning via standard lithography such as photolithography, E-beam Lithography (EBL) and Focused Ion beam lithography (FIBL). The cost and time associated with patterning the first metal remain high. However, in the embodiments discussed herein, the patterning of the first metal has been simplified by using the LASER scribing/patterning technique. LASER scribing falls under digital and additive manufacturing that allows the rapid and low-cost patterning of the first layer on any substrate.

Figure 13:
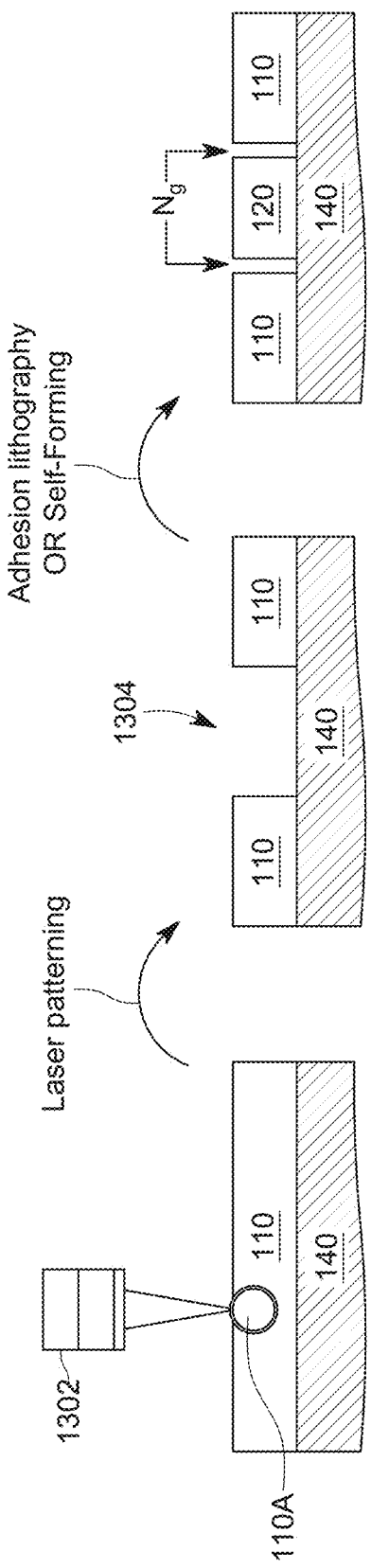
FIG. 13 illustrates an alternative process for patterning first electrodes on a substrate for forming nanogaps.

Starting from a digital design, which can easily be altered and adapted to specific layouts and purposes, a common laser cutter/scriber 1302, as shown in FIG. 13, can be used to selectively remove parts 110A of a blanket first metal layer 110 via an ablation process. The resulting patterns 1304 can then be used to form nanogap electrodes 120 via the a-Lith or self-forming process. After the successful nanogap fabrication, further laser ablation steps can be applied to remove and shape parts of the second metal 120 additionally, thus enabling more intricate device layouts. In this regard, FIG. 13 shows the addition of the second electrode 120 by adhesion lithography or self-forming, between the first electrodes 110. Nanogaps Ng are formed between the first and second electrodes during this process.

Figure 14A:
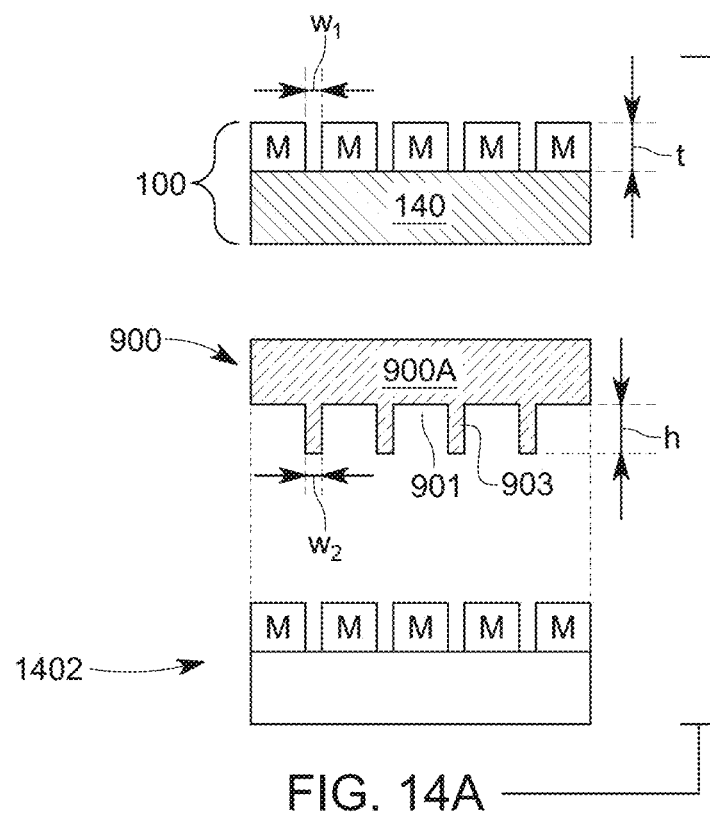
FIGS. 14A to 14C illustrate the control over nano-features aspect ratio and shapes when forming a soft stamp.

The a-Lith and self-forming nanogap methods may be used to control a thickness of the deposited electrodes 110. For example, as shown in FIG. 14A, the thickness t (or height) of all the electrodes 110 (indicated as M in the figure) may be made to be the same. FIG. 14A also shows a width w1 formed between adjacent electrodes M. The soft stamp 900 manufactured with these electrodes is further shown in FIG. 14A, including the nano-features 903 having a width w2 and a height h. The replicated nano-gaps 901 are shown formed on the base 900A, between adjacent nano-features 903, having the height h. In this embodiment, w1=w2<100 nm and t=h<50 nm. The resulting device 1402 that is formed with the soft stamp 900 is a replica of the master mould 100.

Figure 14B:
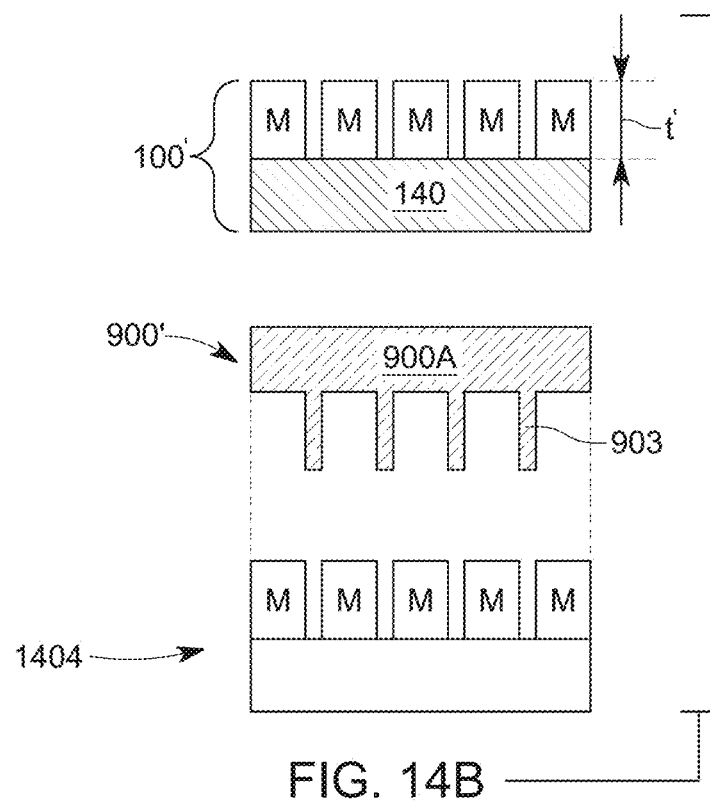

FIG. 14B shows another embodiment in which the master mould 100' has the electrodes M made with to have a higher thickness t', i.e., t'>t. In this case, the soft stamp 900' has the nano-features 903 longer than for the case shown in FIG. 14A, and the resulting replica 1404 of the master mould 100' has thicker electrodes M than the replica 1402 in FIG. 14A.

Figure 14C:
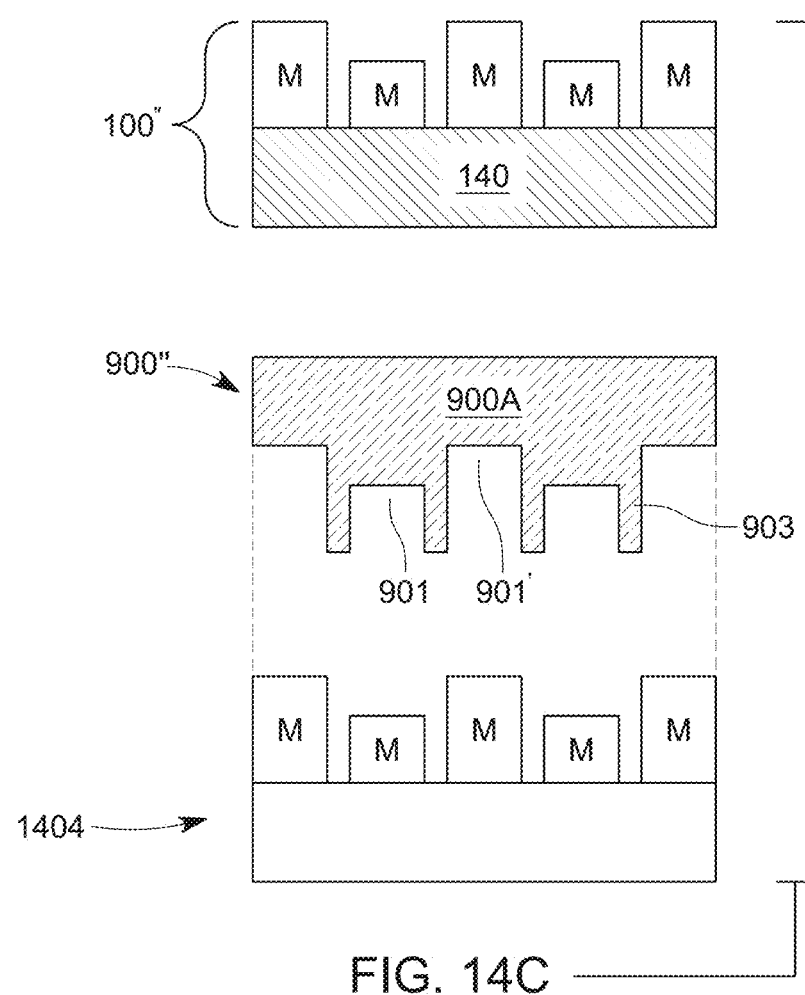

The embodiment of FIG. 14C shows that the electrodes M being made to have different thicknesses, which results in the soft stamp 900" having various height nano-features 903 and nano-gaps 901. For example, the same soft stamp 900" has gaps 901 and 901' having different depths. The replica 1404 of the master mould 100" has electrodes M having different thicknesses. The examples presented in embodiments 14A to 14C are only a couple of possible variations that can be achieved with the processes discussed above. More sophisticated electrode shapes and gaps may be formed with these processes.

Figure 15:
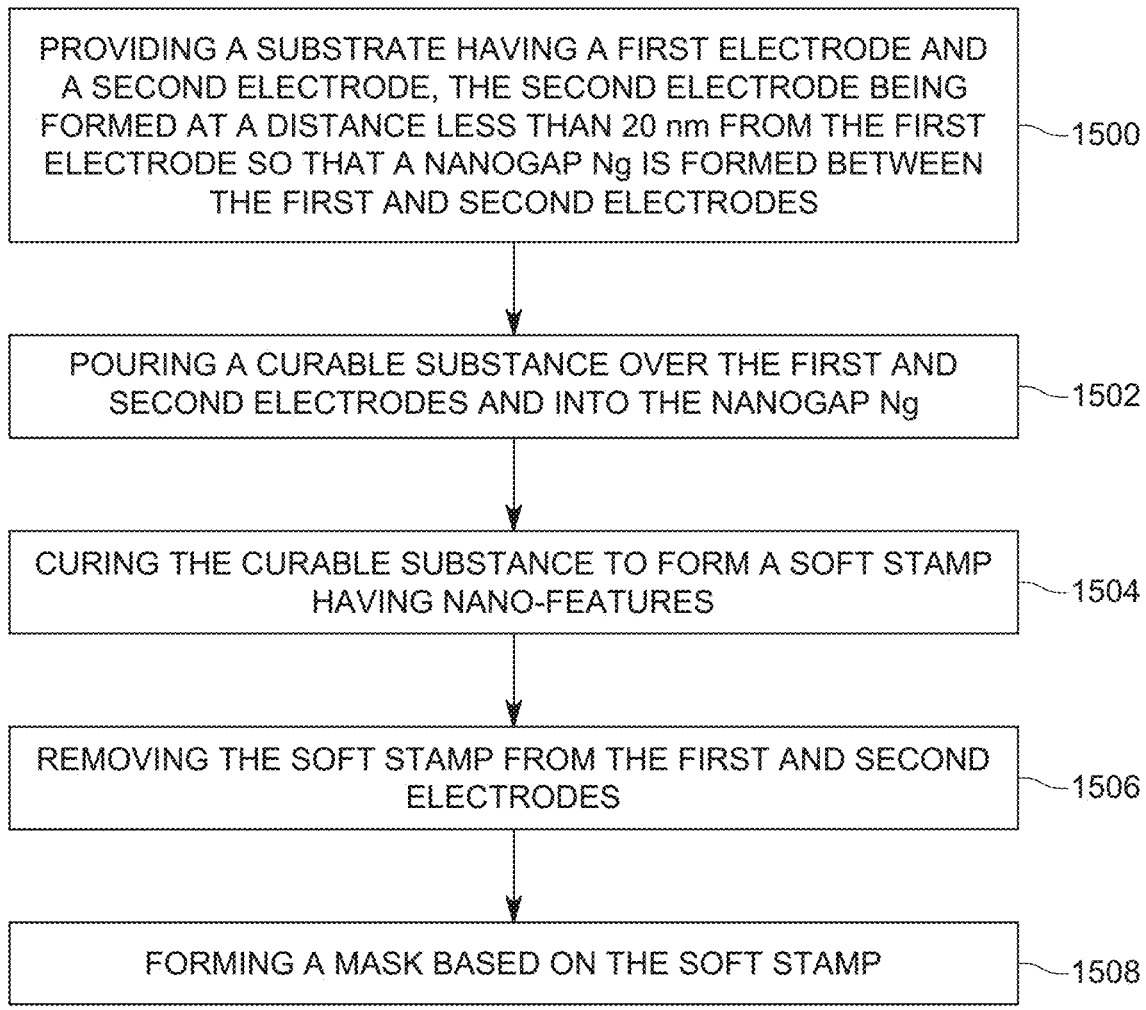
FIG. 15 is a flowchart of a method for forming a soft stamp mask.

The master mould 100 could be used, as now discussed with regard to FIG. 15, to manufacture a soft stamp to be used, for example, in the manufacturing of a semiconductor device. The method includes a step 1500 of providing a substrate 140 having a first electrode 110 and a second electrode 120, the second electrode 120 being formed at a distance less than 20 nm (or less than 100 nm) from the first electrode 110 so that a nanogap Ng is formed between the first and second electrodes 110, 120. A step 1502 of pouring a curable substance 902 over the first and second electrodes 110, 120 and into the nanogap Ng, a step 1504 of curing the curable substance 902 to form a soft stamp 900, and a step 1506 of removing the soft stamp 900 from the first and second electrodes 110, 120. The soft stamp 900 has a nano-feature 903 and a nanogap 901, having sizes less than 100 nm. In one application, the soft stamp has a base 900A from which extends the nano-feature 903. The nano-feature has a height less than 50 nm. In another application, a width of the nanogap, formed between two adjacent nano-features, is 20 nm or less.

In one embodiment, the step 1500 includes a step of patterning a first metallic layer M1 to form the first electrode 110 on the substrate 140, a step of depositing a self-assembling monolayer, SAM, layer 150 over and around the first electrode 110, a step of forming a second metallic layer M2 in contact with the SAM layer 150 and the substrate 140, and a step of touchless removing parts of the second metallic layer M2 that are formed directly above the SAM layer 150, to form the second electrode 120, and the nanogap Ng between the first electrode 110 and the second electrode 120. The method may further include a step of placing the substrate, the first electrode, the SAM layer, and the second metallic layer in a liquid and agitating either the substrate or the liquid, and a step of directing a fluid flow over the second metallic layer. In still another embodiment, the curing step may include irradiating the curable substance with ultraviolet light.

In still another embodiment, the method discussed above with regard to FIG. 15 may also include a step 1508 of forming a mask 1014 based on the soft stamp 900, where the mask 1014 is used for manufacturing the semiconductor device. The step of forming the mask may include a sub-step of dipping the soft stamp in ink and transferring the ink on an additional substrate. In another embodiment, the step of forming the mask includes dipping the nano-feature of the soft stamp into a deformable polymer, curing the polymer to form the mask, and removing the soft stamp. In yet another embodiment, the step of forming the mask includes placing the mask over a photo-curable layer, irradiating the mask with light to cure portions of the photo-curable layer, and removing the soft stamp. In another embodiment, the step of forming the mask includes dipping the nano-feature of the soft stamp into an epoxy substrate, curing the epoxy substrate to form a gap that corresponds to the nano-feature, removing a layer of the soft stamp, and removing a layer of the epoxy substrate to form the mask.

Figure 16:
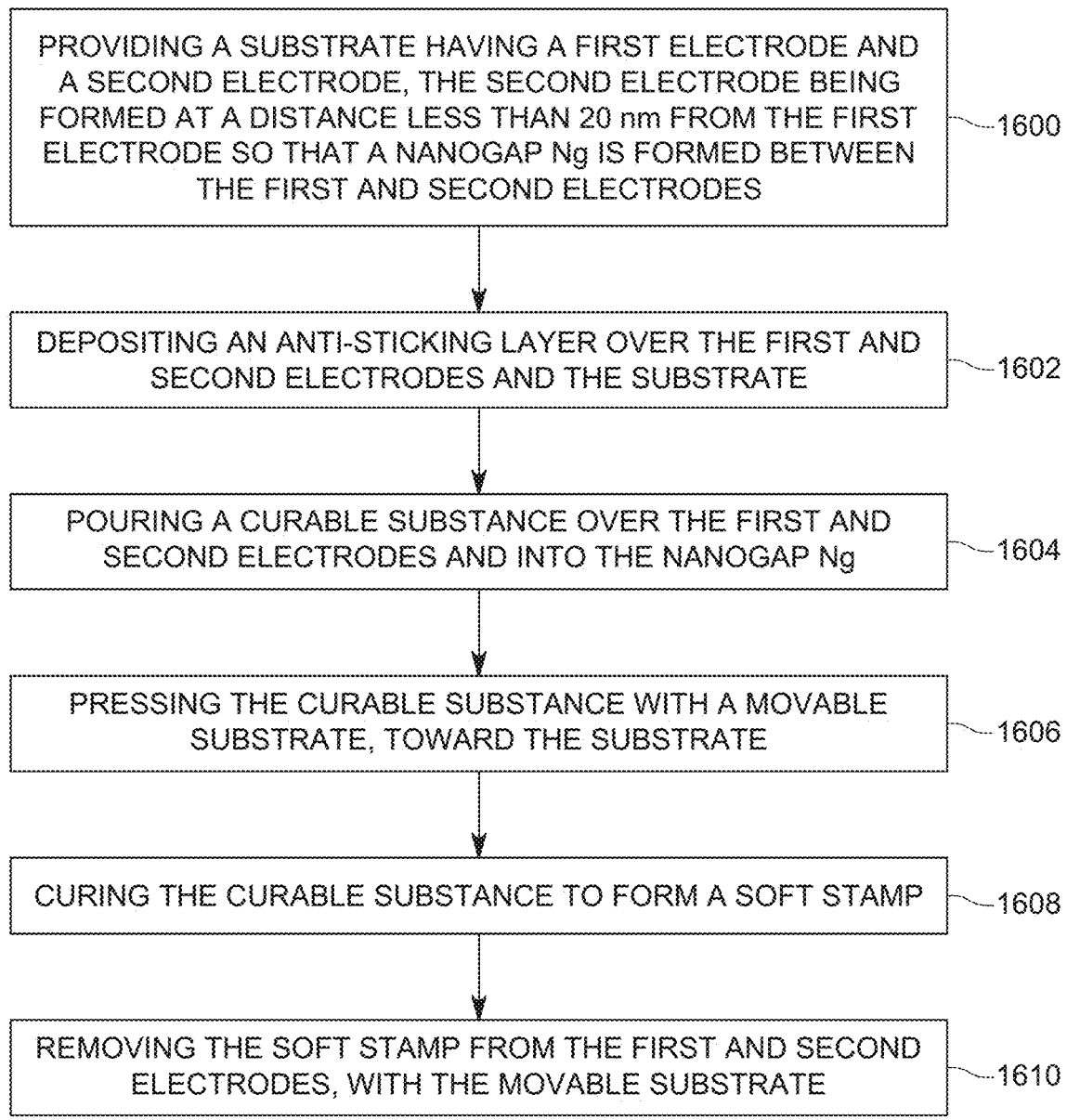
FIG. 16 is a flowchart of a method for forming a soft stamp.

In yet another embodiment, which is illustrated in FIG. 16, the method for manufacturing a soft stamp to be used in the manufacturing of a semiconductor device. The method includes a step 1600 of providing a substrate 140 having a first electrode 110 and a second electrode 120, the second electrode 120 being formed at a distance less than 20 nm from the first electrode 110 so that a nanogap Ng is formed between the first and second electrodes 110, 120, a step 1602 of depositing an anti-sticking layer 910 over the first and second electrodes 110, 120 and the substrate 140, a step 1604 of pouring a curable substance 902 over the first and second electrodes 110, 120 and into the nanogap Ng, a step 1606 of pressing the curable substance 902 with a movable substrate 920, toward the substrate 140, a step 1608 of curing the curable substance 902 to form a soft stamp 900, and a step 1610 of removing the soft stamp 900 from the first and second electrodes 110, 120, with the movable substrate 920.

Figure 17A:
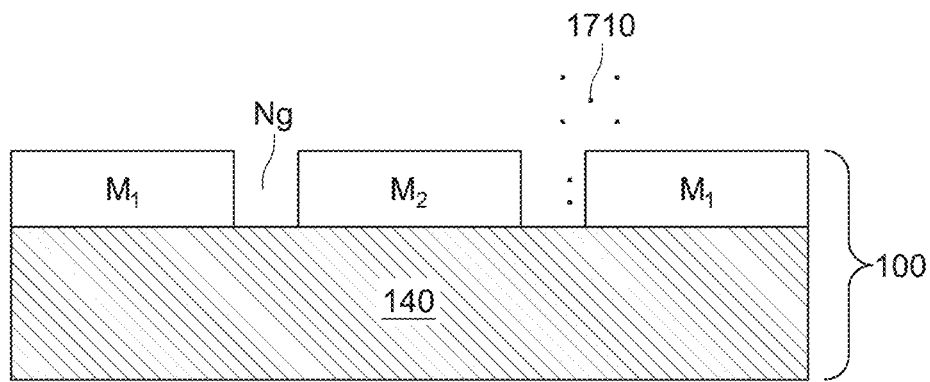
Figure 17B:
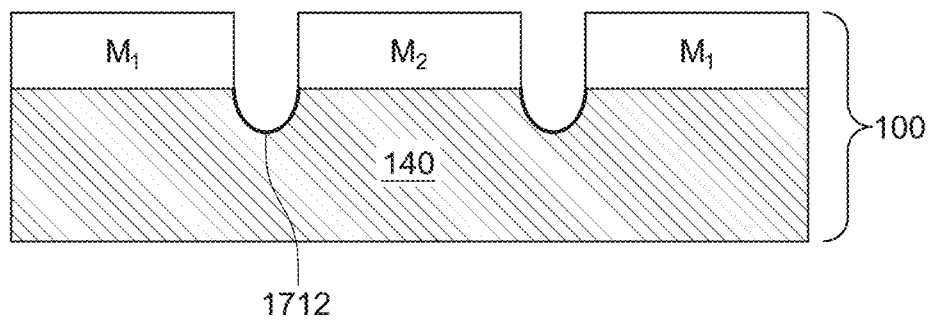
Figure 17C:
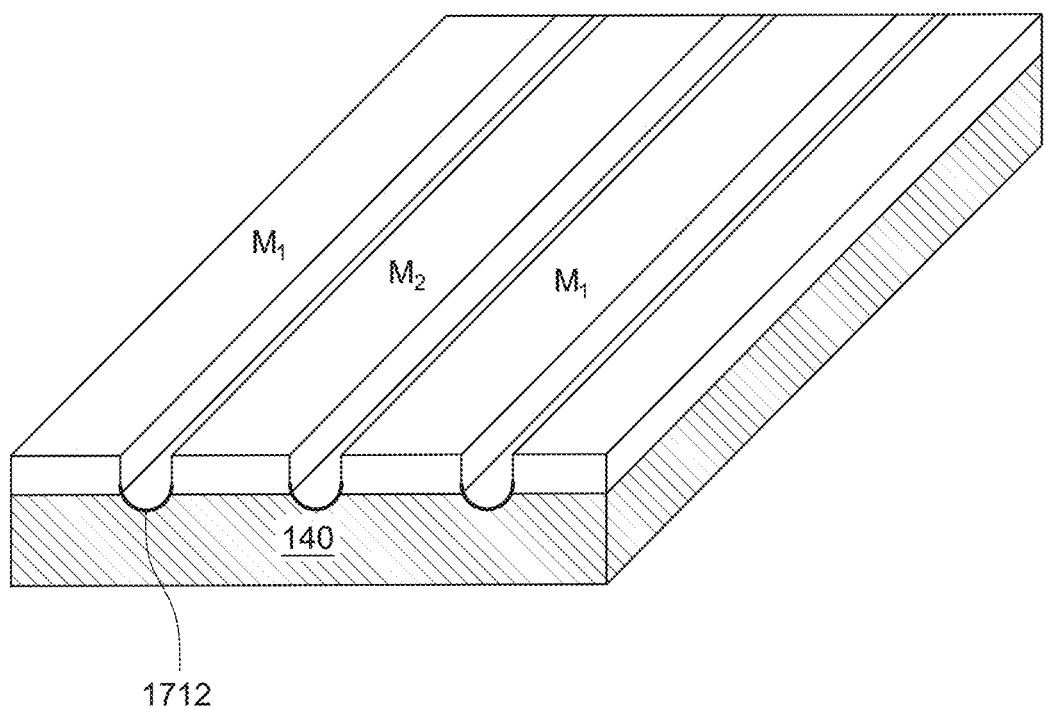

The master mould 100 obtained with the a-Lith or self-forming nanogaps methods discussed herein may also be used as a mask in a dry or wet-etching process. As indicated in FIGS. 17A to 17C, the nanogaps Ng formed between the electrodes M1 and M2 (or 110 and 120) in the master mould 100 may be used to allow an etchant 1710 for performing dry or wet etching into the substrate 140. Note that the etchant 1710 enters through the nanogap Ng and reaches the underneath substrate 140 (e.g., Si/SiO$_2$ or glass, or an interlayer) while the electrodes M1 and M2 prevent the etchant from reaching the portions of the substrate beneath them. Thus, only the etchants 1710 going through the nanogap (see FIG. 17A), which acts as the nm-size aperture, or mask, can react with the substrate underneath and etch it to form trenches 1712, as illustrated in the cross-section view of FIG. 17B and the side view of FIG. 17C. In other words, the electrodes M1 and M2 act as the mask for etching the substrate (or material, such as an interlayer) beneath. Once the etching is completed, the M1 and M2 electrodes can be removed (etched) using an orthogonal (to the substrate) chemical route. This process enables the formation of nanoscale trenches 1712, holes, and vias directly on the substrate 140. This approach could be used to replicate higher aspect ratio nanoscale features directly into the substrate via the aforementioned soft stamp method. The interlayers, deposited between the substrate and the metal electrodes, can be used to control the depth of the formed nanogaps/etched features, hence further expanding the possible uses of the approaches discussed above.

Figure 17D:
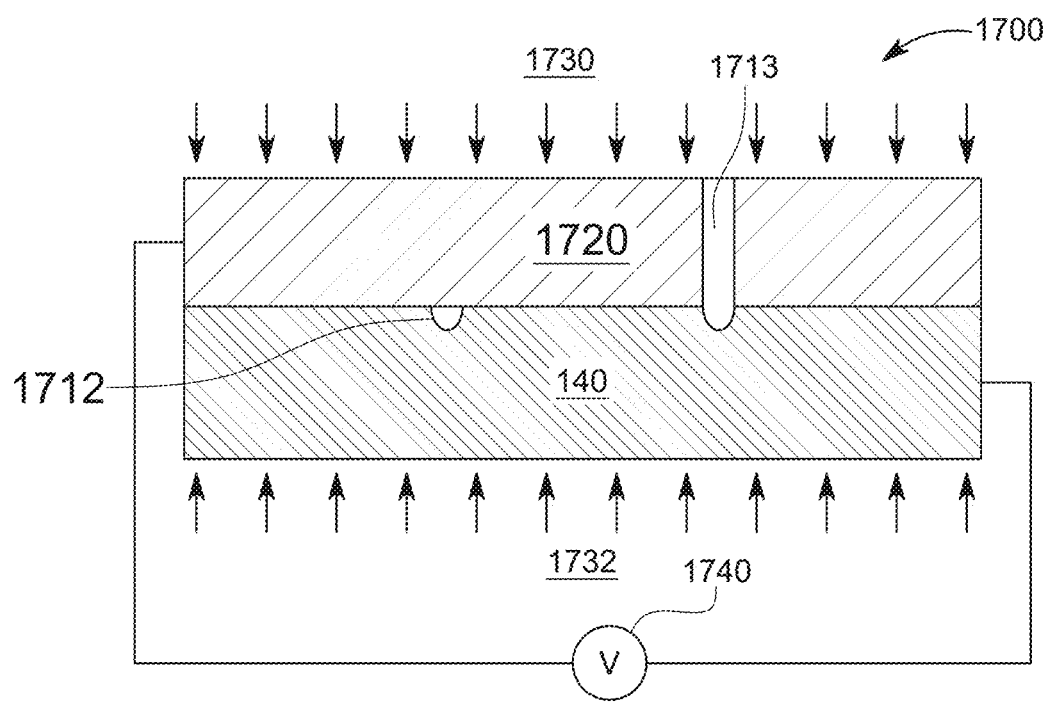
FIGS. 17D to 17F illustrate methods for forming closed nano-channels by using first and second substrates that sandwich the nano-channels.

In the embodiment illustrated in FIG. 17D, a second substrate 1720 may be added on top of the nanoscale trenches 1712, to seal them from the ambient. In this case, the nanoscale trenches become nanoscale tunnels or channels. A tunnel or channel is understood herein to mean that only its opposite end are open to the ambient and all other sides are closed. A tunnel or channel may also have inlets or outlets 1713, that extend through one of the two substrates, as also shown in the figure. For this embodiment, the M1 and M2 electrodes may be removed from the first substrate 140, after the trenches 1712 were formed, and then the second substrate 1720 is placed directly on top the first substrate 140, directly facing the trenches 1712. The second substrate may be made of glass or Si substrate, or other materials. External pressure 1730 and/or heating 1732 may be applied to the device to bond the second substrate to the first substrate. If a power source 1740 is applied between the two substrates, an anodic bonding may be achieved between them. In one application, a glue type material may be placed between the two substrates to achieve the bonding.

Figure 17E:
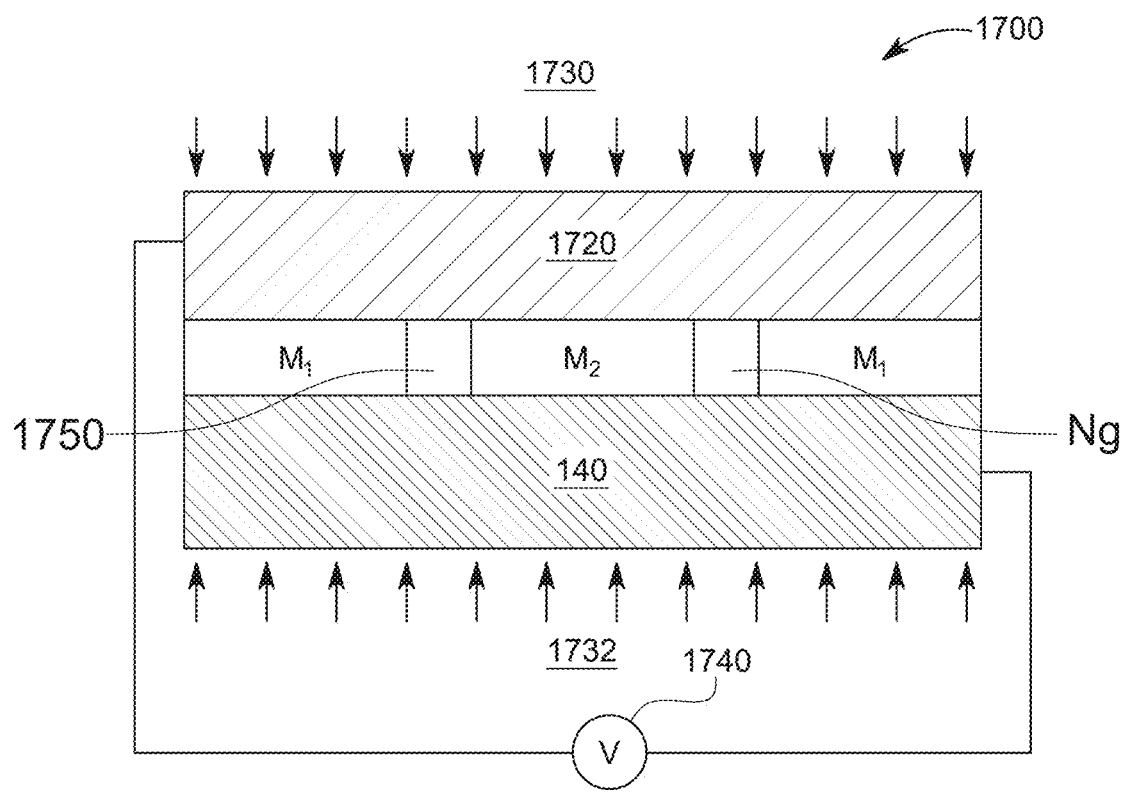

In a different embodiment, as illustrated in FIG. 17E, the second substrate 1720 is formed on top of the M1, M2 electrodes, without making any trenches 1712 in the top surface of the first substrate 140. In this case, the nanogaps Ng become the nano-fluidic channels 1750. The same bonding methods as for the embodiment illustrated in FIG. 17D may be used herein for attaching the second substrate to the metal electrodes, i.e., anodic bonding (for example, if the second substrate is made of borosilicate glass) using pressure and/or heat, or any equivalent method.

Figure 17F:
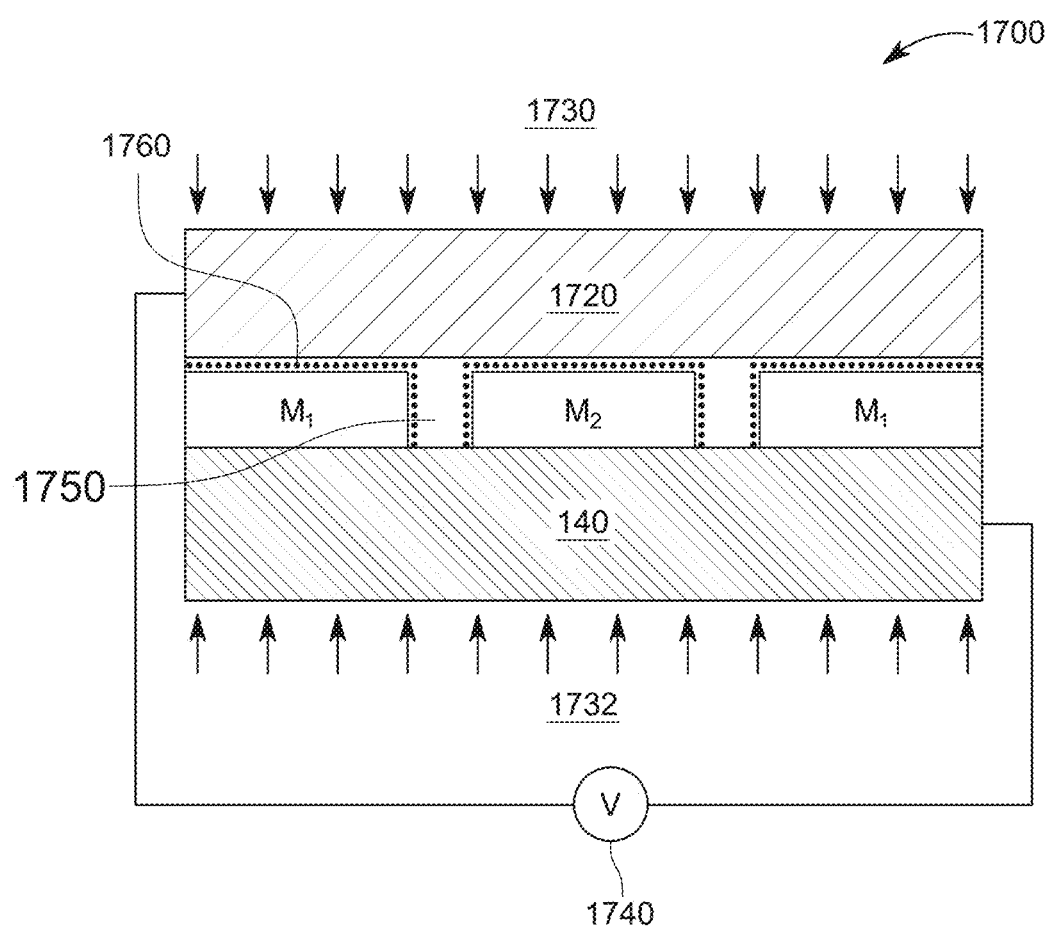

In still a further embodiment, as illustrated in FIG. 17F, a bonding promoter layer 1760 can be placed between the metal electrodes and the second substrate. In one application, the bonding promoter layer 1760 is applied to one or more of the metal electrodes M1 and M2, and then the second substrate is added on top of the metal electrodes. For each of the embodiments of FIGS. 17D to 17F, the nanogaps Ng can be made with any of the methods discussed herein. Any number of nano-fluidic channels 1750 may be formed in any given device 1700. The length of the nano-fluidic channels 1750 may be larger than 1 mm or 1 cm, up to 10 m, as the method for forming the nanogaps can be applied to any length of the metal electrodes. Because the nanogaps Ng have a size between 1 and 100 nm, with a preferred size of 20 nm, the closed nano-fluidic channels 1750 have a width between 1 and 100 nm and a length from 1 mm to 10 m. The term "closed" is used herein to indicate that the nano-fluidic channel is completed bounded by the first and second substrates 140 and 1720, and the metal electrodes M1 and M2, for a given cross-section of the channel 1750. The term "closed" does not exclude that the ends of the channel 1750 are open, or that one or more inlets or outlets are formed along the channel, and they can fluidly communicate with the environment or any desired device.

Figure 18A:
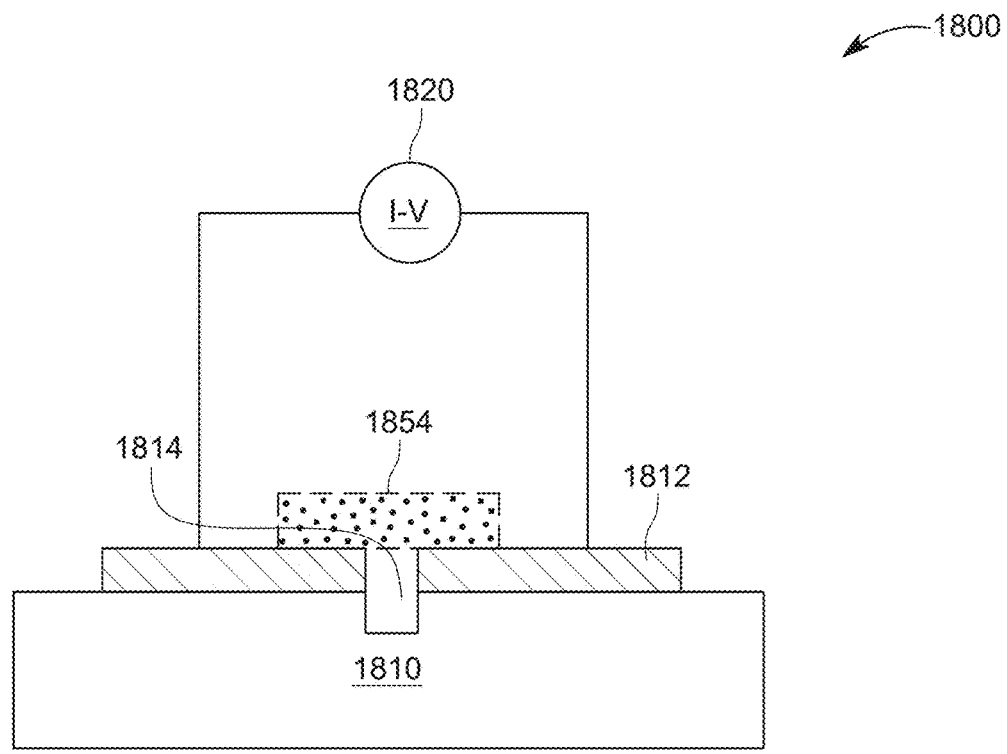
FIGS. 18A and 18B illustrate a nano-fluidic device formed by etching a channel between two electrodes separated by a nano-gap.
Figure 18B:
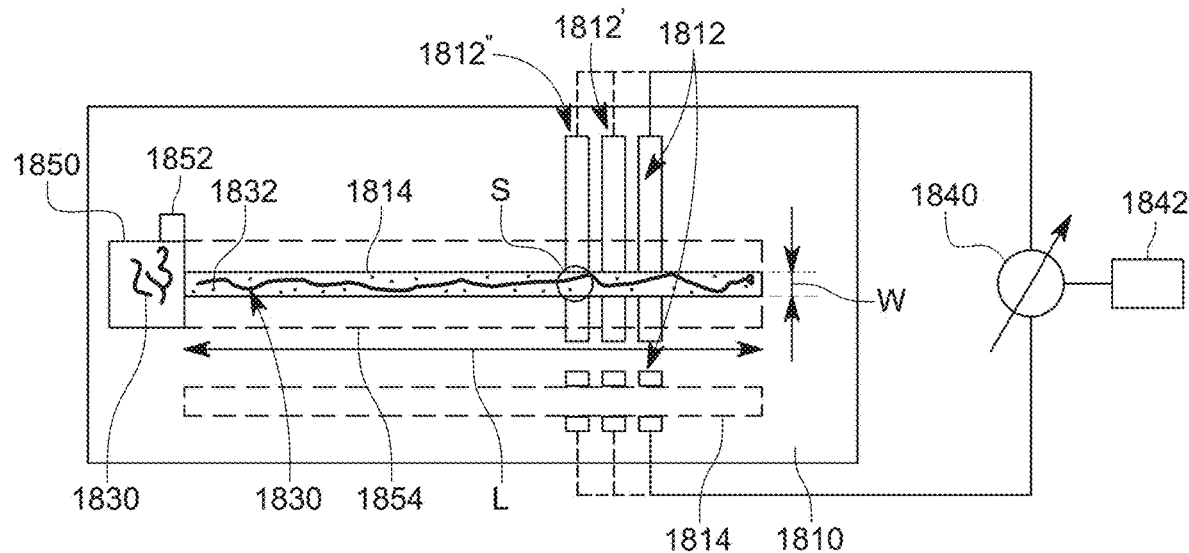

The methods discussed above could be applied for the fabrication of ultra-high aspect ratio nano-fluidic (nf) channels, as illustrated in the embodiment shown in FIGS. 18A and 18B. FIG. 18A shows a cross-section of a nano-fluidic device 1800, while FIG. 18B shows a top view of the same device. The channel 1814 has been formed in the substrate 1810 with the dry or wet etching method discussed with regard to FIGS. 17A to 17C, or with any of the methods discussed with regard to FIGS. 17D to 17F, where the electrodes in 1812 have been deposited using the a-Lith or the self-forming nanogap methods. FIG. 18B shows that it is possible to have plural pairs of electrodes 1812 formed along the channel 1814. Such channels could be used for numerous applications in optics, electronics, materials science, chemistry, biology, biochemistry, genetics, and many other fields. In the area of biology/genetics, such as nanoscale trenches/channels 1814 could emulate nanopore DNA sequencing technologies and their application in biosciences and genetics. In this regard, note that the channel 1814 may have a length L between 50 nm and up to 1 m or more, while the width W of the trench is less than 100 nm, or less than 20 nm, or less than 10 nm. In one embodiment, a depth of the channel 1814 is less than 100 nm, or less than 20 nm or less than 10 nm.

If the nanofluidic device 1800 is used in the field of biopolymer (e.g., DNA) sequencing, with the above-discussed methods would be easy to apply an industrial fabrication process of a large number of lateral nm-size channels (trenches) and the incorporation of planar electrodes by using the soft stamps produced by the nanogap method. The nanofluidic device 1800 would enable the measurement of the tunnelling currents during the passage of a single DNA strand 1830 through the channel 1814, a process dictated by the low dimensionality of the nanofluidic channel and the electrolyte 1832 and the biasing conditions applied at the electrodes 1812. The nano-fluidic system resembles a nanopore system, which contains an electrolytic solution and which applies a constant electric field when the DNA strand is passing through the nanopore. The magnitude of the electric current density across the nanopore surface S depends on the nanopore's dimensions and the composition of DNA or RNA that is crossing the nanopore. Thus, by having a sensing device 1840 electrically connected to the electrodes 1812, as shown in FIG. 18B, it is possible to sequence the DNA 1832 by identifying the changes in electric current density across the nanopore surface S. As the strand 1830 moves through the nanofluidic channel 1814, one base at a time, the current recorded by the sensing device

1840 is associated with a particular base, which a computing device 1842 associated with the sensing device can identify based on an existing library of bases and their corresponding currents when passing between the electrodes 1812, through the channel 1814.

In the case of the coplanar nano-channel pores shown in FIG. 18B, the electrical current (other electrical quantities, for example, voltage, may also be used) between different pairs of electrodes 1812, 1812', and 1812", which are separated by a few nm from each other by the nano-trench 1814, due to the flowing of the DNA along the channel, can be sensed. In this way, the current (or other electrical quantity) is measured at multiple places along the nanofluidic channel making such measurements more accurate than the traditional single nanopore technologies. In one application, the plural currents are averaged. In one application, the plural currents are compared to each other, and/or are correlated with each other. Various processing methods may be applied for sequencing the biomaterial that is passing between the electrodes.

Further, the nanofluidic device 1800 may be inclined so that the DNA strands 1830 flow from one end to the other end of the channel 1814 due to gravity and/or potential difference. In an alternative embodiment, a supply system 1850 may be located at one end of the channel 1814 and in fluid communication with the channel so that the DNA 1830 is continuously supplied to the channel. A pump 1852 may be fluidly connected to the supply system 1850 to force the DNA along the channel. In this case, a top of the channel may be sealed with a layer of material 1854, which is illustrated in FIGS. 18A and 18B with a dashed line to indicate that this layer is optional. The cover layer 1854 may be made from the same material as the substrate 1810, to prevent the DNA from 1830 to spill out of the channel 1814. The cover layer 1854 may be added to close the channel 1814 either after the channel has been formed with the dry/wet etching process discussed above with regard to FIGS. 17A to 17C or from a method illustrated in FIG. 17D to 17F. In one variation of this embodiment, it is possible to make plural parallel channels 1814 into the same substrate 1810, and thus, to supply the DNA material simultaneously in all these channels, and also to measure the electrical currents between the electrodes, through the DNA, simultaneously in all the parallel channels 1814, to increase the sequencing speed.

Figure 19:
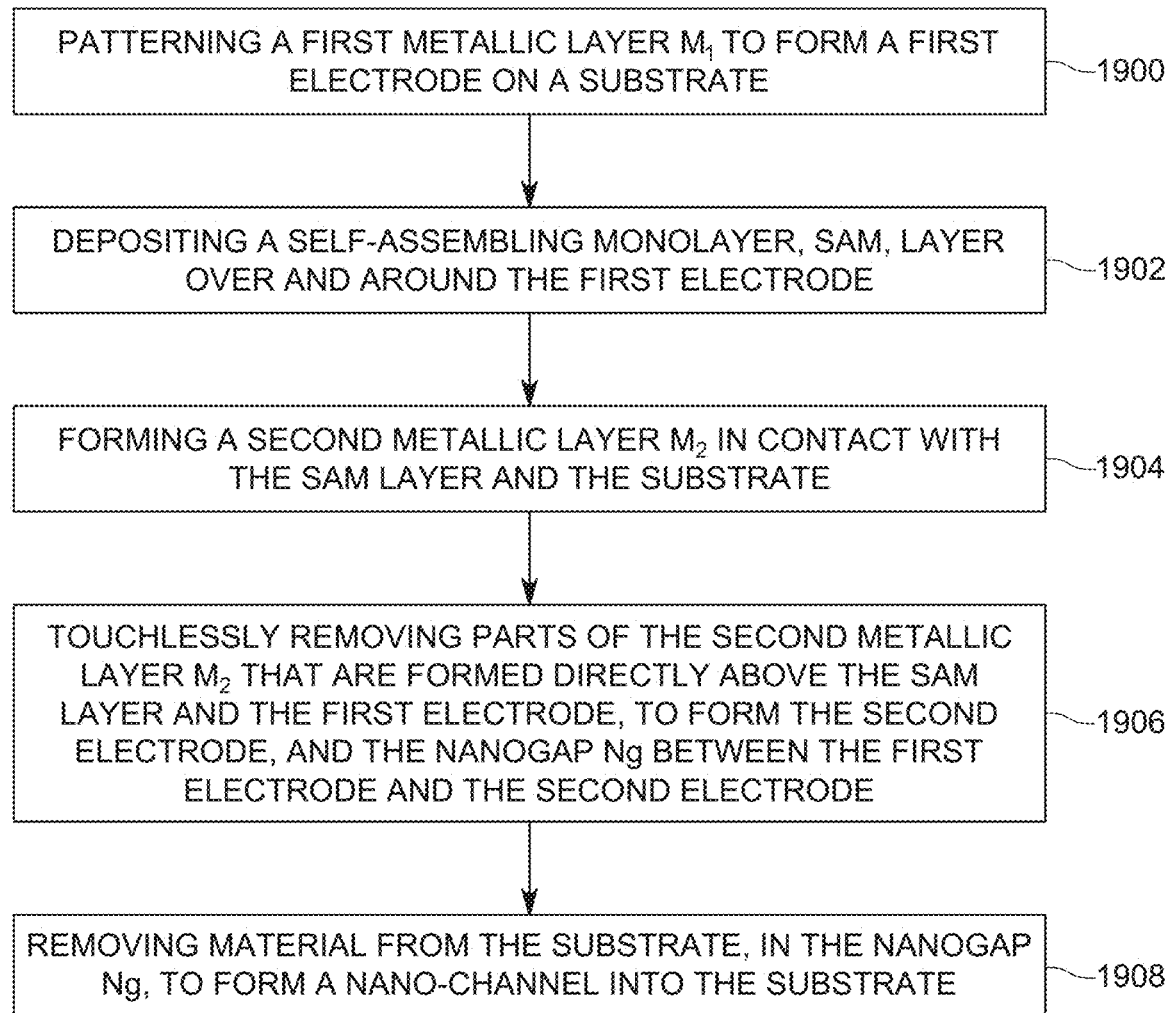
FIG. 19 is a flowchart of a method for forming a nano-fluidic device.

A method for making a nanofluidic device 1800 for biological material sequencing is now discussed with regard to FIG. 19. The method includes a step 1900 of patterning a first metallic layer (M1) to form a first electrode 110 on a substrate 140, a step 1902 of depositing a self-assembling monolayer, SAM, layer 150 over and around the first electrode 110, a step 1904 of forming a second metallic layer (M2) in contact with the SAM layer 150 and the substrate 140, a step 1906 of touchless removing parts of the second metallic layer (M2) that are formed directly above the SAM layer 150 and the first electrode 110, to form the second electrode 120, and the nanogap Ng between the first electrode 110 and the second electrode 120, and a step 1908 of removing material from the substrate 140, in the nanogap Ng, to form a nano-channel 1814 into the substrate 140, where the nano-channel 1814 is configured to receive a biological material 1830 for sequencing.

The method may further include supplying the biological material to the nano-channel, and/or sensing a first electrical quantity (e.g., voltage or current) associated with a base of the biological material when passing the first and second electrodes, and/or identifying the base based on the measured first electrical quantity. In one application, the nano-channel has a length larger than 1 m and a depth and a width less than 20 nm. The method may further include forming third and fourth electrodes across the nano-channel, which are configured to sense a second electrical quantity associated with the base of the biological material sequencing, and/or averaging or comparing or cross-correlating the first and second electrical quantities, and/or forming an additional nano-channel, extending in parallel to the channel on the surface of the substrate. In one application, the step of removing includes dry etching the substrate inside the nanogap.

The embodiments discussed with regard to FIGS. 17A to 19 may be summarized as follows using dedicated numbered paragraphs:

1. A nano-fluidic device (1800) for biological material sequencing, and the nano-fluidic device includes a substrate (1810); a nano-channel (1814) extending along a surface of the substrate (1810); and a first pair of electrodes (1812) formed to sandwich the nano-channel (1814), wherein the nano-channel (1814) has a depth and width less than 100 nm, and wherein the first pair of electrodes (1812) are configured to sense a first electrical quantity, which is related to a base of a biological material (1830) when passing between the first pair of electrodes (1812).
2. The device of paragraph 1, wherein the channel has a length up to 1 m.
3. The device of paragraph 1, further comprising:
   a second pair of electrodes that are configured to sense a second electrical quantity associated with the base of the biological material.
4. The device of paragraph 3, further comprising:
   a sensing device configured to receive the first and second electrical quantities.
5. The device of paragraph 1, further comprising:
   a supply system that releases the biological material at a first end of the nano-channel.
6. The device of paragraph 5, further comprising:
   an additional nano-channel, extending in parallel to the channel on the surface of the substrate.
7. The device of paragraph 1, further comprising:
   another substrate (1720) formed either directly on the first substrate (140), or directly on the first pair of electrodes (M1, M2), such that the nano-channel (1750/1814) is sandwiched between the first and second substrates.
8. The device of paragraph 7, wherein the nano-channel is formed above the first substrate.
9. A method for making a nano-fluidic device (1800) for biological material sequencing, the method comprising:
   patterning (1900) a first metallic layer (M1) to form a first electrode (110) on a substrate (140);
   depositing (1902) a self-assembling monolayer, SAM, layer (150) over and around the first electrode (110);
   forming (1904) a second metallic layer (M2) in contact with the SAM layer (150) and the substrate (140);
   touchless removing (1906) parts of the second metallic layer (M2) that are formed directly above the SAM layer (150) and the first electrode (110), to form the second electrode (120), and the nanogap Ng between the first electrode (110) and the second electrode (120); and
   removing (1908) material from the substrate (140), in the nanogap Ng, to form a nano-channel (1814) into the substrate (140), wherein the nano-channel (1814) is configured to receive a biological material (1830) for sequencing.
10. The method of paragraph 9, further comprising:
supplying the biological material to the nano-channel.
11. The method of paragraph 10, further comprising:
sensing a first voltage or current associated with a base of the biological material when passing the first and second electrodes.
12. The method of paragraph 11, further comprising:
identifying the base based on the measured first voltage or current.
13. The method of paragraph 9, wherein the nano-channel has a length larger than 1 m.
14. The method of paragraph 13, wherein the nano-channel has a depth and a width less than 20 nm.
15. The method of paragraph 11, further comprising:
forming third and fourth electrodes across the nano-channel, which are configured to sense a second voltage associated with the base of the biological material sequencing.
16. The method of paragraph 9, further comprising:
forming a second substrate directly over the first substrate, or directly over the first pair of electrodes, to sandwich the nano-channel between the first and second substrate.
17. The method of paragraph 9, further comprising:
forming an additional nano-channel, extending in parallel to the channel on the surface of the substrate.
18. The method of paragraph 9, wherein the step of removing comprises:
dry or wet etching the substrate corresponding to the nanogap.
19. A method for making a nano-channel in a substrate, the method comprising:
patterning (1900) a first metallic layer (M1) to form a first electrode (110) on a substrate (140);
depositing (1902) a self-assembling monolayer, SAM, layer (150) over and around the first electrode (110);
forming (1904) a second metallic layer (M2) in contact with the SAM layer (150) and the substrate (140);
touchless removing (1906) parts of the second metallic layer (M2) that are formed directly above the SAM layer (150) and the first electrode (110), to form the second electrode (120), and the nanogap Ng between the first electrode (110) and the second electrode (120); and
removing (1908) material from the substrate (140), in the nanogap Ng, to form the nano-channel (1814) into a surface of the substrate (140).
20. The method of paragraph 19, further comprising:
removing the first and second electrodes.
21. The method of paragraph 20, further comprising:
forming a second substrate over the first substrate to sandwich the nano-channel between the first and second substrates.
22. The method of paragraph 19, wherein the nano-channel is over 1 m long and a depth and width is less than 20 nm.
23. The method of paragraph 17, further comprising:
forming a second substrate over the first and second metallic layers to sandwich the nano-channel between the first and second substrates.

The various technologies discussed above are now contrasted to the existing technologies. In the last decade, nano-electronics, optoelectronics, and bio-electronics received significant attention based on their enhanced properties and improved fabrication tools. Considering the fabrication of devices in these fields requires functional structures with arbitrary patterns of maximum dimensions ≤100 nm, commercial methods such as photolithography, E-Beam Lithography (EBL), and Ion-Beam Lithography (FIBL) have the potential to fabricate these nanoscale patterns. However, many factors limit the usage of these techniques for the mass manufacturing process, in addition to the compatibility issues for patterning on non-planar surfaces and arbitrary substrates.

Advancing the feature size below 100 nm needs to overcome a few technological barriers. For instance, the diffraction of light limits the minimum achievable resolution or feature size in conventional photolithography. Several approaches such as Deep/Extreme UV light source and immersion lithography allow the industry to mitigate these issues in reaching the feature size beyond 50 nm. Yet, they still need added high-resolution lens/optics systems and a way to integrate the water/other liquid as a medium to increase the numerical aperture respectively. On the other hand, EBL and FIBL offer excellent downscaling. Nevertheless, capital cost and production time ultimately increases for these methods and thus, limit their capability for large-area manufacturing.

There is a necessity to identify alternative, viable and low cost techniques, some of which include non-conventional lithography techniques that are grouped into soft lithography known as micro-contact printing, moulding/embossing, scanning probe lithography (SPL), nano-skiving and edge lithography developed by several researchers in past two decades. Some of these techniques (such as SPL and nano-skiving) are not suitable for large area manufacturing while the rest of them rely on the master fabrication, which is typically made by EBL or FIBL, which are in turn slow and very expensive. All the soft lithography techniques use a soft stamp, which replicates the features of the stamp/master mould. Master moulds are typically made by EBL/FIBL, which dictate the minimum attainable resolution in all these non-conventional lithography methods. In addition to that, master fabrication via EBL and FIBL has many technological drawbacks, such as limited materials/substrate that are suitable for that method, they are time consuming, are slow processes, require costly equipment, and require skilled human resources in a clean room facility.

To address these challenges, the a-lithography and self-forming nanogap lithography methods based approach (also those relying on other large-area compatible and known nanogap formation techniques) facilitate and radically pave a new way for fabricating the master mould and soft stamp on a large scale with a low capital cost. The a-Lith and the self-forming nanogap lithography methods discussed herein both use SAMs to modify the surface functionality (hydro/philic or phobic) of one metal electrode specifically by selective deposition on top of a patterned first metal (M1) while leaving the substrate intact, which is followed by deposition of a second metal (M2, can be similar/dissimilar metal as M1).

Due to the poor adhesion between SAM's tail group and the M2 electrode, M1/SAM/M2 overlapping regions can easily be peeled off via applying a glue/tape (as in the a-Lith method) or by blowing with air/$N_2$ stream, rinsing with liquids or sonication (as in the self-forming lithography method). The interface formed between the M1/M2 materials has a gap <20 nm, and the SAM molecules on M1 can be cleaned via UVO/Oxygen plasma route. Consequently, the scalable, low cost and solution-based a-Lith or self-forming nanogap methods can be used in many functional device applications such as RF diodes, nano-LEDs, memory devices, photo-detectors, Full Wave Rectifiers (FWR) and nano-trenches (made with the underlying substrate etching) discussed with regard to FIGS. 15A to 16B. The nano-trenches may be used for nano-bio fluidics applications. The novel self-forming nanogap method eliminates the additional peeling off step used in the a-Lith process, which further simplifies the processing, reduces the costs, increases uniformity, reliability, and allows more precise control of the nanogap size.

Thus, the embodiments discussed herein can achieve one or more of the following advantages:

(1) The use of the a-Lith and/or self-forming nanogap methods serve as an alternative route to fabricate soft/hard master and stamps on large-area substrates using existing scalable patterning techniques such as conventional photolithography or laser scribing. The replicated stamps can contain features with a minimum size down to 1 nm and maximum size of >>1m if needed.

(2) The methods discussed herein provide low cost and rapid prototyping compared to current technologies such as e-beam lithography (EBL) and Focused Ion Beam Lithography (FIBL) for master fabrication, but without being limited in size, unlike the nanogap patterning which is a parallel process—

(3) A soft stamp prepared from a nanogap master mould can be used to replicate high-aspect-ratio nanoscale features over large areas via any soft lithography techniques such as nano-contact printing, embossing/NIL, phase shift lithography and nanoskiving.

(4) The control on the master/soft stamp feature dimensions, size, and shape can be manipulated via a-Lith/self-forming nanogap lithography process parameters.

(5) The conductive electrodes can act as a shadow mask for dry/wet etching the underneath substrate or other interlayers and/or substrate materials. This approach allows for the patterning of high/low aspect ratio nanofluidic channels on the substrate. Such nm-deep, nm-wide, but mm- or m-length features may find an application on biological sciences, among other fields.

(6) The ability to prepare such soft stamps for any soft lithography (micro/nano contact printing, NIL, phase shift lithography and mechanical sectioning) using additive manufacturing techniques such as an individual or combination of laser scribing, a-Lith, self-forming nanogap method, and others techniques (known from the literature) can find applications in different fields including, optoelectronics, electronics, bio-electronics, solar cells, and sensors field, to name but a few.

The methods discussed above may be used for other applications, as now discussed. In one embodiment, it is possible to form nanogaps or nano-channels based on the above discussed methods, and to use these nanogaps or nano-channels for electro, photo or photo-electro chemical conversion of earth abundant natural chemicals such as water, sea-water, $O_2$, $N_2$, $CO_2$ and natural gas, like methane, into a value added chemical commodity like $H_2$ fuel, $NH_3$, $H_2O_2$, $Cl_2$, $CH_3OH$ and HCHO to name but a few. Any of the methods discussed above may be used to manufacture conductive and/or catalytic electrodes (symmetric, i.e., the same material, or asymmetric i.e., dissimilar material) M1 and M2, which are spaced apart by a gap of nanoscale size in the range of 1-100 nm. The conductive and/or catalytic electrodes M1 and M2 may include one or more different materials, such as metals, transparent conductive oxides (e.g., indium tin oxide, ITO), conductive polymers, 2D, 1D and 0D materials, to name but a few, as an individual layer or in multilayer combinations. The co-planar nanogap electrodes M1 and M2 can be made by either of the above mentioned methods, or by other methods known in the literature, for example, mechanical break junction, metal oxidation, scanning probe lithography, nano masking methods, to name but a few.

Figure 20A:
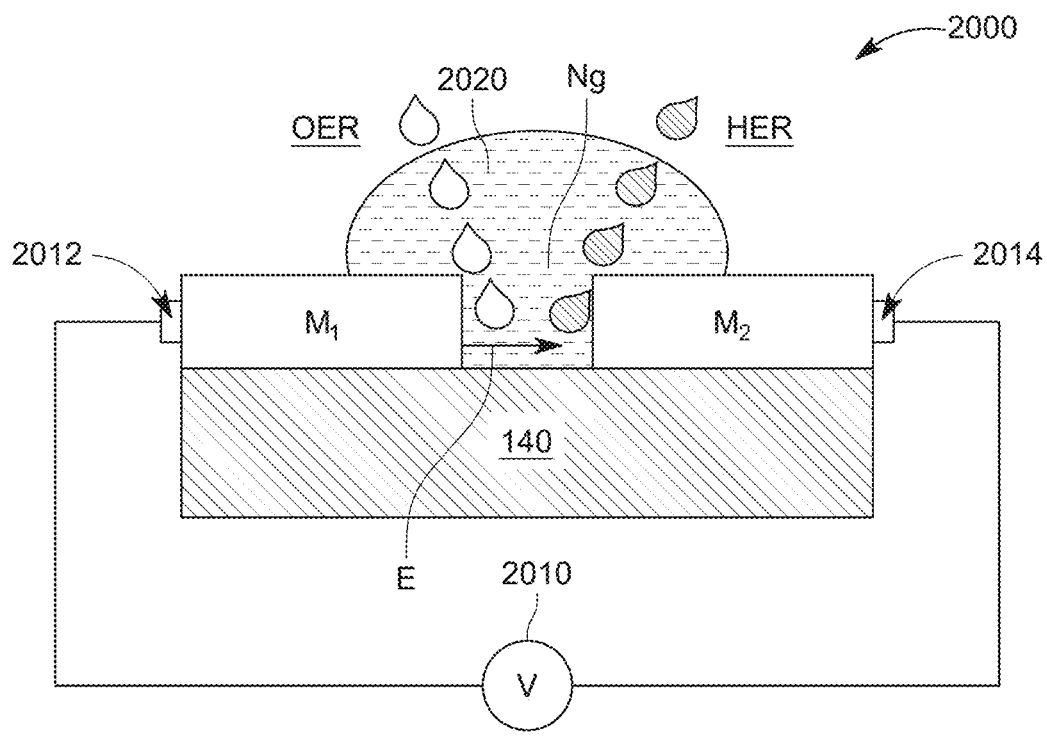
FIGS. 20A to 20C illustrate a nanogap electrochemical cell that uses one or more sources of energy.
Figure 20B:
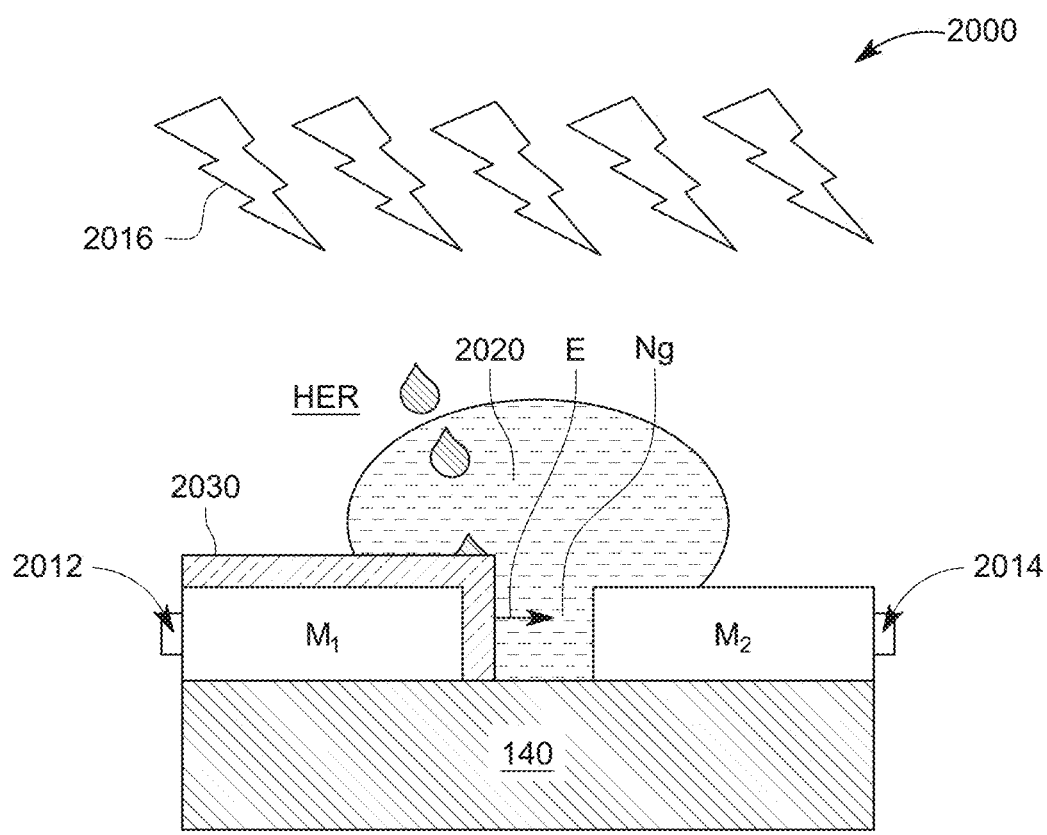
Figure 20C:
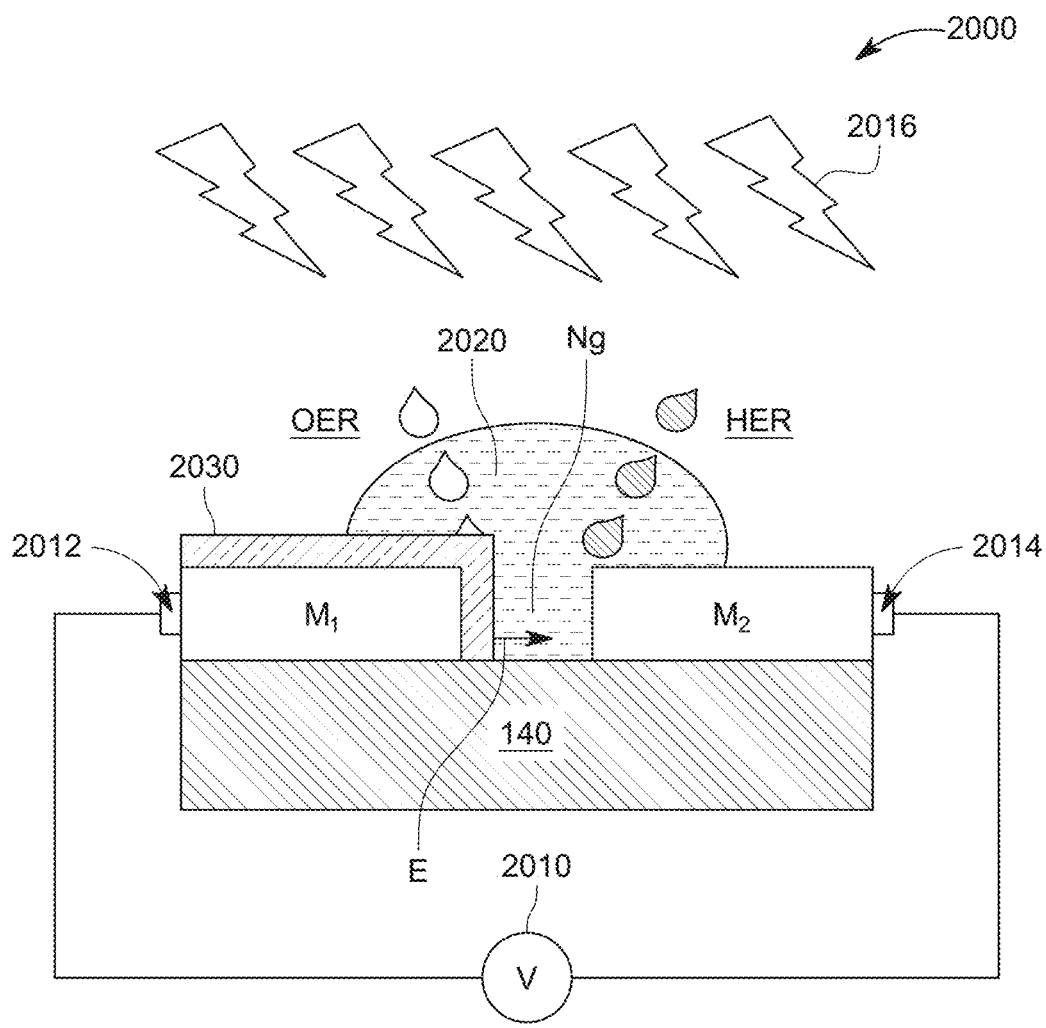

A novel nanogap electrochemical cell 2000 is shown in FIG. 20A being implemented as an electrochemical conversion cell, in FIG. 20B as a photo-chemical conversion cell, and in FIG. 20C as a photo-electrochemical conversion cell. FIG. 20A shows the cell 2000 having the substrate 140, the first and second metal electrodes M1 and M2, which define the nanogap Ng, and a power source 2010 that supplies electrical power to two contact pads 2012 and 2014, which are connected to the two electrodes M1 and M2, respectively. In one application, the minimum voltage applied to the two electrodes M1 and M2 is 1.3 V. Larger voltages may be used. An electrolyte 2020 (e.g., water) is placed inside the nanogap Ng. The electrical field E generated through electrolyte 2020 in the nanogap Ng, is due to the voltage applied by the power source 2010 in this embodiment.

Figure 21A:
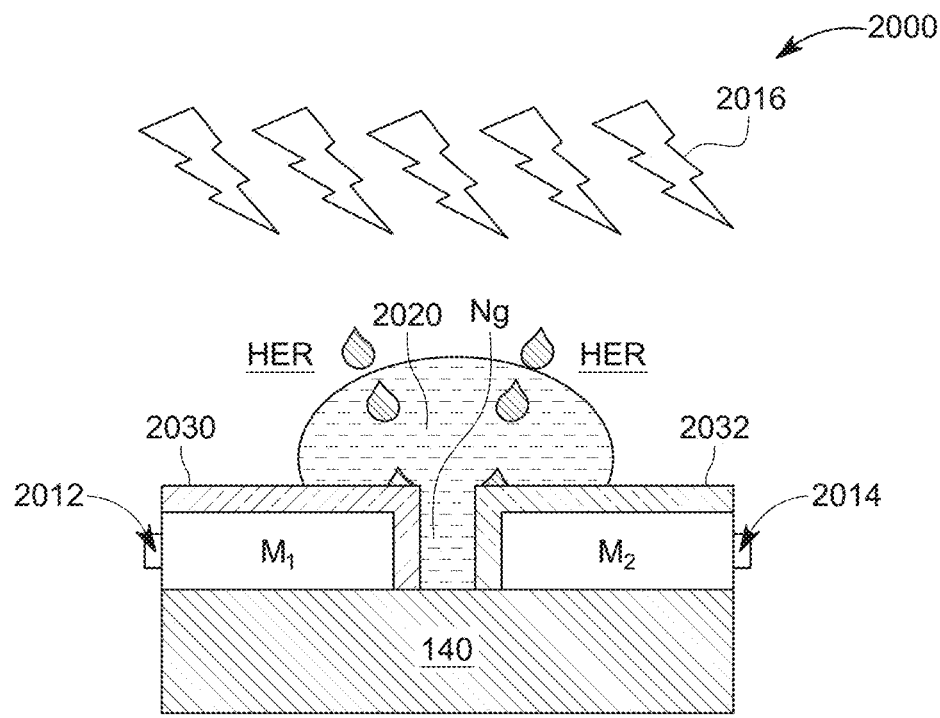
FIGS. 21A to 21D illustrate variations of the nanogap electrochemical cell illustrated in FIGS. 20A to 20C.

However, for the cell 2000 shown in FIG. 20B, the electrical field E is generated by the interaction between the solar energy 2016 received from the sun or other illumination source, and a photo-active material 2030 that is deposited on one of the electrodes M1 and M2, or both of them, as shown in FIG. 21A. The photo-active material 2030 may be $TiO_2$. However, other photo-active materials may be used. The embodiment illustrated in FIG. 21A has a first photo-active material (n-type) 2030, on the first electrode M1 and a different, second photo-active material (p-type) 2032, on the second electrode M2.

The cell 2000 shown in FIG. 20C uses both the power source 2010 and the photo-active material 2030 to generate the electrical field E. The cell shown in FIG. 21B has the two different photo-materials 2030 and 2032 formed on the two electrodes M1 and M2, respectively, similar to the configuration shown in FIG. 21A. The photo-material 2030 and/or 2032 may be added to one or more of the electrodes M1 and M2 by using $UVO/O_2$ plasma to promote native oxide growth ($TiO_2$, CuO, $NiO_2$, etc.) and/or selective deposition of n-type/p-type SAMs on the metal electrodes. These steps have been discussed above with regard to FIG. 2, for example, step 206, and various types of SAM materials have also been discussed above, with regard to FIGS. 4A to 4C. P-type SAM materials may include BTBT-PA, C13-BTBT, C2-4T-C12-PA, and 2PACZ, see the table in FIG. 22, and n-type SAM materials may include PTCDI-PA, PTCDI-Ph, and Glycol-C60-C6-Pa, as also shown in the table in FIG. 22.

Figure 21B:
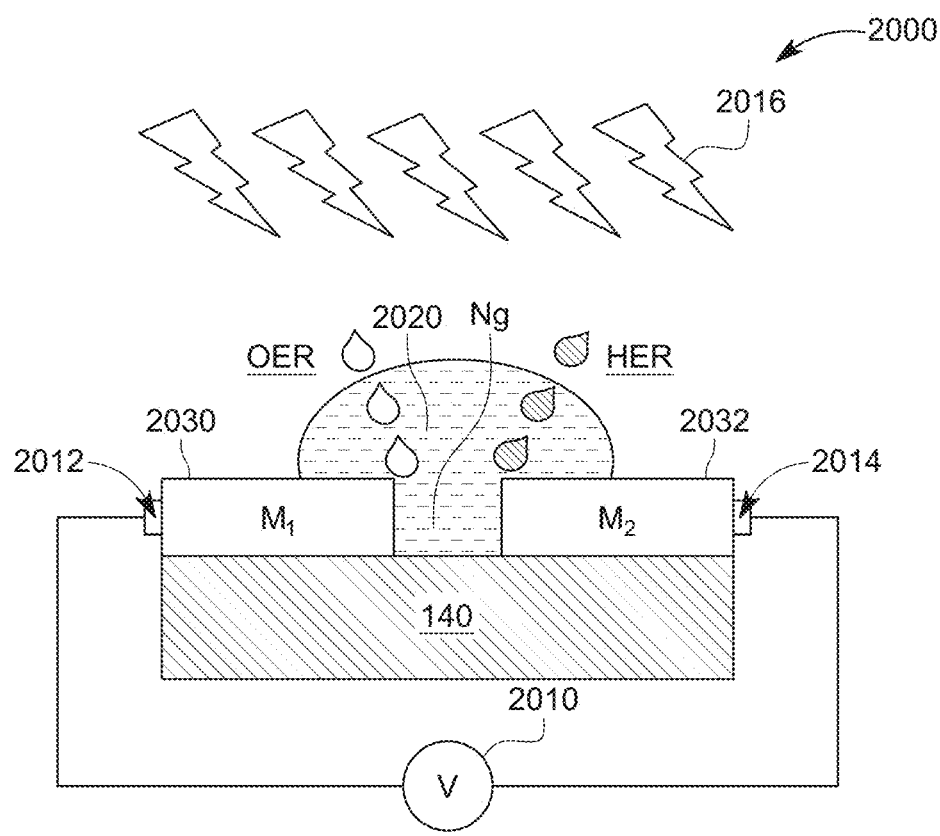
Figure 21C:
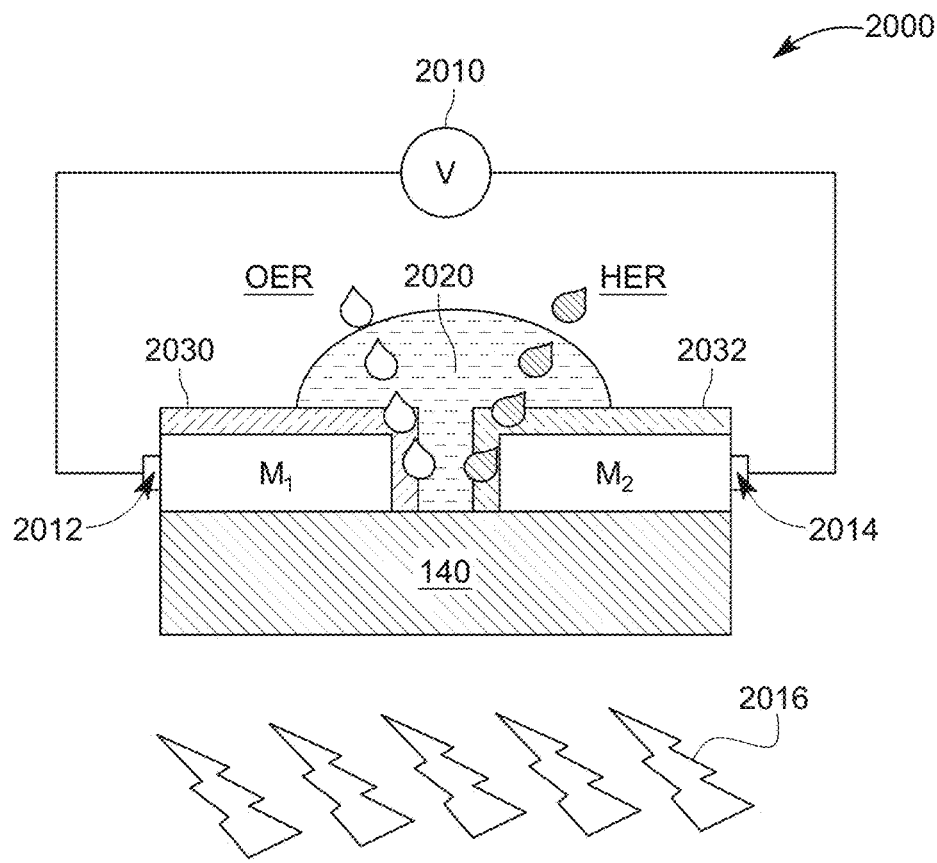
Figure 21D:
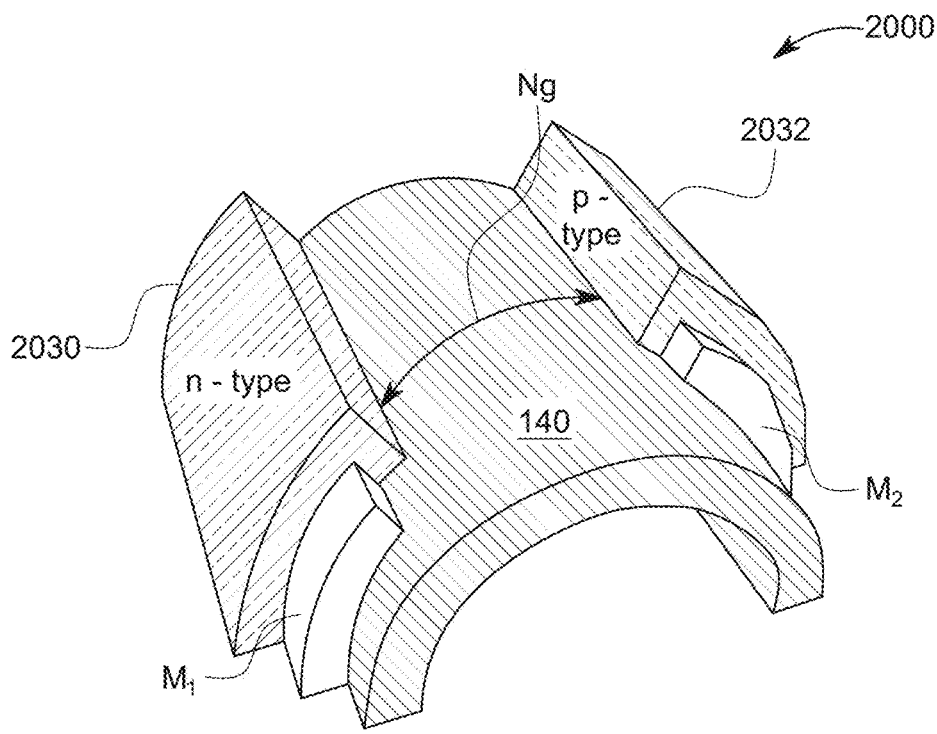
Figure 22:
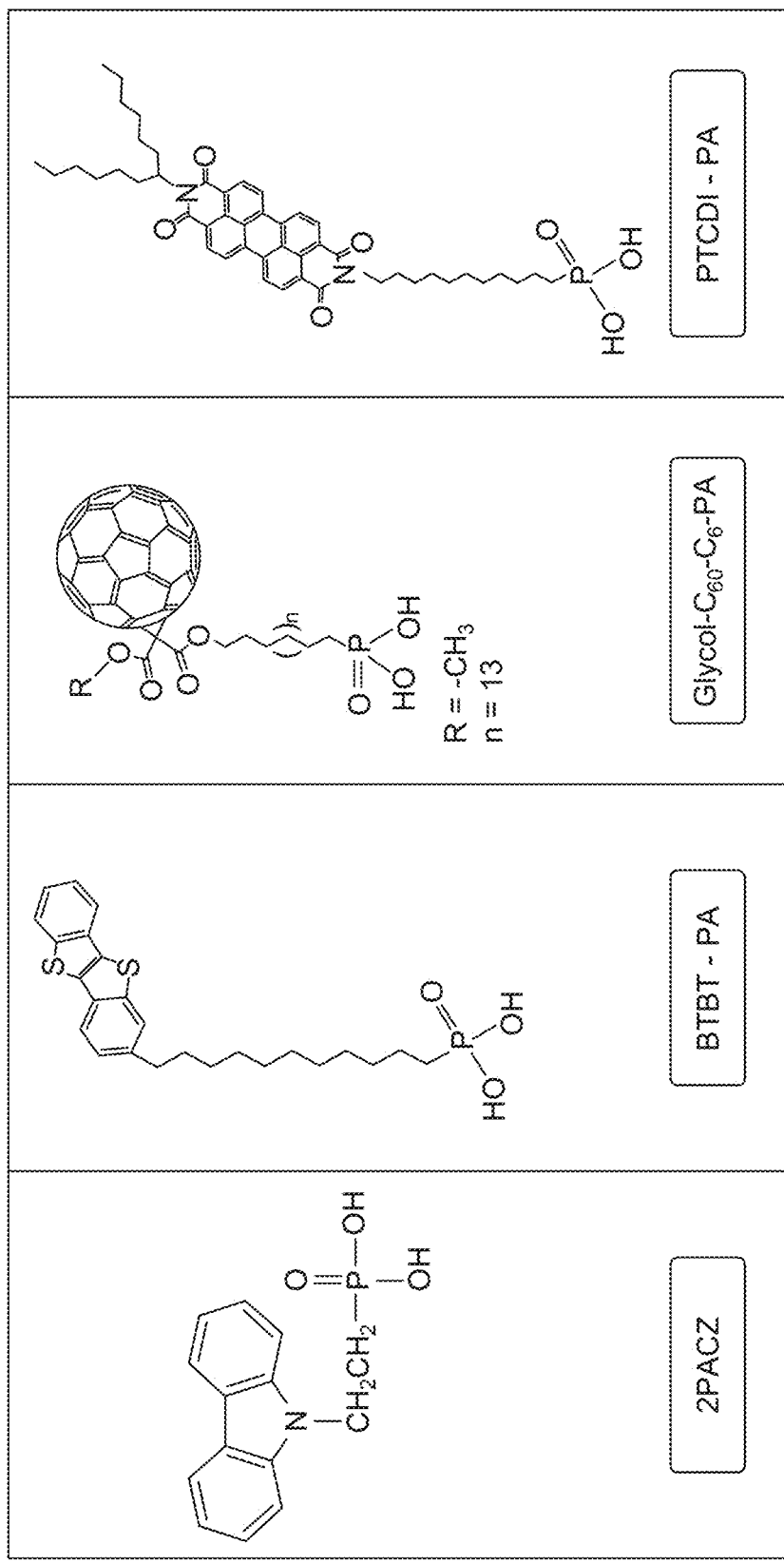
FIG. 22 illustrates various semiconducting and photoactive self-assembled monolayers that can be used in a nanogap electrochemical cell.

The implementation of the cell 2000 shown in FIG. 21B may be further modified, as shown in FIG. 21C, so that the solar energy 2016 is provided from the back of the cell, i.e., through the substrate 140. For this specific implementation, the solar energy 2016 first passes the substrate 140 and then arrives at the photo-active material 2030. In one application, one or both of the metal electrodes M1 and M2 are transparent to the solar energy 2016, so that the solar light passes the substrate and the metal electrodes before arriving at the photo-active material 2030 and/or 2032. If the substrate 140 is made of a flexible material, then the cell 2000 can be bent as illustrated in FIG. 21D. In one application, the substrate 140 may be bent to form a semicircle.

For the above implementations of the cell 2000, the empty nanogap Ng is filled with an electrolyte such as DI water, $H_2SO_4$ or $Na_2SO_4$ dissolved in water at various concentrations. The voltage applied to the electrodes M1 and M2 leads to a strong electric field across the nanoscale channel while extending over larger widths, thus causing a robust electrochemical reaction in the electrolyte 2020 added between the electrodes M1 and M2. The nanogap electrodes M1 and M2 can be integrated to form either single discrete cells 2000, for electrochemical sensing, or they can be used as a wafer scale electro-chemical apparatus and/or integrated with photo-active materials for photo or photo-electro-chemical conversion. The planar architecture illustrated in FIGS. 20A to 21D (i.e., all the electrodes are formed in a given horizontal plane, next to each other, and not on top of each other), the transparent substrates 140 and 1720, and the photo catalysts can enable both front and back illuminations. The planar device configuration shown in these figures not only mimic the conventional electro chemical cells, but also enhances the kinetic of the reactions due to the large field produced within the nanogap. In this regard, it is noted that the cell 2000 in FIGS. 20A to 21D show at least one of an Oxygen Evolution Reaction (OER) and a Hydrogen Evolution Reaction (HER).

Figure 23A:
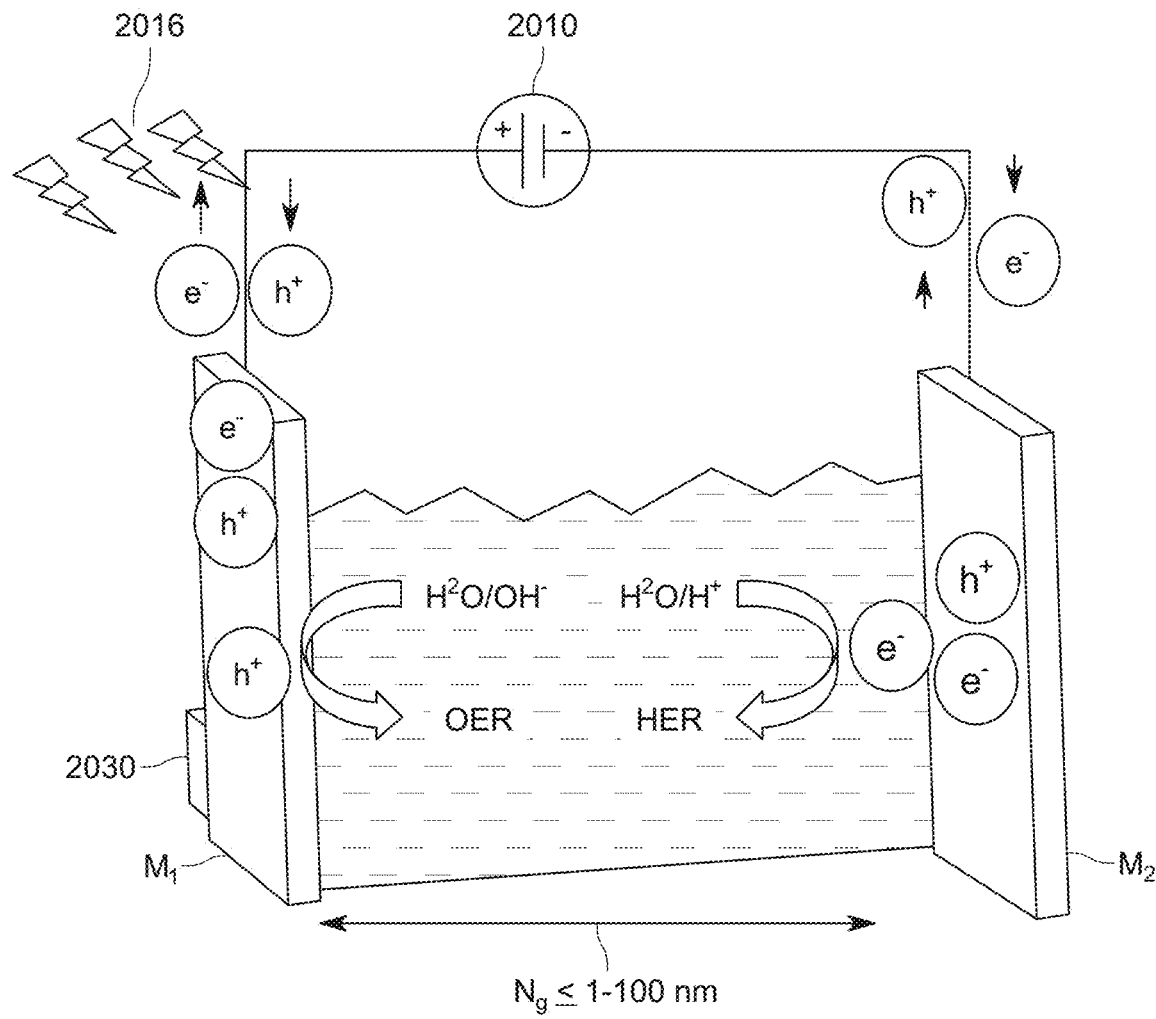
FIG. 23A schematically illustrates the chemical reactions that take place at the electrodes of the nanogap electrochemical cell and FIG. 23B is a flow chart of a method for processing a chemical component, with the nanogap electrochemical gap, for obtaining another chemical component.

These reactions are now discussed with regard to FIG. 23A, which corresponds to cell 2000 shown in FIG. 21B. These reactions are similar for the other cell implementations. The electrical power source 2010 (see FIGS. 20A and 21B) is connected to the contact pads 2012 and 2014 of the M1 and M2 electrodes, respectively, so that no direct contact between the contact pads and the water is taking place. The water only contacts the M1 and M2 electrodes. Under the external bias (solar power 2016 or electrical current from the power source 2010, or both), electrons $e^-$ at the M2 electrode (cathode) are involved in the HER, while at the M1 electrode, holes $h^+$ initiate the OER. As the HER and OER reactions are known in the art, details of these reactions are omitted herein. An advantage of a planar nanogap architecture over the conventional electrochemical is the large electric field E generated in the nanogap Ng during this process. Thus, the kinetics of both HER and OER, which are subjected to such a large electric field, will be positively influenced.

Figure 23B:
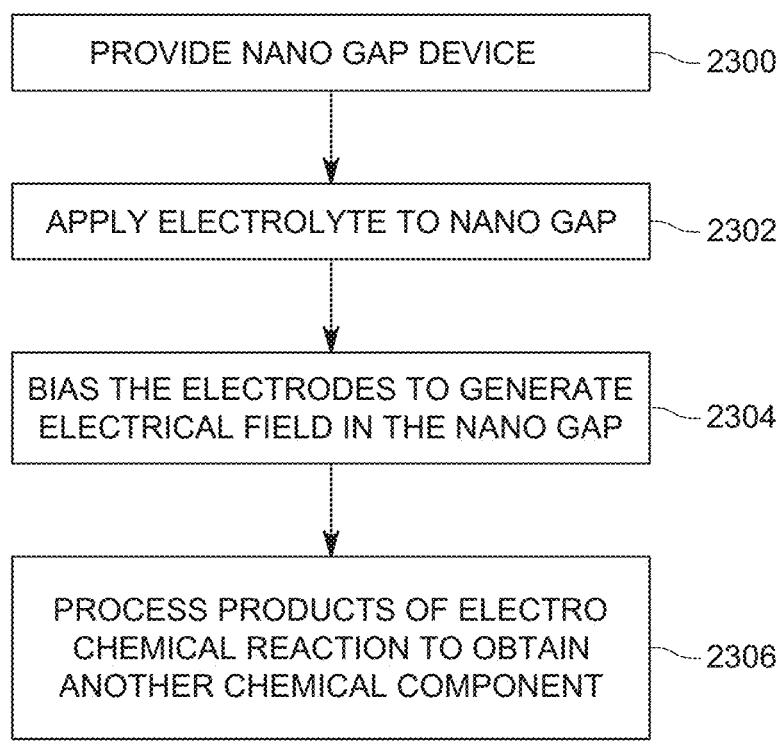
Figure 24A:
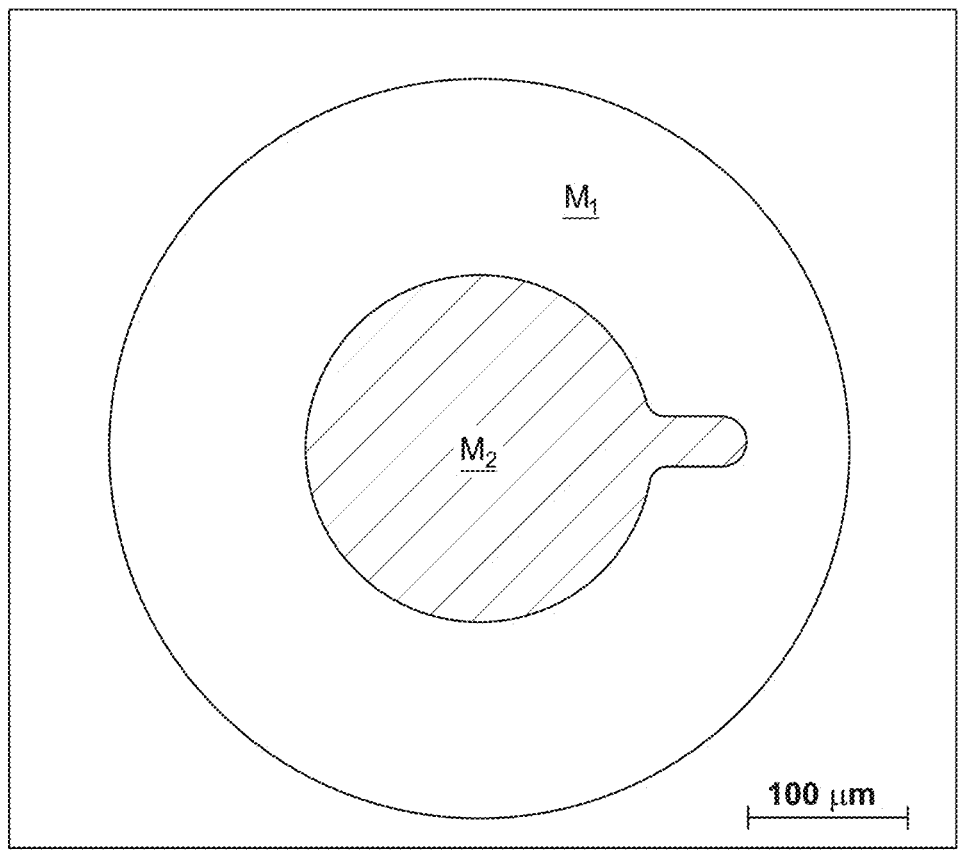
Figure 24B:
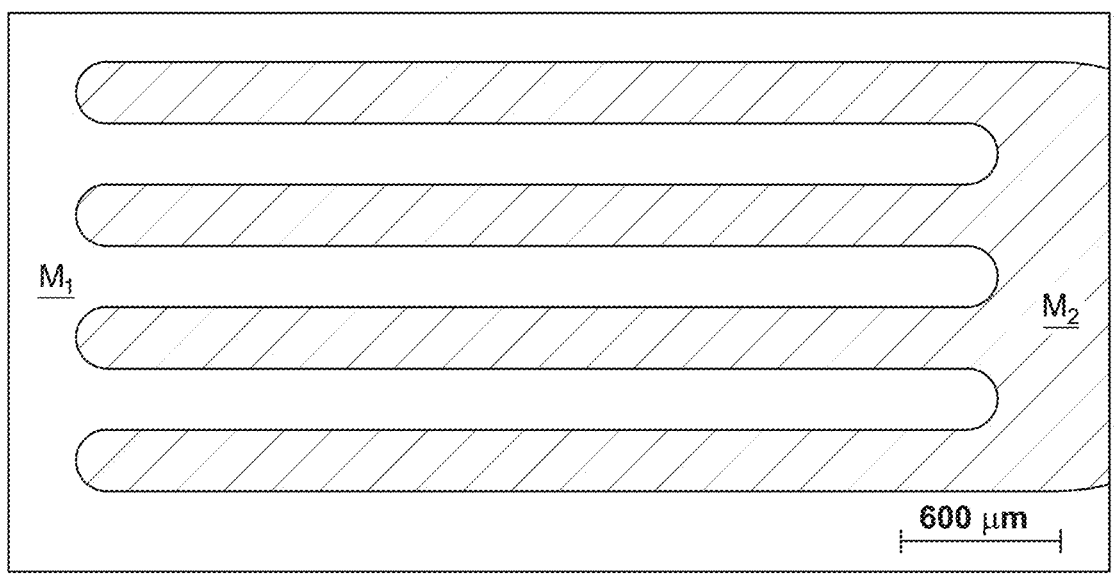
FIG. 24B illustrates inter-digitated type electrodes for the nanogap electrochemical cell.

A method for electro-catalysis (EC) of water using any of the cells 2000 discussed above is now discussed with regard to FIG. 23B. In step 2300, the cell 2000 is fabricated either via the self-forming nanogap method discussed with regard to FIG. 2 or according to the a-lith method. In one application, the prepared nanogap substrate holds Al (M1)-Ti/Pt (M2) planar inter-digitated electrodes fabricated by the self-forming nanogap method. The nanogap electrodes were cleaned with UV-Ozone (UVO) or oxygen plasma for 2 minutes in order to remove the SAM from the previous fabrication method. The inter-digitated electrodes can be formed on a die (e.g., on a wafer having a length of about 10 cm) to have a circular shape, as shown in FIG. 24A, or linear shape, as shown in FIG. 24B. A diameter of the M1 and M2 electrodes in FIG. 24A may be between 100 to 900 µm, while a length of the same electrodes in FIG. 24B may be between 1 mm or 1 cm up to 10 cm. One skilled in the art would understand that these dimensions may be scaled up or down to fit the substrate.

In step 2302, an electrolyte (e.g., pure DI water) is applied only on the areas between the IDE fingers, leaving the contact pads 2012 and 2014 on both metal electrodes M1 and M2 untouched. This ensures that the probe does not have any direct contact with the DI water and the reaction is solely initiated due to the induced large electric field E and electrochemical reaction in the nanoscale channel Ng. In step 2304, both metal electrodes' contact pads are connected to an external source 2010 via needle probes and an external bias is applied, which induces the electrochemical reaction that splits the DI water into its constituents such as $H_2$ and $O_2$ molecules. Under certain bias conditions (mostly >1.3 V), fine bubbles are emerging only at the interface between the Al/Ti—Pt metal electrodes, where the nanogap exists.

Figure 25:
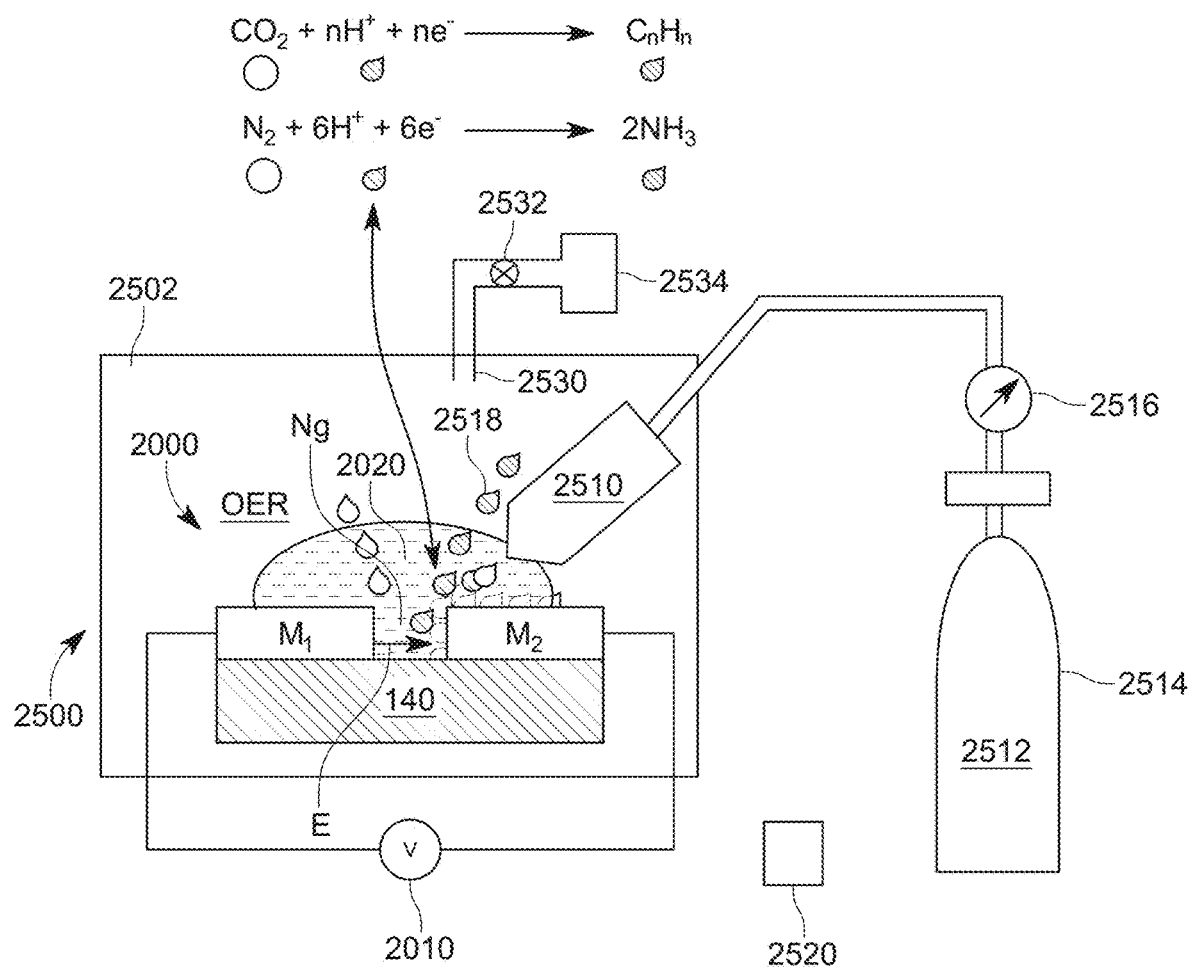
FIG. 25 illustrates a reactor that uses a nanogap electrochemical cell to process one or more chemical components to generate another chemical component.

In step 2306, the by-products of the electrochemical reaction, e.g., $H_2$ and $O_2$ molecules, are processed to generate another chemical component, as now discussed. In one embodiment, as illustrated in FIG. 25, a reactor 2500 may include a closed housing 2502 that hosts one or more cells 2000. The power source 2010 applies a voltage V to the metal electrodes M1 and M2 to generate an electrical field E in the nanogap Ng. The electrolyte 2020 present in the nanogap Ng experiences the OER and HER reactions. At the same time, a nozzle or gun 2510, placed partially or totally inside the housing 2502, is configured to inject a desired chemical component 2512, for example, $CO_2$ or $N_2$. Other gases or combination of gases may be injected by the gun 2510. The chemical component 2512 is stored outside the housing 2502, into a storage tank 2514. A pressure regulator 2516 controls the amount of the chemical component 2512 that is supplied by the storage tank 2514 to the gun 2510. A computing system 2520 may be associated with the reactor 2500 and may be linked, in a wired or wireless manner, to the power source 2010 and the pressure regulator 2516 to control them, and the chemical reactions occurring inside the housing 2502.

If the chemical component 2512 is $CO_2$, and the gun 2510 is located and oriented inside the housing 2502 to expel the gas onto the metal electrodes M1 and M2, a $CO_2$ reduction reaction ($CO_2$RR) may take place inside the reactor 2500. The $CO_2$RR is described by the following chemical reaction:

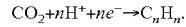

If the chemical component 2512 is $N_2$, then a Nitrogen Reduction Reaction (NRR) takes place, which is described by the following chemical reaction:

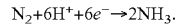

For both reactions, the $N_2$ and $CO_2$ gases are adsorbed on the metal electrode M1 or M2 where the HER occurs, and the $N_2$ and $H_2$ gases or the $CO_2$ and $H_2$ gases bind to each other due to their potential and dissociate as $NH_3$ or $C_nH_n$ from the metal surface of the electrodes. The number n can be any integer. These newly formed gases 2518 are then collected at a port 2530, and optionally pumped with a pump 2532 into another storage tank 2534. The computing system 2520 is configured to also control the pump 2530.

While the embodiment illustrated in FIG. 25 shows only the cell 2000 illustrated in FIG. 20A, those skilled in the art would understand that any of the cells shown in FIGS. 20A to 21D may be used inside the reactor, i.e., those that use only solar energy or those that use a combination of solar and electrical energy. In one embodiment, a mixture of these cells may be used inside the reactor 2500. Any number of cells 2000 may be placed inside the reactor 2500, e.g., hundreds, or thousands or more.

The cells 2000 for electrochemical conversion are not limited to water splitting, as discussed above, but they can also serve as a basic foundation for other useful value-added chemical commodity conversions and chemical detections. For instance, the planar nanogap cells can be used, in addition to the ammonia conversion via NRR from naturally existing $H_2O$ and $N_2$ as reactants ($N_2 \rightarrow NH_3$), and $CO_2$ reduction ($CO_2 \rightarrow C_nH_n$), also for methane partial reduction ($CH_4 \rightarrow CH_3OH$), for two-electron oxygen reduction ($O_2 \rightarrow H_2O_2$), Chlorine evolution from seawater ($Cl^- \rightarrow Cl_2$), etc. In addition, the planar nanogap cells can be used for electrolyte free chemical conversion and/or detection as shown in FIG. 25.

Figure 26A:
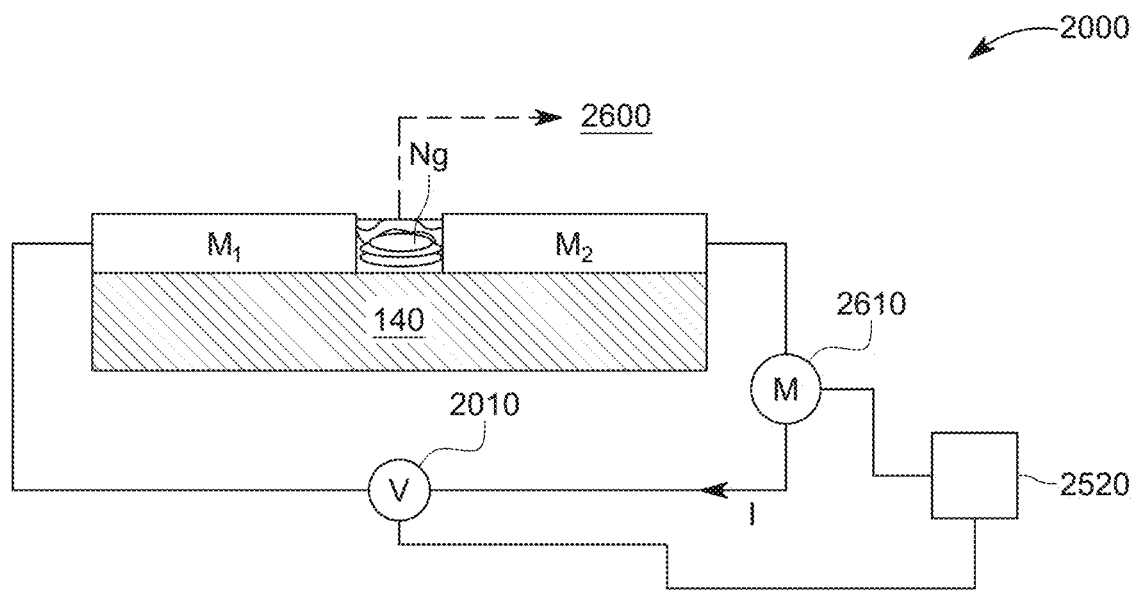
FIG. 26A illustrates the use of a nanogap electrochemical cell for determining a chemical element placed in its nanogap.
Figure 26B:
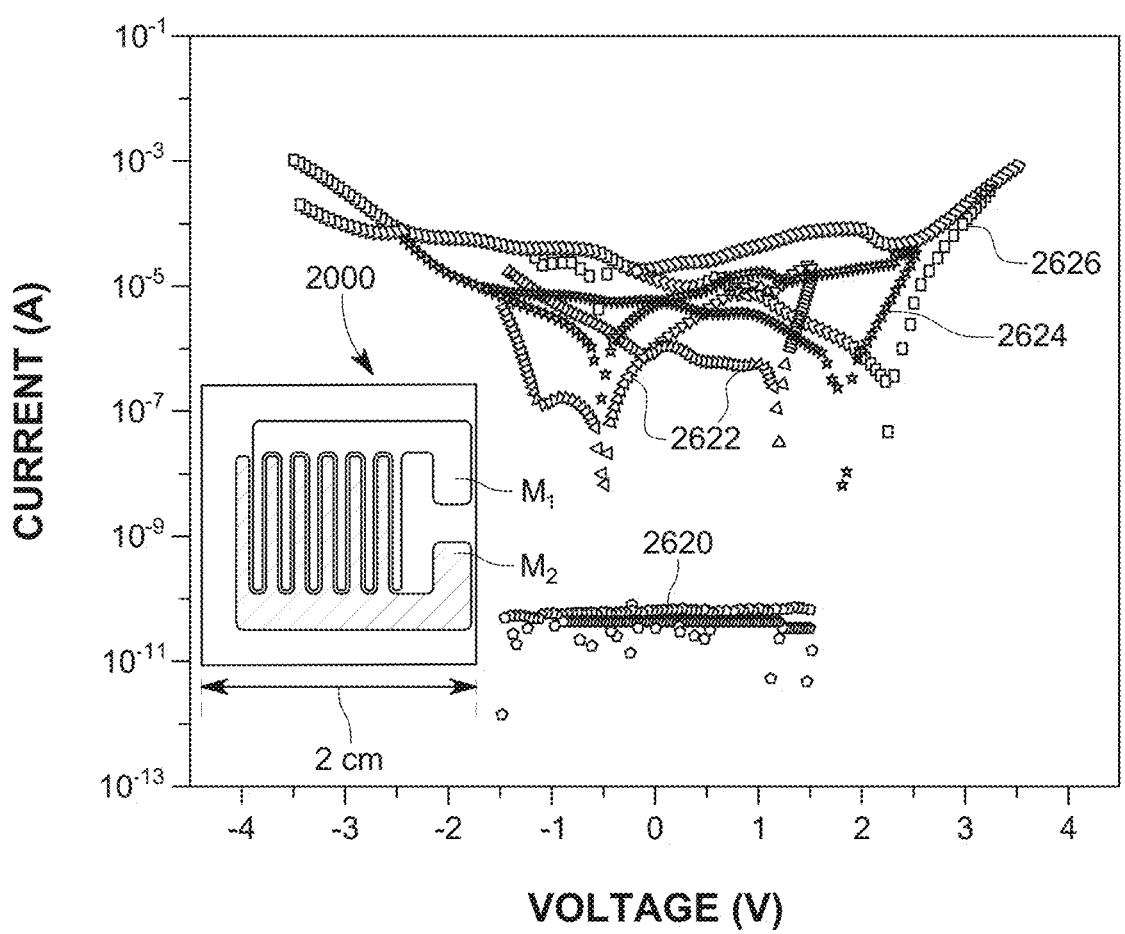
FIG. 26B illustrates a measured current associated with the determined chemical element and electrochemical reaction.

In addition, the electrostatic or External Electric Field (EEF) induced catalysis of a Diels-Alder reaction is another possible candidate for reactions induced by the nanogap cell 2000. For this application, the field-induced change in redox and non-redox chemical reactions can be measured by the change in the tunnelling current. The electrochemical reaction in the planar nanogap cell 2000 could also be used for chemical detections, such as the fake alcoholic content detection in beverages, as illustrated in FIGS. 26A and 26B. More specifically, a material of interest 2600 may be placed in the nanogap Ng of the cell 2000, as shown in FIG. 26A. The power source 2010 applies a voltage V between the first and second metal electrodes M1 and M2, to create an electrical field E in the nanogap Ng. This electrical field affects the redox and non-redox chemical reactions taking place in the material of interest 2600, which is reflected in the current I. The current I is measured with a device 2610, for example, a multimeter, an then plotted as shown in FIG. 26B, against the applied voltage V. If no material is placed in the nanogap Ng, then the current curve 2620 is obtained. If 1 M of $Na_2SO_4$ is placed in the nanogap Ng, and the current I is measured for various voltage ranges, the curve 2622 is obtained for V varying between −1.5 to 1.5 V, the curve 2624 is obtained for V varying between −3.5 to 3.5 V, and the curve 2626 is obtained for V varying between −4.5 to 4.5 V. As these curves are different from each other, it means that the current can be used to identify the EEF induced chemistry of the material placed in the nanogap, and thus, to assess various redox and non-redox reactions. In one application, the computing device 2520 may be connected to the power source 2010 and the current measuring device 2610, and configured in software to automatically detect the material placed in the nanogap, based on a library of current measurements priorly obtained for various substances. It is noted that FIG. 26B shows the cell 2000 having a length of about 2 cm, which means that the metal electrodes M1 and M2 have substantially the same length. However, the metal electrodes M1 and M2 may have a 1 cm to 5 cm length. The current levels and/or I-V slopes can also be used to extract the amount or percentage of certain chemicals that are present in the material of interest 2600, if a prior calibration of these chemicals is performed for the cell 2000.

The processes described above were based on the use of a specific set of conditions and materials combinations. However, different variants of these processes can be envisioned and are now discussed. The choice of electrolyte used in the nanogap electrochemical cells 2000 influences the various parameters such as on-set potential (the potential required to turn on the chemical reactions), over-potential, type of chemical reaction mechanism involved, the yield of the converted chemicals, etc. Similarly, the choice of the electrode materials will also influence these parameters. However, both the a-lith and the self-forming methods of fabrication are versatile and can be adapted to any choice of substrate and electrode combination. For instance, the initial cells 2000 were based on Al/Ti—Pt, Al/Au, ITO/Au, ITO/Ti—Pt and Ti/Ti—Pt nanogap electrodes formed on glass and Si substrates. Different electrolytes, such as pure DI water, 0.05M $H_2SO_4$ dissolved in water, 1M $Na_2SO_4$ dissolved in water, tap water, and bottled drinking water, have also been employed to investigate the HER and OER. The choice of electrolyte and electrodes dictates the rate of the OER/HER.

There is a large variety of substrate materials that can be used for the cell 2000, depending on the particular application. While glass and Si wafers with thermally grown oxide layers have been used herein, a flexible and plastic substrate can be used as well. Generally, any substrate that is compatible with the a-lith or self-forming nanogap processes could be considered as a substrate material for the proposed cell.

As discussed above with regard to FIGS. 20A to 21D, based on the external stimuli due to either an external voltage (electro catalysis, EC) and/or light, the principle of operation of the cell changes (photo catalysis (PC) or photo electro catalysis (PEC)). However, in the PC or PEC modes of operation, certain kinds of photo-active semi-conductors (photo catalyst) and electrode materials are required. As also discussed above, the process illustrated in FIG. 2 can be adapted to have additional steps to selectively grow native oxides, which are intrinsic photo catalysts (such as Ti into $TiO_2$, Ni into $NiO_2$, and Cu into CuO) via UV-Ozone or oxygen plasma treatments. Furthermore, semiconducting and photoactive SAMs (see FIG. 22) can also be selectively coated on the M1 and M2 electrodes. In general, any semiconducting and photoactive material (photo catalyst), which has selective binding towards one of the metal electrodes M1 or M2 or that can be treated to achieve such selectivity, can be used in the process of FIG. 2.

Nonetheless, the mechanism for water splitting or other possible chemical reactions varies based on the external stimuli, the types of photoactive materials, and principles of operation. Thus, the important figures of merit known as on-set potential, power consumption, yield, and cost of the devices may vary depending on the choice of principles of operation. The inventors are not aware of a planar nanogap device technology employed for water splitting or any other chemical conversion and detection. All the reported devices are mostly in vertical configurations. This is mainly due to the difficulties in fabrication and constraints imposed by the current state of the art lithography methods. Thus, based on the versatile lithography approach illustrated in FIG. 2, it is possible to achieve a completely planar device architecture that can be scalable, low-cost, and a viable route for electrochemical conversion, detection and analysis.

The embodiments discussed with regard to FIGS. 20A to 26B may be summarized as follows, using dedicated numbered paragraphs:

1. A nanogap electrochemical cell (2000) includes a substrate (140), first and second metal electrodes (M1, M2) formed on the substrate (140) such that a nanogap Ng delineates the first metal electrode (M1) from the second metal electrode (M2), and a power source (2010, 2030) that converts external energy into an electrical field E between the first and second metal electrodes (M1, M2), wherein the nanogap Ng is smaller than 100 nm.
2. The cell of paragraph 1, wherein the power source is an electrical power source.
3. The cell of paragraph 1, wherein the power source is solar energy.
4. The cell of paragraph 1, wherein the power source includes a photo-active material formed on at least one of the first and second electrodes.
5. The cell of paragraph 4, wherein the photo-active material includes a first photo-active material formed on the first metal electrode, and a second photo-active material formed on the second metal electrode, and the second photo-active material is different from the first photo-active material.

6. The cell of paragraph 5, wherein the first photo-active material is n-type and the second photo-active material is p-type.
7. The cell of paragraph 1, wherein the power source includes an electrical power source and a photo-active material formed on at least one of the first and second electrodes.
8. The cell of paragraph 1, wherein the power source is a photo-active material formed on at least one of the first and second electrodes, and solar energy reaches the photo-active material through the substrate.
9. The cell of paragraph 1, wherein the substrate is bendable.
10. The cell of paragraph 1, further including a current measuring device for measuring a current between the first and second electrodes, and a computing device that determines a material placed in the nanogap, based on the measured current.
11. A reactor (2500) for performing electrochemical reactions, the reactor (2500) including, a housing (2502), a nanogap electrochemical cell (2000) placed inside the housing (2502), a gun (2510) configured to provide a first gas (2512) to the nanogap electrochemical cell (2000), a port (2530) configured to collect a second gas (2518) from the housing, which is different from the first gas (2512), an electrolyte (2020) placed in a nanogap Ng of the nanogap electrochemical cell (2000), wherein the nanogap Ng is formed above a substrate (140) and delineates a first metal electrode (M1) from a second metal electrode (M2), and a power source (2010, 2016) that converts external energy into an electrical field E between the first and second metal electrodes (M1, M2), wherein the nanogap Ng is smaller than 100 nm.
12. The reactor of paragraph 11, wherein the electrolyte is water, the first gas is $N_2$, and the second gas is $NH_3$.
13. The reactor of paragraph 11, wherein the electrolyte is water, the first gas is $CO_2$, and the second gas is $C_nH_n$, where n is an integer.
14. The reactor of paragraph 11, further including a first storage tank for storing the first gas, a second storage tank for storing the second gas, a pump for pumping the second gas from the housing to the second storing tank, and a computing system that controls the pump and an amount of the first gas entering the housing.
15. The reactor of paragraph 11, wherein the power source is an electrical power source, or a solar energy, or a combination of both.
16. The reactor of paragraph 11, wherein the power source includes a photo-active material formed on at least one of the first and second electrodes.
17. The reactor of paragraph 16, wherein the photo-active material includes a first photo-active material formed on the first metal electrode, and a second photo-active material formed on the second metal electrode, and the second photo-active material is different from the first photo-active material.
18. The reactor of paragraph 11, wherein the power source includes a photo-active material formed on at least one of the first and second electrodes, and solar energy reaches the photo-active material through the substrate.
19. The reactor of paragraph 11, wherein the substrate is bendable.
20. The reactor of paragraph 11, wherein the nanogap formed between the first and second electrodes is 20 nm.

The disclosed embodiments provide a new method for forming (1) a soft stamp that corresponds to a master mould, (2) a nano-fluidic device, or (3) a nanogap electrochemical cell. The soft stamp can then be used with various methods for forming various solid-state devices with a small footprint, which would make these devices appropriate components for the IoT environment, allow large scale manufacturing, and offer a low-cost solution for many applications. The embodiments are intended to cover alternatives, modifications, and equivalents, which are included in the spirit and scope of the invention as defined by the appended claims. Further, in the detailed description of the embodiments, numerous specific details are set forth in order to provide a comprehensive understanding of the claimed invention. However, one skilled in the art would understand that various embodiments may be practiced without such specific details.

Although the features and elements of the present embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims and may include other examples that occur to those skilled in the art. Such other examples are intended to be within the scope of the claims.

REFERENCES

[1] Beesley et al., "Sub-15-Nm Patterning of Asymmetric Metal Electrodes and Devices by Adhesion Lithography," Nat Commun 2014, 5.
[2] Chen et al., "Atomic layer lithography of wafer-scale nanogap arrays for extreme confinement of electromagnetic waves," Nat. Commun. 2013, 4, 2361.
[3] Chen et al., "Nanogap-Enhanced Infrared Spectroscopy with Template-Stripped Wafer-Scale Arrays of Buried Plasmonic Cavities," Nano Lett. 2014, 15, 107.

What is claimed is:
1. A method for manufacturing a soft stamp, the method comprising:
providing a substrate having a first electrode and a second electrode, the second electrode being formed at a distance less than 100 nm from the first electrode so that a nanogap Ng is formed between the first and second electrodes;
pouring a curable substance over the first and second electrodes and into the nanogap Ng;
curing the curable substance to form a soft stamp; and
removing the soft stamp from the first and second electrodes,
wherein the soft stamp has a nano-feature having a size less than 100 nm.
2. The method of claim 1, wherein the soft stamp has a base from which extends the nano-feature.
3. The method of claim 1, wherein the nano-feature has a height less than 50 nm.
4. The method of claim 1, wherein the first and second electrodes are made of different materials.

5. The method of claim 1, wherein the step of providing comprises:
   patterning a first metallic layer (M1) to form the first electrode on the substrate;
   depositing a self-assembling monolayer, SAM, layer over and around the first electrode;
   forming a second metallic layer (M2) in contact with the SAM layer and the substrate; and
   touchless removing parts of the second metallic layer (M2) that are formed directly above the SAM layer and the first electrode, to form the second electrode, and the nanogap Ng between the first electrode and the second electrode.

6. The method of claim 5, further comprising:
   placing the substrate, the first electrode, the SAM layer, and the second metallic layer in a liquid and agitating either the substrate or the liquid.

7. The method of claim 5, further comprising:
   directing a fluid flow over the second metallic layer.

8. The method of claim 1, wherein the step of curing comprises:
   irradiating the curable substance with ultra-violet light.

9. A method for making a mask, the method comprising:
   providing a substrate having a first electrode and a second electrode, the second electrode being formed at a distance less than 100 nm from the first electrode so that a nanogap Ng is formed between the first and second electrodes;
   pouring a curable substance over the first and second electrodes and into the nanogap Ng;
   curing the curable substance to form a soft stamp having nano-features;
   removing the soft stamp from the first and second electrodes; and
   forming a mask that mirrors the soft stamp, based on the soft mask,
   wherein the mask is used for manufacturing a device.

10. The method of claim 9, wherein the nano-feature has a size less than 100 nm.

11. The method of claim 9, wherein the soft stamp has a base from which the nano-feature extends away.

12. The method of claim 9, wherein the nano-feature has a height less than 50 nm.

13. The method of claim 9, wherein the step of curing comprises:
   irradiating the curable substance with ultra-violet light.

14. The method of claim 9, wherein the step of forming a mask comprises:
   dipping the soft stamp in ink; and
   transferring traces of the ink onto an additional substrate.

15. The method of claim 9, wherein the step of forming a mask comprises:
   dipping the nano-feature of the soft stamp into a deformable polymer;
   curing the polymer to form the mask; and
   removing the soft stamp.

16. The method of claim 9, wherein the step of forming a mask comprises:
   placing the soft stamp over a photo-curable layer;
   irradiating the photo-curable layer through the soft stamp with a light to cure portions of the photo-curable layer; and
   removing the soft stamp.

17. The method of claim 9, wherein the step of forming a mask comprises:
   dipping the nano-feature of the soft stamp into an epoxy substrate;
   curing the epoxy substrate to form a gap that corresponds to the nano-feature;
   removing a layer of the soft stamp; and
   removing a layer of the epoxy substrate to form the mask.

18. A method for manufacturing a soft stamp to be used in the manufacturing of a device, the method comprising:
   providing a substrate having a first electrode and a second electrode, the second electrode being formed at a distance less than 100 nm from the first electrode so that a nanogap Ng is formed between the first and second electrodes;
   depositing an anti-sticking layer over the first and second electrodes and the substrate;
   pouring a curable substance over the first and second electrodes and into the nanogap Ng;
   pressing the curable substance with a movable substrate, toward the substrate;
   curing the curable substance to form a soft stamp; and
   removing the soft stamp from the first and second electrodes, with the movable substrate.

* * * * *